(12) United States Patent
Seo et al.

(10) Patent No.: US 8,878,431 B2
(45) Date of Patent: *Nov. 4, 2014

(54) LIGHT EMITTING DEVICE AND METHOD OF MANUFACTURING THE SAME

(71) Applicant: Semiconductor Energy Laboratory Co., Ltd., Atsugi (JP)

(72) Inventors: Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/872,268

(22) Filed: Apr. 29, 2013

(65) Prior Publication Data

US 2013/0306942 A1 Nov. 21, 2013

Related U.S. Application Data

(63) Continuation of application No. 13/069,435, filed on Mar. 23, 2011, now Pat. No. 8,432,094, which is a continuation of application No. 11/967,749, filed on Dec. 31, 2007, now Pat. No. 7,915,807, which is a continuation of application No. 10/024,699, filed on Dec. 21, 2001, now Pat. No. 7,342,355.

(30) Foreign Application Priority Data

Dec. 28, 2000 (JP) .................................. 2000-400730
Feb. 21, 2001 (JP) .................................. 2001-045847

(51) Int. Cl.
*H05B 33/14* (2006.01)

(52) U.S. Cl.
USPC ............................................. 313/504; 428/917

(58) Field of Classification Search
None
See application file for complete search history.

(56) References Cited

U.S. PATENT DOCUMENTS

| | | |
|---|---|---|
| 3,654,525 A | 4/1972 | Maricle et al. |
| 5,017,863 A | 5/1991 | Mellitz |
| 5,039,657 A | 8/1991 | Goldman et al. |

(Continued)

FOREIGN PATENT DOCUMENTS

| | | |
|---|---|---|
| CN | 2421793 Y | 2/2001 |
| EP | 0 917 216 A2 | 5/1999 |

(Continued)

OTHER PUBLICATIONS

Chihaya Adachi et al.; "Electroluminescence in Organic Films with Three-Layer Structure"; Japanese Journal of Applied Physics, vol. 27, No. 2; pp. L269-L271; Feb. 1988.

(Continued)

*Primary Examiner* — Ashok Patel
(74) *Attorney, Agent, or Firm* — Fish & Richardson P.C.

(57) ABSTRACT

A light emitting device is provided which has a structure for lowering energy barriers at interfaces between layers of a laminate organic compound layer. A mixed layer (105) composed of a material that constitutes an organic compound layer (1) (102) and a material that constitutes an organic compound layer (2) (103) is formed at the interface between the organic compound layer (1) (102) and the organic compound layer (2) (103). The energy barrier formed between the organic compound layer (1) (102) and the organic compound layer (2) (103) thus can be lowered.

13 Claims, 37 Drawing Sheets

(56) References Cited

U.S. PATENT DOCUMENTS

| | | | |
|---|---|---|---|
| 5,170,990 A | 12/1992 | Kamiya et al. | |
| 5,256,945 A | 10/1993 | Imai et al. | |
| 5,271,089 A | 12/1993 | Ozawa | |
| 5,281,489 A | 1/1994 | Mori et al. | |
| 5,486,406 A | 1/1996 | Shi | |
| 5,513,499 A | 5/1996 | deRijke | |
| 5,601,903 A | 2/1997 | Fujii et al. | |
| 5,674,597 A | 10/1997 | Fujii et al. | |
| 5,719,467 A | 2/1998 | Antoniadis et al. | |
| 5,739,635 A | 4/1998 | Wakimoto | |
| 5,817,431 A | 10/1998 | Shi et al. | |
| 5,853,905 A | 12/1998 | So et al. | |
| 5,858,563 A | 1/1999 | Sano et al. | |
| 5,925,472 A | 7/1999 | Hu et al. | |
| 5,925,980 A | 7/1999 | So et al. | |
| 5,955,836 A | 9/1999 | Boerner et al. | |
| 5,989,737 A | 11/1999 | Xie et al. | |
| 6,030,715 A | 2/2000 | Thompson et al. | |
| 6,097,147 A | 8/2000 | Baldo et al. | |
| 6,121,727 A | 9/2000 | Kanai et al. | |
| 6,130,001 A | 10/2000 | Shi et al. | |
| 6,132,280 A | 10/2000 | Tanabe et al. | |
| 6,160,272 A | 12/2000 | Arai | |
| 6,166,488 A | 12/2000 | Arai | |
| 6,215,462 B1 | 4/2001 | Yamada et al. | |
| 6,228,228 B1 | 5/2001 | Singh et al. | |
| 6,237,529 B1 | 5/2001 | Spahn | |
| 6,248,458 B1 | 6/2001 | Yoon et al. | |
| 6,275,649 B1 | 8/2001 | Nagashima et al. | |
| 6,284,050 B1 | 9/2001 | Shi et al. | |
| 6,285,039 B1 | 9/2001 | Kobori et al. | |
| 6,310,360 B1 | 10/2001 | Forrest et al. | |
| 6,326,091 B1 | 12/2001 | Schoo et al. | |
| 6,339,290 B1 | 1/2002 | Nakaya | |
| 6,368,730 B1 | 4/2002 | Kishimoto et al. | |
| 6,372,154 B1 | 4/2002 | Li | |
| 6,392,250 B1 | 5/2002 | Aziz et al. | |
| 6,392,339 B1 | 5/2002 | Aziz et al. | |
| 6,396,209 B1 | 5/2002 | Kido et al. | |
| 6,413,656 B1 | 7/2002 | Thompson et al. | |
| 6,423,429 B2 | 7/2002 | Kido et al. | |
| 6,432,255 B1 | 8/2002 | Sun et al. | |
| 6,448,580 B1 | 9/2002 | Arai | |
| 6,458,475 B1 | 10/2002 | Adachi et al. | |
| 6,468,676 B1 | 10/2002 | Ueda et al. | |
| 6,495,198 B2 | 12/2002 | Peng | |
| 6,517,996 B1 | 2/2003 | Chao et al. | |
| 6,525,465 B1 * | 2/2003 | Fujita | 313/504 |
| 6,528,188 B1 * | 3/2003 | Suzuki et al. | 428/690 |
| 6,528,824 B2 | 3/2003 | Yamagata et al. | |
| 6,541,909 B1 | 4/2003 | Motomatsu | |
| 6,558,817 B1 | 5/2003 | Ueda et al. | |
| 6,566,807 B1 | 5/2003 | Fujita et al. | |
| 6,603,140 B2 | 8/2003 | Kobori et al. | |
| 6,614,175 B2 | 9/2003 | Aziz et al. | |
| 6,663,985 B2 | 12/2003 | Yoon et al. | |
| 6,703,146 B1 | 3/2004 | Sakaguchi et al. | |
| 6,830,828 B2 | 12/2004 | Thompson et al. | |
| 6,831,406 B1 | 12/2004 | Fukuyama et al. | |
| 6,902,830 B2 | 6/2005 | Thompson et al. | |
| 7,001,536 B2 | 2/2006 | Thompson et al. | |
| 7,112,462 B2 | 9/2006 | Arai | |
| 7,173,370 B2 | 2/2007 | Seo et al. | |
| 7,196,360 B2 | 3/2007 | Seo et al. | |
| 7,285,339 B2 | 10/2007 | Yoon et al. | |
| 7,291,406 B2 | 11/2007 | Thompson et al. | |
| 7,537,844 B2 | 5/2009 | Thompson et al. | |
| 2001/0051207 A1 | 12/2001 | Yamagata et al. | |
| 2002/0018912 A1 | 2/2002 | Jung et al. | |
| 2002/0038867 A1 | 4/2002 | Kobori et al. | |
| 2002/0074935 A1 | 6/2002 | Kwong et al. | |
| 2002/0081767 A1 | 6/2002 | Kawashima | |
| 2002/0086180 A1 | 7/2002 | Seo et al. | |
| 2002/0093283 A1 | 7/2002 | Seo et al. | |
| 2002/0109136 A1 | 8/2002 | Seo et al. | |
| 2002/0113546 A1 | 8/2002 | Seo et al. | |
| 2002/0135296 A1 | 9/2002 | Aziz et al. | |
| 2002/0139303 A1 | 10/2002 | Yamazaki et al. | |
| 2002/0155632 A1 | 10/2002 | Yamazaki et al. | |
| 2003/0010288 A1 | 1/2003 | Yamazaki et al. | |
| 2003/0118950 A1 | 6/2003 | Chao et al. | |
| 2003/0134145 A1 | 7/2003 | Toguchi et al. | |
| 2004/0104397 A1 | 6/2004 | Yoon et al. | |
| 2009/0209760 A1 | 8/2009 | Thompson et al. | |

FOREIGN PATENT DOCUMENTS

| | | |
|---|---|---|
| EP | 0948063 A | 10/1999 |
| EP | 0 982 783 A2 | 3/2000 |
| EP | 1 011 155 A2 | 6/2000 |
| EP | 1 017 117 A2 | 7/2000 |
| EP | 1 065 737 A2 | 1/2001 |
| EP | 1 220 340 A2 | 7/2002 |
| JP | 03-114197 A | 5/1991 |
| JP | 03-190088 A | 8/1991 |
| JP | 03-274695 A | 12/1991 |
| JP | 04-357694 A | 12/1992 |
| JP | 05-182762 A | 7/1993 |
| JP | 7065958 | 3/1995 |
| JP | 08-259934 A | 10/1996 |
| JP | 09-232077 A | 9/1997 |
| JP | 09-298088 A | 11/1997 |
| JP | 10-162955 A | 6/1998 |
| JP | 10-233288 A | 9/1998 |
| JP | 10-254383 A | 9/1998 |
| JP | 11-233263 A | 8/1999 |
| JP | 11-251067 A | 9/1999 |
| JP | 11-256148 A | 9/1999 |
| JP | 2000-133447 A | 5/2000 |
| JP | 2000-182774 A | 6/2000 |
| JP | 2000-200683 A | 7/2000 |
| JP | 2000-208262 A | 7/2000 |
| JP | 2000-252074 A | 9/2000 |
| JP | 2000-252077 A | 9/2000 |
| JP | 2000-356963 A | 12/2000 |
| JP | 2001-023776 A | 1/2001 |
| JP | 2001-52870 A | 2/2001 |
| KR | 2000-067671 A | 11/2000 |
| TW | 243470 A | 3/1995 |
| TW | 366598 A | 8/1999 |
| TW | 451601 A | 8/2001 |
| WO | WO 98/08360 A1 | 2/1998 |
| WO | WO 00/16593 A1 | 3/2000 |
| WO | WO 02/47457 A2 | 6/2002 |

OTHER PUBLICATIONS

Junji Kido et al.; "Multilayer White Light-Emitting Organic Electroluminescent Device"; Science, vol. 267; pp. 1332-1334; Mar. 3, 1995.

Yasunori Kijima et al.; "A Blue Organic Light Emitting Diode"; Japan Journal of Applied Physics, vol. 38; pp. 5274-5277; Sep. 1999.

Takeshi Nishi et al., "High Efficiency TFT-OLED Display with Iridium-Complex As Triplet Emissive Center", Proceedings of the 10th International Workshop on Inorganic and Organic Electroluminescence, pp. 353-356, Dec. 4-7, 2000.

D.F. O'Brien et al.; "Improved Energy Transfer in Electrophosphorescent Devices"; Applied Physics Letter, vol. 74, No. 3; pp. 442-444; Jan. 18, 1999.

Office Action dated Feb. 8, 2005, in co-pending U.S. Appl. No. 10/043,812 (12 pages).

C.W. Tang et al.; "Organic Electroluminescent Diodes"; Applied Physics Letters, vol. 51, No. 12; pp. 913-915; Sep. 21, 1987.

C.W. Tang et al.; "Electroluminescence of Doped Organic Thin Films"; Journal of Applied Physics, vol. 65, No. 9; pp. 3610-3616; May 1, 1989.

Tetsuo Tsutsui et al.; "New Aspect of Research and Development of Organic EL"; M&BE Seminar (M&BE, vol. 11, No. 1); pp. 3-12; 2000.

Tetsuo Tsutsui et al.; "High Quantum Efficiency in Organic Light-Emitting Devices with Iridium-Complex as a Triplet Emissive Center"; Japan Journal of Applied Physics, vol. 38, Part 2, No. 12B; pp. L1502-L1504; Dec. 15, 1999.

(56) References Cited

OTHER PUBLICATIONS

Tetsuo Tsutsui; "The Operation Mechanism and the Light Emission Efficiency of the Organic EL Element"; Textbook of the 3rd Seminar at Division of Organic Molecular Electronics and Bioelectronics Subcommittee, Society of Applied Physics; 1993; pp. 31-37 with English translation.

Search Report (Singapore Application No. 200200037-0), Oct. 7, 2003, 8 pages.

Search Report (Singapore Application No. 200200365-5), Nov. 11, 2003, 11 pages.

S.A. Van Slyke et al.; "Organic Electroluminescent Devices with Improved Stability"; Applied Physics Letter, vol. 69, No. 15; pp. 2160-2162; Oct. 7, 1996.

Takeo Wakimoto et al.; "Organic EL Cells Using Alkaline Metal Compounds as Electron Injection Materials"; IEEE Transactions on Electron Devices, vol. 44, No. 8, pp. 1245-1248; Aug. 1997.

M.A. Baldo et al.; "Highly efficient phosphorescent emission from organic electroluminescent devices"; Nature, vol. 395, pp. 151-154; Sep. 10, 1998.

Satoshi Hoshino et al.; "Electroluminescence from triplet excited states of benzophenone"; Applied Physics Letters, vol. 69, No. 2; pp. 224-226; Jul. 8, 1996.

Search Report (European Patent Application No. 01130487.0) dated Jun. 15, 2009.

\* cited by examiner

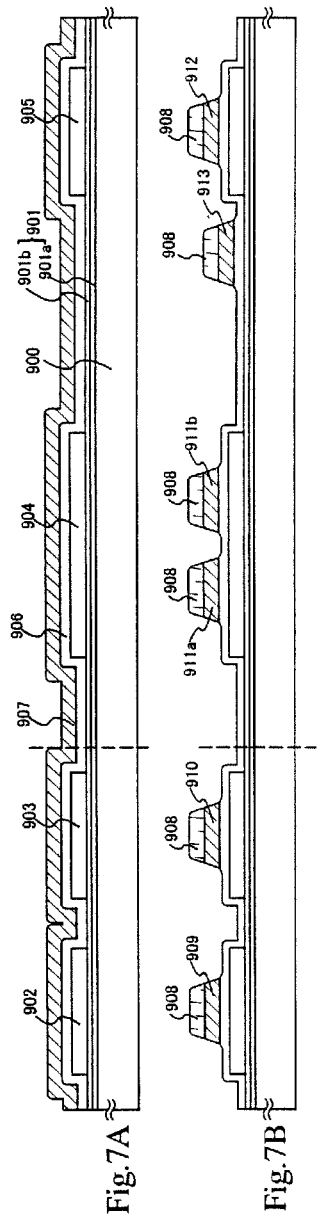
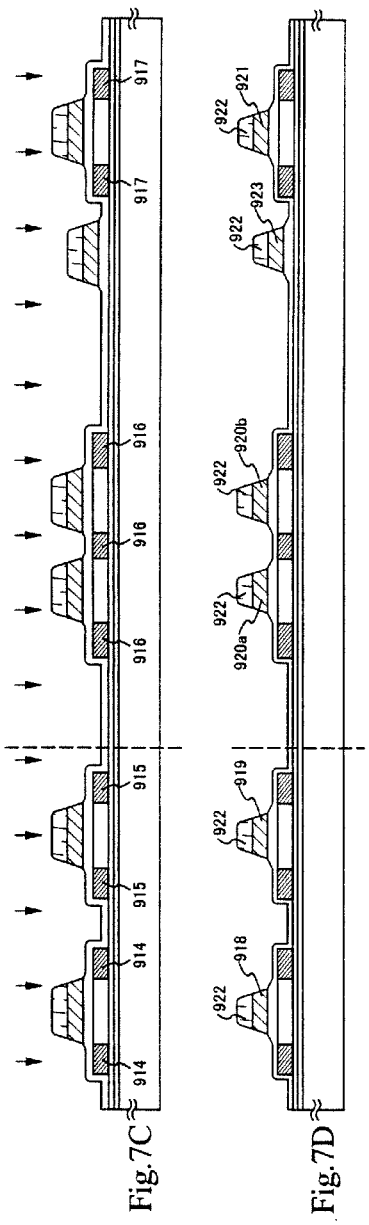
Fig.7A Fig.7B Fig.7C Fig.7D

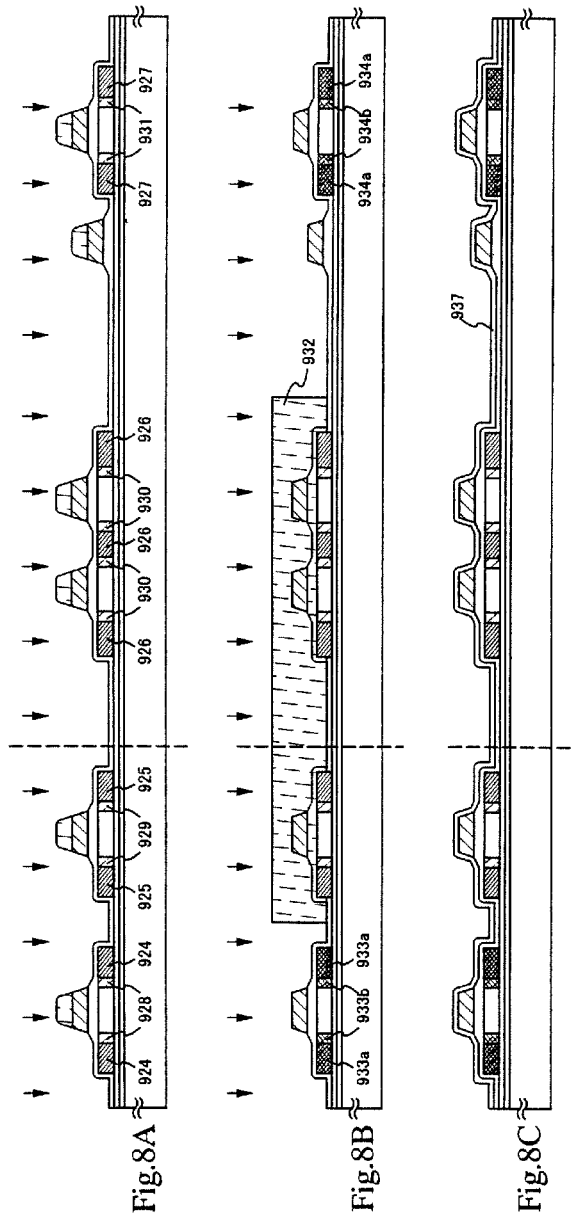

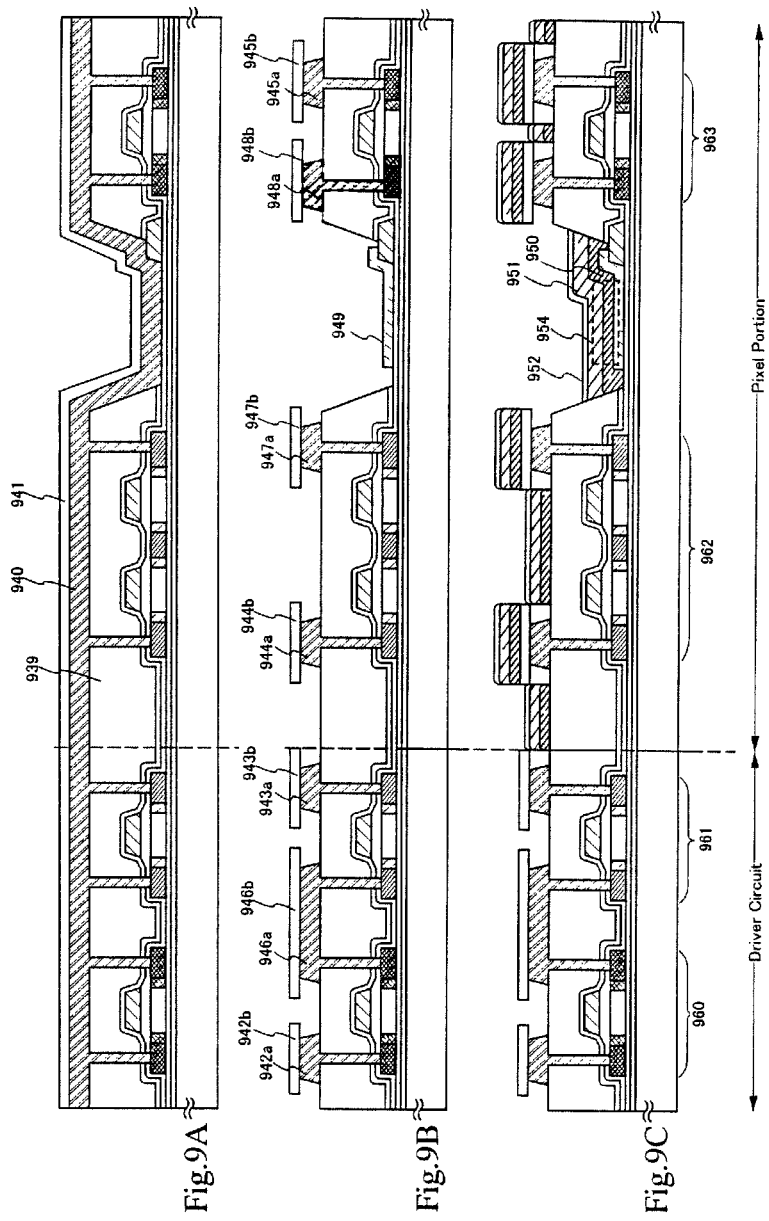

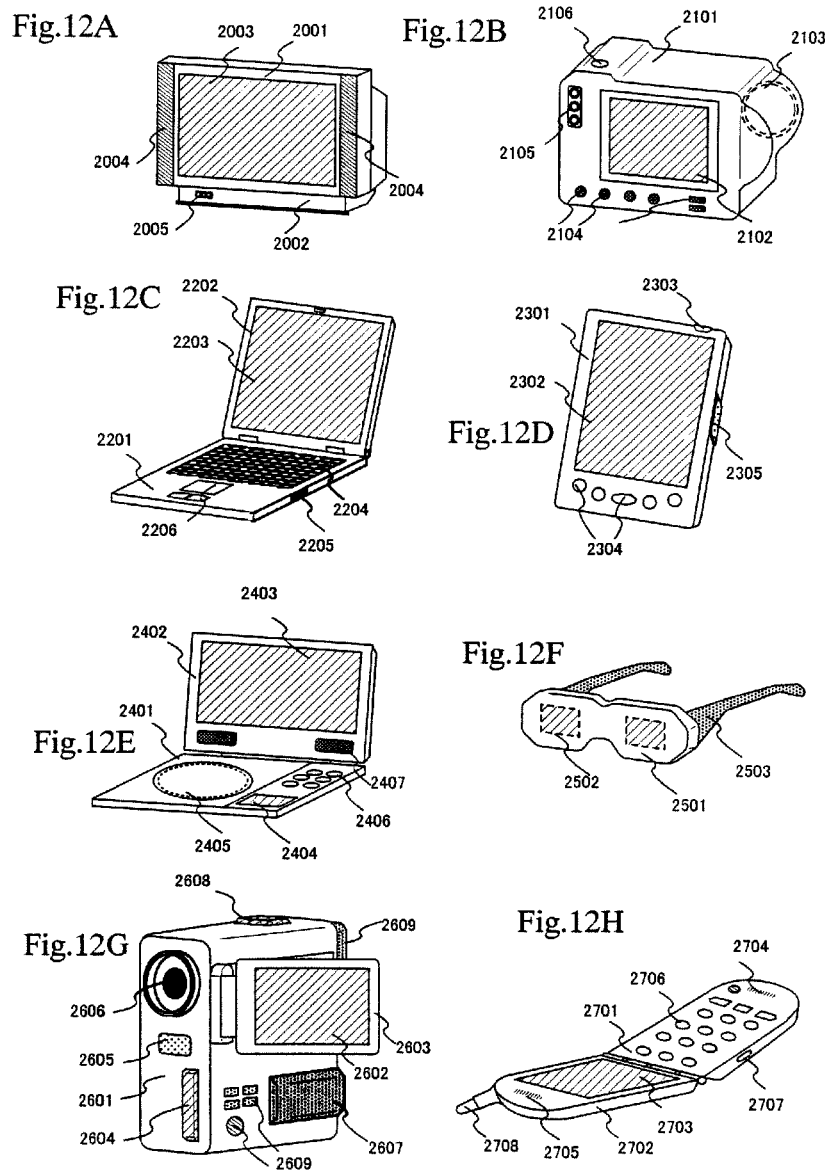

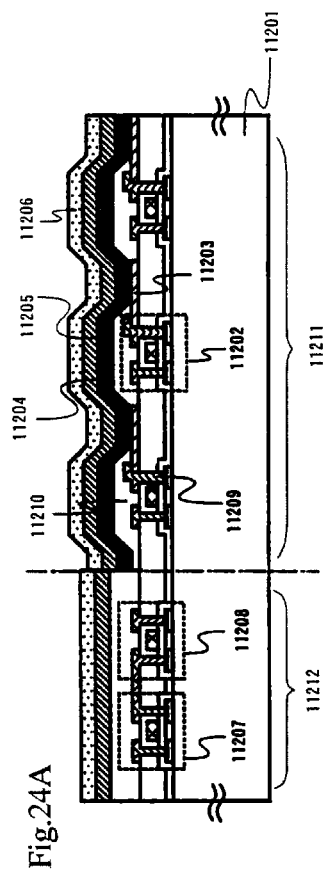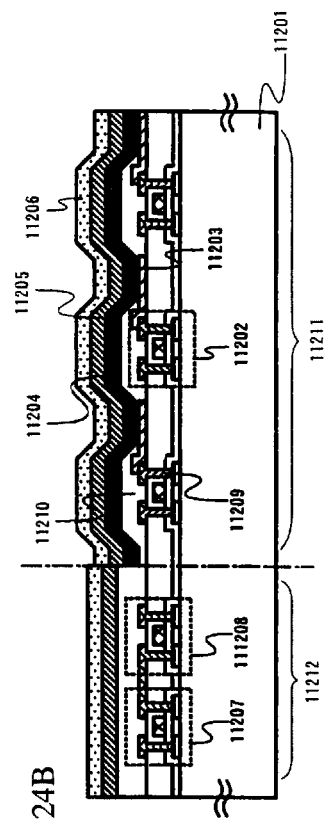

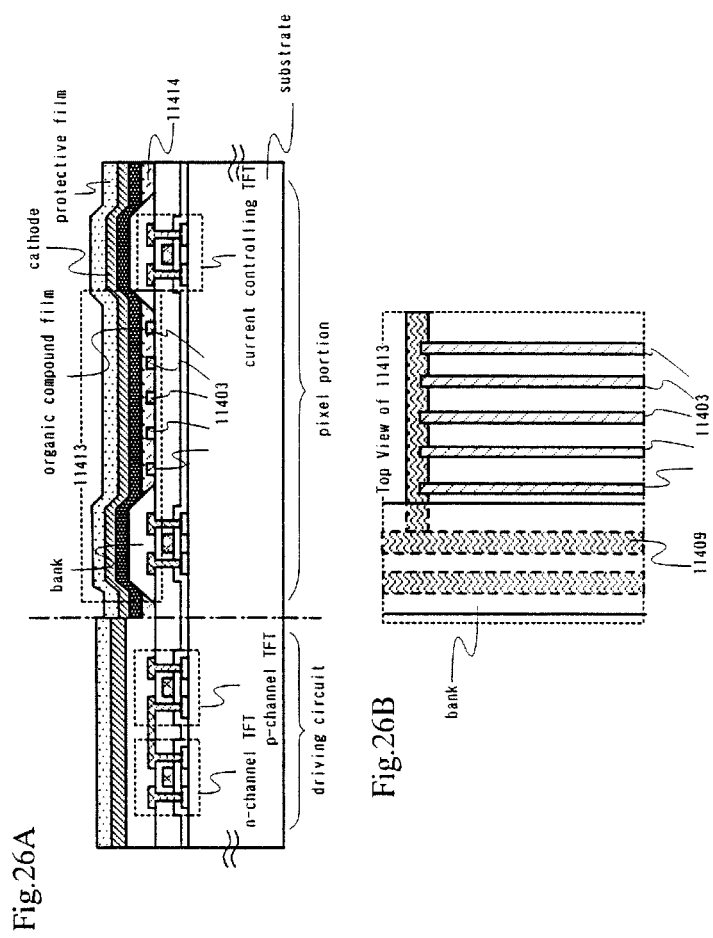

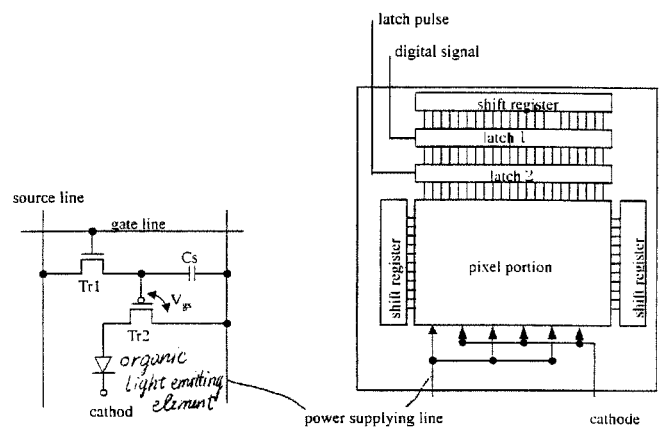
Fig.34A          Fig.34B
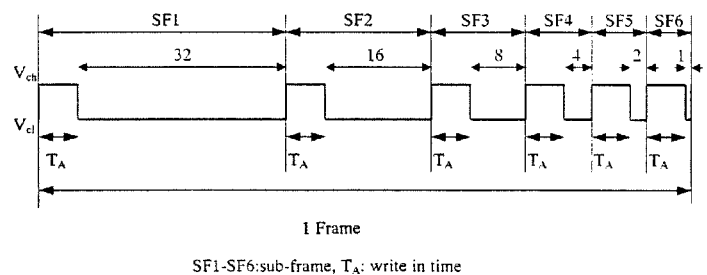
1 Frame
SF1-SF6:sub-frame, T_A: write in time
Fig.34C

LIGHT EMITTING DEVICE AND METHOD OF MANUFACTURING THE SAME

CROSS-REFERENCE TO RELATED APPLICATIONS

This application is a continuation of U.S. application Ser. No. 13/069,435, filed Mar. 23, 2011, now allowed, which is a continuation of U.S. application Ser. No. 11/967,749, filed Dec. 31, 2007, now U.S. Pat. No. 7,915,807, which is a continuation of U.S. application Ser. No. 10/024,699, filed Dec. 21, 2001, now U.S. Pat. No. 7,342,355, which claims the benefit of foreign priority applications filed in Japan as Serial No. 2000-400730 on Dec. 28, 2000, and Serial No. 2001-045847 on Feb. 21, 2001, all of which are incorporated by reference.

BACKGROUND OF THE INVENTION

1. Field of the Invention

The present invention relates to a light emitting device using an organic light emitting element with a film containing an organic compound that emits light with application of electric field (hereinafter referred to as organic compound layer), as well as an anode and a cathode. Specifically, the present invention relates to a light emitting device using an organic light emitting element with lower drive voltage than before and longer lifetime. The term light emitting device in this specification refers to an image display device or a light emitting device that employs as a light emitting element an organic light emitting element. Also included in the definition of the light emitting device are a module in which a connector, such as an anisotropic conductive film (FPC: flexible printed circuit), a TAB (tape automated bonding) tape, or a TCP (tape carrier package), is attached to an organic light emitting element, a module in which a printed wiring board is provided on the tip of a TAB tape or a TCP, and a module in which an IC (integrated circuit) is mounted directly to an organic light emitting element by the COG (chip on glass) method.

2. Description of the Related Art

An organic light emitting element is an element that emits light when electric field is applied. Light emission mechanism thereof is said to be as follows. A voltage is applied to an organic compound layer sandwiched between electrodes to cause recombination of electrons injected from the cathode and holes injected from the anode at the luminescent center in the organic compound layer and, when the resultant molecular excitons release energy in the form of light emission in returning to base state.

There are two types of molecular excitons from organic compounds; one is for a singlet exciton state and the other is for a triplet exciton state. This specification includes both cases where the singlet excitation state causes light emission and where the triplet excitation state causes light emission.

In an organic light emitting element as above, its organic compound layer is usually a thin film with a thickness of less than 1 μm. In addition, the organic light emitting element does not need back light used in conventional liquid crystal displays because it is a self-light emitting element and the organic compound layer itself emits light. The organic light emitting element therefore has a great advantage of being manufactured as a very thin and light-weight device.

When the organic compound layer is about 100 to 200 nm in thickness, for example, recombination takes place within several tens nanoseconds based on the mobility of the carriers in the organic compound layer. Even is the process from carrier recombination to light emission is taken into account, the organic light emitting element may be ready for light emission within an order of microsecond. Accordingly, fast response is also one of the features of the organic light emitting element.

Since the organic light emitting element is of carrier injection type, it can be driven with direct-current voltage and noise is hardly generated. Regarding driving voltage, a report says that a sufficient luminance of 100 cd/m$^2$ is obtained at 5.5 V by using a very thin film with a uniform thickness of about 100 nm for the organic compound layer, choosing an electrode material which is capable of lowering a carrier injection barrier against the organic compound layer, and introducing the hetero structure (laminate structure) (Reference 1: C. W. Tang and S. A. VanSlyke, "Organic electroluminescent diodes", Applied Physics Letters, vol. 51, no. 12, 913-915 (1987)).

With those features, including being thin and light-weight, fast response, and direct-current low voltage driving, an organic light emitting element is attracting attention as a next-generation flat panel display element. In addition, for being self-light emitting device with a wide viewing angle, the organic light emitting element has better visibility and is considered as effective when used for display screens of electric appliances.

In the organic light emitting element disclosed in Reference 1, the carrier injection barrier is lowered by using a Mg:Ag alloy that is low in work function and is relatively stable as the cathode so that more electrons are injected. This makes it possible to inject a large number of carriers into the organic compound layer.

Further, a single hetero structure, in which a hole transporting layer formed of diamine compound and an electron transporting light emitting layer formed of tris(8-quinolinolate) aluminum complex (hereinafter referred to as Alq$_3$) are layered as the organic compound layer, is adopted to improve the carrier recombination efficiency exponentially. This is explained as follows.

In the case of an organic light emitting element in which an organic compound layer consists of a single layer of Alq$_3$, for example, most of electrons injected from a cathode reach the anode without being recombined with holes and the light emission efficiency is very low. In short, a material that can transport electrons and holes both in balanced amounts (hereinafter referred to as bipolar material) has to be used in order that a single layer organic light emitting element can emit light efficiently (i.e., in order to drive at low voltage), and Alq$_3$ does not meet the requirement.

On the other hand, when the single hetero structure (two-layer structure) as in Reference 1 is adopted, electrons injected from the cathode are blocked at the interface between the hole transporting layer and the electron transporting light emitting layer and trapped in the electron transporting light emitting layer. Recombination of the carriers thus takes place in the electron transporting light emitting layer with high efficiency, resulting in efficient light emission.

Expanding this idea of carrier blocking function, it is possible to control the carrier recombination region. To give an example, there is a report of success in making a hole transporting layer to emit light by inserting a layer that can block holes (hole blocking layer) between the hole transporting layer and an electron transporting layer and trapping the holes in the hole transporting layer. (Reference 2: Yasunori KIJIMA, Nobutoshi ASAI and Shin-ichiro TAMURA, "A Blue Organic Light Emitting Diode", Japanese Journal of Applied Physics, vol. 38, 5274-5277 (1999)). A hole blocking layer formed of a material as shown in Reference 2 has an excitation energy higher than that of a light emitting layer and therefore also prevents molecular excitons from diffusing.

It can be said that the organic light emitting element in Reference 1 is characterized by separation of functions in which the hole transporting layer is assigned to transport holes and the electron transporting light emitting layer is assigned to transport electrons and emit light. The idea of separating functions has been expanded until a method is proposed in which three types of functions of hole transportation, electron transportation, and light emission are conducted by three different materials. With this method, a material that scores poorly in carrier transportation but is high in light emission efficiency can be used as a light emitting material and the light emission efficiency of the organic light emitting element is accordingly improved.

The typical method thereof is pigment doping (Reference 3: C. W. Tang, S. A. VanSlyke, and C. H. Chen, "Electroluminescence of doped organic thin films", Journal of Applied Physics, vol. 65, no. 9, 3610-3616, (1989)). As shown in FIG. 13A, in a single hetero structure provided with a hole transporting layer 1101 and an electron transporting layer 1102 (1102 also serves as a light emitting layer), the electron transporting layer 1102 is doped with a pigment 1103 to give emitted light the color of the pigment 1103. The hole transporting layer 1101 side may instead be doped with the pigment 1103.

In contrast to this, there is a double hetero structure (three-layer structure) in which a light emitting layer is sandwiched between a hole transporting layer and an electron transporting layer as shown in FIG. 13B (Reference 4: Chihaya ADACHI, Shizuo TOKITO, Tetsuo TSUTSUI and Shogo SAITO, "Electroluminescence in Organic Films with Three-layered Structure", Japanese Journal of Applied Physics, Vol. 27, No. 2, L269-L271 (1988)). In this method, holes are injected from the hole transporting layer 1101 to a light emitting layer 1104 and electrons are injected from an electron transporting layer 1102 to the light emitting layer 1104. Therefore, recombination of the carriers takes place in the light emitting layer 1104 and light with the color of the material used as the light emitting layer 1104 is emitted.

An advantage of separating functions is an increased degree of freedom in molecule design and the like since the separation of functions saves one organic material from bearing various functions (such as light emission, carrier transportation, and injection of carriers from electrodes) simultaneously (for instance, the separation of functions makes the effort to find a bipolar material unnecessary). In other words, high light emission efficiency can easily be obtained by simply combining a material excellent in light emission characteristic with a material excellent in carrier transportation ability.

Because of these advantages, the idea itself of laminate structure described in References 1 to 4 (carrier blocking function or separation of functions) continues to be utilized widely.

However, the laminate structures as described above are joining different substances and thus cannot avoid energy barriers formed at interfaces. The energy barriers block movement of carriers at the interfaces and raise the following two problems.

One problem is that the energy barriers are pullback in further lowering drive voltage. In fact, a report says that, as for current organic light emitting element, an element with a single layer structure using a conjugate system polymer is superior in terms of drive voltage to an element with a laminate structure and hold the top data in power efficiency (unit: lm/w) (note that comparison made in the report is for light emission from singlet excitation and the report does not deal with light emission from triplet excitation) (Reference 5: Tetsuo Tsutsui, "Journal of Organic Molecular Electronics and Bioelectronics Division of The Japan Society of Applied Physics", vol. 11, no. 1, p. 8 (2000)).

The conjugate system polymers mentioned in Reference 5 are bipolar materials and can provide the same level of carrier recombination efficiency as the materials in the laminate structures. Therefore, the drive voltage is actually lower in the single layer structure that has less interfaces than in the laminate structures if the single layer structure can provide the same level of carrier recombination efficiency by using a bipolar material or by other methods without using the laminate structure.

For example, drive voltage can be lowered by inserting a material that can lower an energy barrier at the interface with an electrode in order that more carriers can be injected (Reference 6: Takeo Wakimoto, Yoshinori Fukuda, Kenichi Nagayama, Akira Yokoi, Hitoshi Nakada, and Masami Tsuchida, "Organic EL Cells Using Alkaline Metal Compounds as Electron Injection Materials", IEEE TRANSACTIONS ON ELECTRON DEVICES, vol. 44, no. 8, 1245-1248 (1997)). In Reference 6, drive voltage has successfully been lowered by using $LiO_2$ for an electron injection layer.

However, issues regarding the mobility of carriers between organic materials (between a hole transporting layer and a light emitting layer, for example, and hereinafter referred to as 'between organic layers') have not been solved yet and are considered as the key to catch up to low drive voltage of the single layer structure.

The other problem caused by the energy barriers is an influence on the element lifetime of the organic light emitting element. In other words, the luminance is lowered by inhibited carrier injection and the resultant accumulation of charges.

Although there is no theory that explains the mechanism of this degradation clearly, a report says that lowering of luminance can be limited by inserting a hole injection layer between an anode and a hole transporting layer and by ac driving at square wave instead of dc driving (Reference 7: S. A. VanSylke, C. H. Chen, and C. W. Tang, "Organic electroluminescent devices with improved stability", Applied Physics Letters, Vol. 69, No. 15, 2160-2162 (1996)). This is verification by experiments, that lowering of luminance can be limited by avoiding accumulation of charges through insertion of a hole injection layer and ac driving.

Concluded from the above is that the laminate structures can readily enhance the carrier recombination efficiency and can widen the choice of materials from the standpoint of separation of functions, however, on the other hand, hinder movement of carriers and influence drive voltage and lowering of luminance because there are many interfaces between many organic layers.

SUMMARY OF THE INVENTION

The present invention has been made in view of the above, and an object of the present invention is therefore to provide an organic light emitting element that is lower in drive voltage and longer in element lifetime than conventional one by lowering energy barriers between organic layers while utilizing the advantages of the laminate structures (carrier blocking function or separation of functions) which have conventionally been used.

Another object of the present invention is to provide a light emitting device that is lower in drive voltage and longer in lifetime than conventional one by employing this organic light emitting element. Still another object of the present invention is to provide an electric appliance that consumes less power and lasts longer duration compared to prior art by manufacturing it using this light emitting device.

The doping of a pigment 1103 method as in FIG. 13A has such a merit that it allows an organic light emitting element to use a material that does not emit light when it is solid but is observed to emit light only when dispersed in a solution at a low concentration (e.g., quinacridon). Accordingly, the method can be regarded as effective for light emitting materials that are liable to concentration quenching.

A demerit of the method is that the amount of pigment used in doping is usually very small (less than 1 wt % in some cases) and control of evaporation amount is difficult if the organic light emitting element is manufactured by the widely employed vacuum evaporation. The light emission efficiency is particularly responsive to changes in amount of pigment used for doping, and it is conceivable that the light emission efficiency fluctuates between elements manufactured by vacuum evaporation.

Further, pigment is the guest in the pigment doping method. In this case, the difference in energy between the highest occupied molecular orbital (HOMO) and the lowest unoccupied molecular orbital (LUMO) (hereinafter referred to as excitation energy level) of the host material has to be larger than the excitation energy level of the guest. In addition, the host has to be good at transporting carriers. It is more desirable that the maximum emission wavelength of the host matches the maximum absorption wavelength of the guest to enhance the light emission efficiency.

However, the host in relation to a blue colored guest, for example, is required to have a far larger excitation energy level than short wavelength visible light such as blue light and therefore the choice of host materials is very limited. Regarding the host for a red colored guest, no material that meets all of the above requirements has ever been found. It is another demerit of the pigment doping method that a host material optimum for the pigment used in doping has to be selected.

Considering the above, the double hetero structure as the one in FIG. 13B (hole transporting layer+light emitting layer+electron transporting layer) may be preferred. Although one that can emit light even in its solid state has to be chosen (in other words, concentration quenching materials cannot be used) as the material of the light emitting layer, the ability of transporting a large number of carriers is not always necessary. Therefore the choice of materials is relatively large.

However, the double hetero structure as shown in FIG. 13B is joining three different substances, and there are interfaces (hereinafter referred to as organic interface) between every two layers (between the hole transporting layer 1101 and the light emitting layer 1104, and between the electron transporting layer 1102 and the light emitting layer 1104). Accordingly, the structure suffers from the above-described two problems caused by organic interfaces.

To summarize, the double hetero structure as in FIG. 13B has a big merit of being capable of separating functions without using the pigment doping method, however, on the other hand, has organic interfaces at both edges of the light emitting layer to hinder movement of carriers into the light emitting layer and greatly influence drive voltage and element lifetime.

It is therefore an object of the present invention to particularly enhance the mobility of carriers by removing organic interfaces in the double hetero structures that have conventionally been used and, at the same time, to utilize the idea of separation of functions in the double hetero structures to express the respective functions (hereinafter referred to as function expression). Another object of the present invention is to thereby provide an organic light emitting element that is lower in drive voltage and longer in element lifetime than conventional one.

Still another object of the present invention is to provide a light emitting device that is lower in drive voltage and longer in lifetime than conventional one by employing this organic light emitting element. Yet still another object of the present invention is to provide an electric appliance that consumes less power and lasts longer duration compared to prior art by manufacturing it using this light emitting device.

As a model for blocking of carrier movement by organic interfaces, the present inventors have thought of the following two mechanisms.

One mechanism involves morphology of organic interfaces. An organic compound film in an organic light emitting element is usually an amorphous film, which is formed from organic compound molecules aggregated by intermolecular forces, mainly, dipole interaction. When a hetero structure is built using such aggregation of molecules, however, differences in size and shapes of molecules could greatly influence interfaces (namely, organic interfaces) of the laminate structure.

If the laminate structure is built using materials that have large difference in molecule size, in particular, the conformance in joining in organic interfaces can be poor. A conceptual diagram thereof is shown in FIG. 14. In FIG. 14, a first layer 1411 consisting of small molecules 1401 and a second layer 1412 consisting of large molecules 1402 are layered. In this case, poor conformance regions 1414 are formed at an organic interface 1413 between the layers 1411 and 1412.

The poor conformance regions 1414 shown in FIG. 14 could act as barrier (or energy barrier) that blocks movement of carriers and therefore could be an opposition to lowering drive voltage. Further, carriers that cannot cross the energy barrier accumulate as charges and can induce lowering of luminance as described above.

The other mechanism involves the process of building the laminate structure (i.e., forming organic interfaces). The organic light emitting element with the laminate structure is usually manufactured by multi-chamber type (in-line type) evaporation apparatus as the one shown in FIG. 15 in order to avoid contamination in forming the respective layers.

The example shown in FIG. 15 is a conceptual diagram of evaporation apparatus for making the double hetero structure that is composed of a hole transporting layer, a light emitting layer, and an electron transporting layer. First, a substrate with an anode (formed of, e.g., indium tin oxide (hereinafter referred to as ITO)) is brought into a loading chamber. The substrate is irradiated with ultraviolet rays in a vacuum atmosphere in an ultraviolet ray irradiation chamber to clean the anode surface. When the anode is an oxide such as ITO in particular, oxidization treatment is conducted in a pretreatment chamber. Then the layers of the laminate structure are formed. The hole transporting layer is formed in an evaporation chamber 1501, the light emitting layers (red, green, and blue layers in FIG. 15) are formed in evaporation chambers 1502 to 1504, and the electron transporting layer is formed in an evaporation chamber 1505. A cathode is formed by evaporation in an evaporation chamber 1506. Lastly, sealing is conducted in a sealing chamber and the substrate is taken out of an unloading chamber to obtain the organic light emitting element. Symbols 1511 to 1516 denote evaporation sources.

The in-line type evaporation apparatus above is characterized in that different layers are formed by evaporation in different chambers 1501 to 1505. In other words, the apparatus is structured such that mixing of materials of the layers is avoided almost completely.

Although the pressure in the interior of the evaporation apparatus is usually reduced to about $10^{-4}$ to $10^{-5}$ pascal, there are minute amounts of gas components (such as oxygen and water). It is said that, with the vacuum of this degree, these minute amounts of gas components can readily form a monomolecular adsorption layer within a few seconds.

Accordingly, when the organic light emitting element with the laminate structure is manufactured using the apparatus as in FIG. 15, the problem is a large interval between formation of one layer and formation of another layer. In other words, an undesirable adsorption layer due to a minute amount of gas components (hereinafter referred to as impurity layer) might be formed in an interval between formation of layers, especially when the substrate is transferred through a second transferring chamber.

A conceptual diagram thereof is shown in FIG. 16. In FIG. 16, an impurity layer 1613 is being formed from a minute amount of impurities 1603 (such as water and oxygen) between a first layer 1611 formed of a first organic compound 1601 and a second layer 1612 formed of a second organic compound 1602 when the second layer is layered on the first layer.

Impurity layers are formed between the layers (namely organic interfaces) in this way and, serve as impurity regions that trap carriers after the organic light emitting element is completed, thereby blocking movement of the carriers and raising drive voltage. Furthermore, the presence of the impurity regions that trap carriers leads to accumulation of charges, and therefore lowering of luminance as described above could be induced.

Considering such structure, the present inventors have devised a measure shown in FIGS. 1B and 1D as a method to solve the above-mentioned problems. The measure is, in the case where an organic compound layer (1) 102 and an organic compound layer (2) 103 are layered between an anode 101 and a cathode 104 of an organic light emitting element, a structure (FIG. 1B) in which a mixed layer 105 containing both the material that constitutes the organic compound layer (1) 102 and the material that constitutes the organic compound layer (2) 103 is formed between the organic compound layer (1) 102 and the organic compound layer (2) 103. The structure (FIG. 1B) is a replacement of the conventional laminate structure (FIG. 1A) in which a definite interface exists. The term mixed layer here includes a region containing both the material that constitutes the organic compound layer (1) 102 and the material that constitutes the organic compound layer (2) 103 even if its interfaces with the organic compound layer (1) 102 and with the organic compound layer (2) 103 are not clear.

The element as this substantially has no organic interfaces of the conventional laminate structures described above. The aforementioned problems caused by organic interfaces (degraded organic interface morphology and formation of impurity layers) can therefore be solved.

First, how degradation of organic interface morphology is solved is explained with reference to FIG. 20. FIG. 20 is a sectional view of an organic compound film composed of a region 1811, a region 1812, and a mixed region 1813. The region 1811 consists of small molecules 1801. The region 1812 consists of large molecules 1802. The mixed region 1813 contains both the small molecules 1801 and large molecules 1802. As is apparent from FIG. 20, there are no organic interfaces 1413 present in FIG. 14, nor poor conformance regions 1414.

How the problem of formation of impurity layers is solved is simple and obvious. When an organic light emitting element as FIG. 17 is to be manufactured, a hole transporting material is deposited on an anode by evaporation and, a light emitting material is additionally deposited by coevaporation to form a first mixed region before the deposition is completed. After the first mixed region is completed, deposition of the hole transporting material by evaporation is stopped and only deposition of the light emitting material by evaporation is continued. Subsequent steps are similar to this and one or two materials are continuously deposited by evaporation without forming organic interfaces until an electron transporting region is completed. Accordingly, there is no interval that is usually present when an organic light emitting element is manufactured using the evaporation apparatus as the one in FIG. 15. In short, there is no time to form impurity layers.

By employing the structure shown in FIG. 1B, the energy barrier between organic layers is lowered compared to the conventional structure shown in FIG. 1A and more carriers can be injected. Specifically, the energy band diagram for the structure of FIG. 1A is as shown in FIG. 1C whereas the energy band diagram for the structure of FIG. 1B, in which a mixed layer is provided between organic layers, is as shown in FIG. 1D. FIGS. 1C and 1D show that the energy barrier between organic layers can be lowered by building a continuous joint structure to create a continuous energy change. Accordingly, drive voltage can be lowered and lowering of luminance can be prevented.

From the above, a light emitting device according to the present invention has an organic light emitting element including at least a first layer that is composed of an organic compound and a second layer that is composed of an organic compound different from the organic compound that constitutes the first layer, and is characterized in that a mixed layer containing the organic compound that constitutes the first layer and the organic compound that constitutes the second layer both is provided between the first layer and the second layer.

Combinations of the first layer and the second layer described above are shown in Table 1. A single combination (for example, Combination A alone) or plural combinations (for example, Combinations A and B both) out of Combinations A to E may be introduced.

Table 1

If Combinations C and D are both introduced (in other words, if the light emitting layer has a mixed layer on both sides thereof), the light emission efficiency can further be enhanced by preventing diffusion of molecular excitons formed in the light emitting layer. Therefore the excitation energy of the light emitting layer is preferably lower than the excitation energy of the hole transporting layer and lower than the excitation energy of the electron transporting layer. In this case, a light emitting material with poor carrier transporting ability can be used as the light emitting layer to advantageously widen the choice of materials. The term excitation energy in this specification refers to the difference in energy between the highest occupied molecular orbital (HOMO) and the lowest unoccupied molecular orbital (LUMO) of a molecule.

More desirably, the light emitting layer is composed of a host material and a light emitting material (dopant) that has an excitation energy lower than that of the host material, so that the excitation energy of the hole transporting layer and the excitation energy of the electron transporting layer respectively exceed the excitation energy of the dopant. This prevents molecular exciton of the dopant from diffusing and makes the dopant to emit light effectively. Carrier recombination efficiency is also enhanced if the dopant is a carrier trapping type material.

In the present invention described above, joining the mixed layer continuously is considered effective as a measure to further enhance the mobility of carriers. The mixed layer is preferably formed to have concentration gradient. Accordingly, the present invention is characterized in that the mixed layer has concentration gradient.

The present inventors have further devised a measure to provide an organic light emitting element in which organic interfaces of the double hetero structure are removed while making the function expression possible. A conceptual diagram thereof is shown in FIG. 17. Although an anode 1702 is placed on a substrate 1701 in FIG. 17, the structure may be reversed to place a cathode 1704 on the substrate.

In the element of FIG. 17, an organic compound film 1703 containing a hole transporting material, a light emitting material, and an electron transporting material is provided with a hole transporting region 1705, a light emitting region 1706, and an electron transporting region 1707. The hole transporting region 1705 consists of a hole transporting material. The light emitting region 1706 consists of a light emitting material. The electron transporting region 1707 consists of an electron transporting material. As a characteristic of the present invention, the organic compound film is further provided with a first mixed region 1708 in which the hole transporting material and the light emitting material are mixed and a second mixed region 1709 in which the electron transporting material and the light emitting material are mixed.

FIGS. 18 and 19 show examples of the concentration profile in the film thickness direction in the element of FIG. 17. Shown in FIG. 18 is the profile when the composition ratio of the hole transporting material and the light emitting material in the first mixed region 1708 is $x:z_1$ and is constant whereas the composition ratio of the electron transporting material and the light emitting material in the second mixed region 1709 is $y:z_2$ and is constant. FIG. 19 shows the profile when the first mixed region 1708 and the second mixed region 1709 have concentration gradient.

The element of FIG. 17 also has no organic interfaces, and therefore carriers move smoothly and drive voltage as well as element lifetime are not affected as described above. Furthermore, the element has no problem in terms of light emission efficiency because of separation of functions as in the conventional double hetero structure.

In contrast to the conventional hetero structure (laminate structure) that is a simple joining different substances (hetero junction), the structure of the present invention is what can be called a mixed junction and it provides an organic light emitting element based on a novel concept.

Therefore a light emitting device according to the present invention has an organic light emitting element with an organic compound film interposed between an anode and a cathode, the organic compound film contains a hole transporting material, an electron transporting material, and a light emitting material, and the light emitting device is characterized in that the organic compound film is composed of a hole transporting region, a first mixed region, a light emitting region, a second mixed region, and an electron transporting region that are connected in the order, the hole transporting region is nearest to the anode and the electron transporting region is nearest to the cathode, the hole transporting region contains the hole transporting material, the first mixed region contains both the hole transporting material and the light emitting material, the light emitting region contains the light emitting material, the second mixed region contains both the electron transporting material and the light emitting material, the electron transporting region contains the electron transporting material.

As shown in FIG. 21A, a hole injecting region 1710 formed of a material that increases the number of holes injected (hereinafter referred to as hole injecting material) may be inserted between the anode 1702 and the organic compound film 1703. Alternatively, an electron injecting region 1711 formed of a material that increases the number of electrons injected (hereinafter referred to as electron injecting material) may be inserted between the cathode 1704 and the organic compound film 1703 as shown in FIG. 21B. Both the hole injecting region and the electron injecting region may be employed simultaneously.

In those cases, the hole injecting material or the electron injecting material is a material for lowering the barrier in injecting carriers from an electrode to the organic compound film and therefore has effects of smoothing movement of the carriers from the electrode to the organic compound film and avoiding accumulation of charges. However, from the standpoint of avoiding formation of impurity layers as described above, the injecting material is formed into a film without putting an interval before or after forming the organic compound film.

The organic light emitting element of the present invention described above may have a light emitting region in which a host material is doped with a light emitting material. Specifically, as shown in FIG. 22, an organic compound film 11003 contains a hole transporting material, an electron transporting material, a light emitting material, and a host material that serves as a host to the light emitting material, and is provided with a hole transporting region 11005, a light emitting region 11006, and an electron transporting region 11007. The hole transporting region consists of the hole transporting material. The light emitting region contains the host material doped with a light emitting material 11012. The electron transporting region consists of the electron transporting material. This organic compound film is, as a characteristic of the present invention, further provided with a first mixed region 11008 in which the hole transporting material and the host material are mixed and a second mixed region 11009 in which the electron transporting material and the host material are mixed.

This element has such a demerit that controlling of the amount of the light emitting material 11012 used in doping is difficult as explained referring to FIG. 13A. However, there is a merit of wide choice of host materials because the ability of transporting a large number of carriers is not so necessary compared to the structure of FIG. 13A. Since the host material is doped with the light emitting material 11012, this element is also effective in preventing carriers from passing the light emitting region without stopping, which usually is likely to occur when the thickness of the light emitting region 11006 is reduced in order to lower drive voltage.

In the element of FIG. 22, a hole injecting region 11010 formed of a hole injecting material may be inserted between an anode 11002 and the organic compound film 11003. Alternatively, an electron injecting region 11011 formed of an electron injecting material may be inserted between a cathode 11004 and the organic compound film 11003. It is also possible to employ both the hole injecting region and the electron injecting region simultaneously. Shown in FIG. 22 is an example of forming the hole injecting region 11010 and the electron injecting region 11011 both.

When the hole injecting region is provided in the organic light emitting element described above, it is particularly preferable to use a material with the p type conductivity. As an example thereof, a method may be employed in which a 6-electron conjugate system organic compound is doped with Lewis acid to improve the conductivity. From the standpoint of film formation method, it is preferred to use a polymeric compound that can be formed into a film by wet application. Preferable Lewis acid is a compound that contains a halogen element such as iodine.

When the electron injecting region is provided in the organic light emitting element described above, it is particularly preferable to use a material having the n type conductivity. As an example thereof, a method may be employed in which a 6-electron conjugate system organic compound is doped with Lewis base to improve the conductivity. Preferable Lewis base is a compound that contains an alkaline metal element such as cesium.

In recent years, organic light emitting elements that can convert energy discharged in returning from triplet excitation to base state (hereinafter referred to as triplet excitation energy) into light emission, have been attracting attention because of their high light emission efficiency (Reference 8: D. F. O'Brien, M. A. Baldo, M. E. Thompson and S. R. Forrest, "Improved energy transfer in electrophosphorescent devices", Applied Physics Letters, vol. 74, no. 3, 442-444 (1999)) (Reference 9: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency in Organic Light-Emitting Devices with Iridium-Complex as a Triplet Emissive Center", Japanese Journal of Applied Physics, vol. 38, L1502-L1504 (1999)).

A metal complex with platinum as central metal is used in reference 8 and a metal complex with iridium as central metal is used in Reference 9. These organic light emitting elements that can convert triplet excitation energy into light emission (hereinafter referred to as triplet light emission elements) can emit light with higher luminance and higher light emission efficiency than conventional ones.

However, according to the report of Reference 9, the period of half decay of the luminance is about 170 hours when the initial luminance is set to 500 cd/m$^2$ and this is not a satisfiable element lifetime. Probably, the reason for short element lifetime of triplet light emission elements is that necessity of a proper host material for a light emitting material as well as a blocking material for preventing molecular exciton from diffusing leads to form a multi-layer structure and many organic interfaces.

Then the idea of the present invention, namely, introducing a mixed layer between organic layers, is applied to a triplet light emission element. The thus obtained element emits light from triplet excitation not only with high luminance and high light emission efficiency but also with a long element lifetime to be made a very highly functional light emitting element.

Triplet molecular excitons are larger in diffusion length than singlet molecular excitons and therefore need a material that plays a role similar to the role of a blocking material (in general, a material with an excitation energy level larger than that of a molecular exciton of the light emitting seed is appropriate). Considering the element structure, it is preferable that an electron transporting material takes the role.

The first mixed region and the second mixed region that are employed by the organic light emitting element of the present invention described above may have concentration gradient as shown in FIG. 19. This is more desirable because it is expected that the concentration gradient can remove energy barriers against carriers at both edges of the light emitting region almost completely.

BRIEF DESCRIPTION OF THE DRAWINGS

In the accompanying drawings:
FIGS. 7A to 7D are diagrams illustrating a manufacture process;
FIGS. 8A to 8C are diagrams illustrating a manufacture process;
FIGS. 9A to 9C are diagrams illustrating a manufacture process;
FIGS. 12A to 12H are diagrams showing examples of an electric appliance;
FIGS. 24A and 24B are diagrams showing the sectional structure of a light emitting device;
FIGS. 26A and 26B are diagrams showing the sectional structure of a light emitting device.

FIGS. 34A to 34C are diagrams showing the structure of a light emitting device;

DETAILED DESCRIPTION OF THE PREFERRED EMBODIMENTS

Figure 1A:
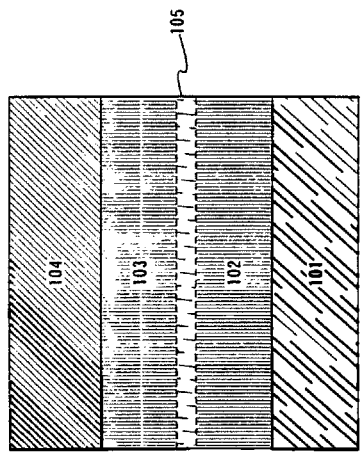
FIGS. 1A to 1D are diagrams illustrating a mixed layer in the present invention.
Figure 1B:
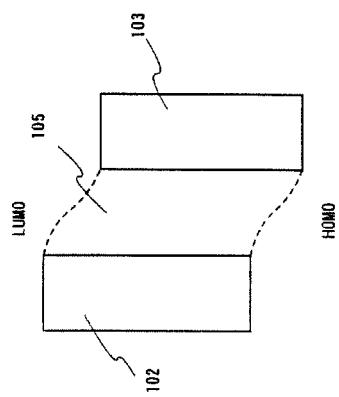
Figure 1C:
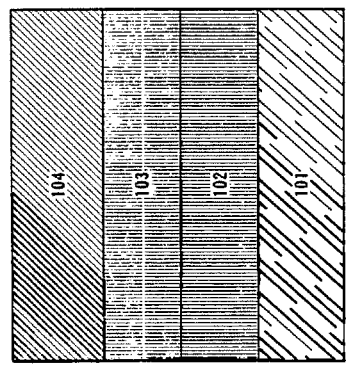
Figure 1D:
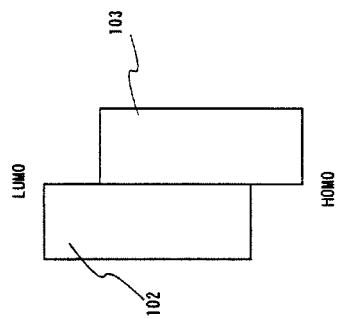

A method of manufacturing an organic light emitting element according, to the present invention will be described with reference to FIGS. 2A and 2B and FIGS. 3A to 3D.

First, an anode 201 is formed on a substrate 200 by sputtering or evaporation. On the anode 201, an organic compound layer (1) 202 is formed. The organic compound layer (1) 202 is formed using an organic compound 1 by vacuum evaporation.

A mixed layer 205 is formed next. The mixed layer 205 is formed, by coevaporation under vacuum, using the material that constitutes the organic compound layer (1) 202 (the organic compound 1) and a material that later constitutes an organic compound layer (2) 203 (an organic compound 2). Coevaporation is an evaporation method in which evaporation cells are simultaneously heated to mix different substances during film formation.

Figure 2B:
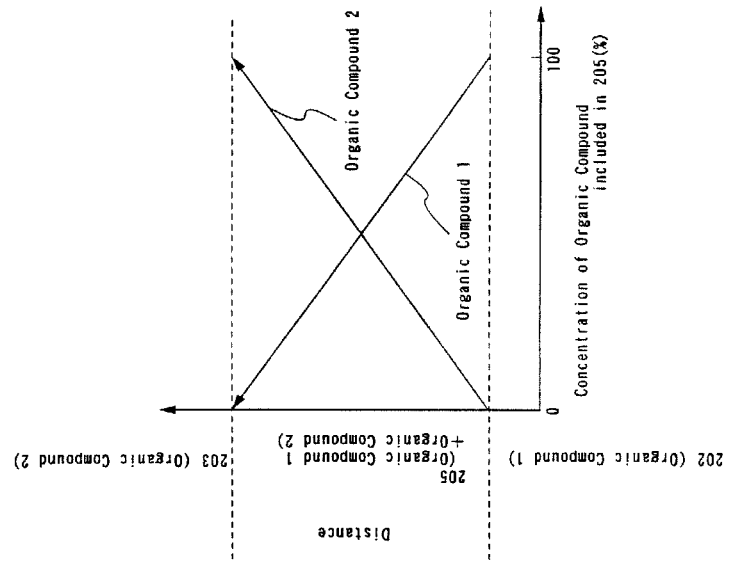
FIGS. 2A and 2B are diagrams illustrating concentration gradient in a mixed layer.

When a mixed layer is formed using a plurality of organic compounds by coevaporation, the concentrations of the respective organic compounds contained in the mixed layer can be controlled. FIG. 2B shows an example of the case where the organic compound 1 and the organic compound 2 contained in the mixed layer 205 have concentration gradient.

Shown in FIG. 2B is the relation between the ratio of the plural organic compounds in the mixed layer (concentration: %) and the distance from the mixed layer to the organic compound layers that are in contact with the mixed layer. In FIG. 2B, the axis of abscissa indicates the concentration (%) of the organic compounds contained in the mixed layer 205 and the axis of ordinate indicates the distance from the mixed layer 205 to the organic compound layer (1) 202 and the organic compound layer (2) 203 that are in contact with the mixed layer.

In the mixed layer 205 shown in FIG. 2B, the concentration of the organic compound 1 used to form the organic compound layer (1) 202 is nearly 100% in the vicinity of the interface between the mixed layer 205 and the organic compound layer (1) 202. This concentration declines as the distance from the organic compound layer (1) 202 is increased and reaches almost 0% in the vicinity of the interface between the mixed layer 205 and the organic compound layer (2) 203. The concentration of the organic compound 2 used to form the organic compound layer (2) 203 behaves in a reversed manner, and rises as the distance from the organic compound layer (1) 202 is increased to approach 100% in the vicinity of the interface between the mixed layer 205 and the organic compound layer (2) 203.

By introducing gradient to the concentration of the materials that constitute the mixed layer 205 as described above, the mixed layer 205 can lower energy barriers between organic layers. It is therefore effective in improving the mobility of carriers.

On the mixed layer 205, the organic compound layer (2) 203 is formed. The material of the organic compound layer (2) 203 is the organic compound 2 and the compound is formed into a film by evaporation under vacuum.

A laminate structure composed of organic compounds is completed through the above steps. Thereafter, a cathode is formed by evaporation or sputtering to complete the organic light emitting element.

Figure 2A:
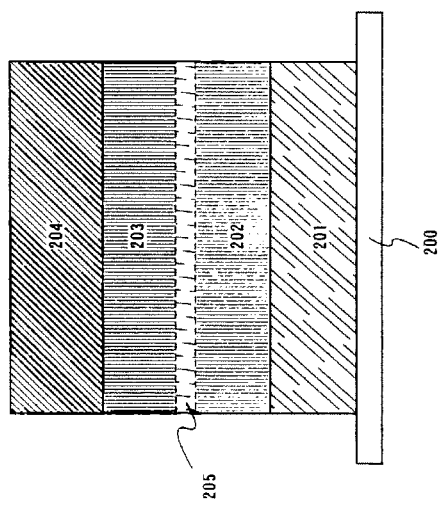

Now, detailed descriptions will be given with reference to FIGS. 3A to 3D on how the organic compound layers (the organic compound layer (1) 202 and the organic compound layer (2) 203) and the mixed layer are formed. In FIGS. 3A to 3D, components identical with those in FIGS. 2A and 2B are denoted by the same symbols.

Figure 3A:
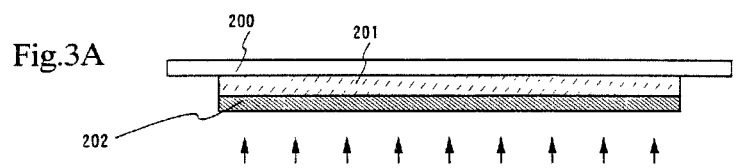
FIGS. 3A to 3D are diagrams illustrating formation of a mixed layer.

In FIG. 3A, the anode 201 is formed on the substrate 200 and the organic compound layer (1) 202 is formed on the anode 201 from the organic compound 1. The organic compound layer (1) 202 is formed by evaporation in a film forming chamber as shown in FIG. 3D. In a film forming chamber 310, a substrate on which a film is to be formed is placed on a fixing base 311 and evaporation is performed on the substrate while being fixed or rotated.

In FIG. 3D, the film forming chamber 310 is provided with a plurality of sample chambers. Each sample chamber contains an organic compound for forming an organic compound layer. Shown in FIG. 3D is the case in which there are two sample chambers, but the number of sample chambers may be three or more.

A sample chamber (a) 312 in FIG. 3D contains an organic compound 1 (316). That is, when a shutter (a) 314 provided in the sample chamber (a) 312 is opened, the organic compound 1 (316) serves as an evaporation source to form the organic compound layer (1) 202.

Figure 3B:
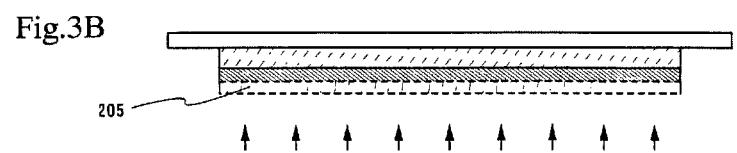

Next, the mixed layer 205 is formed as shown in FIG. 3B. The mixed layer 205 uses as evaporation sources the organic compound 1 (316) contained in the sample chamber (a) 312 and an organic compound 2 (317) contained in a sample chamber (b) 313. The shutter (a) 314 provided in the sample chamber (a) 312 and a shutter (b) 315 provided in the sample chamber (b) 313 are opened and the organic compound 1 (316) and the organic compound 2 (317) used as the evaporation sources are formed into a film by coevaporation.

If the concentrations of the organic compounds in the mixed layer are to be controlled as described above, opening of the shutter (a) 314 and the shutter (b) 315 is adjusted to obtain the concentration gradient of the mixed layer shown in FIG. 2B.

Figure 3C:
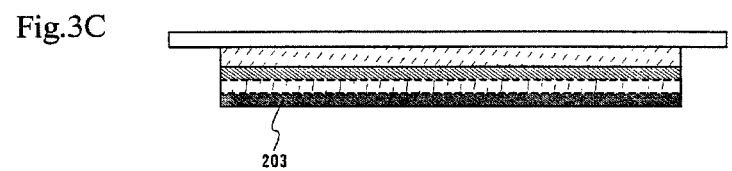
Figure 3D:
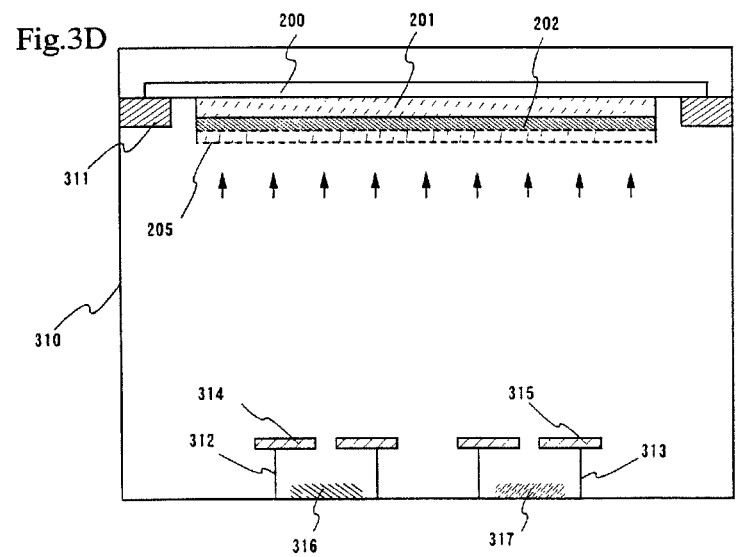

Next, the shutter (a) 314 of the sample chamber (a) 312 is closed while the shutter (b) 315 of the sample chamber (b) 313 is kept opened. The organic compound layer (2) 203 is thus formed with the organic compound 2 as the evaporation source (FIG. 3C).

The organic compound layer of the organic light emitting element is formed as a laminate of plural organic compound layers such as a hole injecting layer, a hole transporting layer, a light emitting layer, a hole blocking layer, an electron transporting layer, and an electron injecting layer in order to handle different functions. If a mixed layer is to be formed at the interface between organic compound layers, the position of the mixed layer to be formed is important in designing the element structure of an organic light emitting element since the laminate structure varies among organic light emitting elements. Then detailed descriptions will be given below about organic light emitting elements with specific element structures.

Embodiment Mode 1

Figure 4:
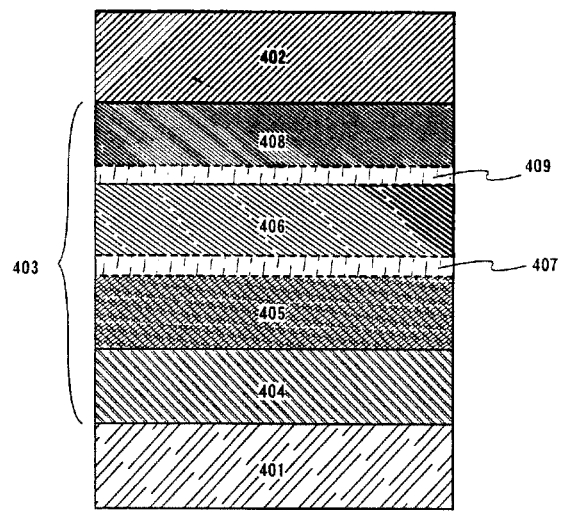
FIG. 4 is a diagram illustrating the element structure in an organic light emitting element according to the present invention.

Embodiment Mode 1 describes a case of forming mixed layers at interfaces of organic compound layers with a light emitting layer in an organic light emitting element that has an organic compound layer 403 between an anode 401 and a cathode 402 as shown in FIG. 4.

In this embodiment mode, the organic compound layer 403 has a laminate structure of a plurality of organic compound layers. Specifically, a hole injecting layer 404 for improving injection of holes from the anode is formed on the anode 401, and a hole transporting layer 405 for improving transportation of the injected holes is formed on the hole injection layer 404.

A mixed layer (1) 407 is formed by coevaporation using the material that constitutes the hole transporting layer 405 and the material that constitutes a light emitting layer 406. The coevaporation is carried out in the manner described above. At this point, the mixed layer (1) 407 may have concentration gradient.

By providing the mixed layer (1) 407, the energy barrier between the hole transporting layer 405 and the light emitting layer 406 can be relaxed. Therefore more holes can be injected from the hole transporting layer 405 to the light emitting layer 406.

The light emitting layer 406 is formed on the mixed layer (1) 407. In the case of the laminate structure of the organic compound layer shown in Embodiment Mode 1, the organic compound forming the light emitting layer is preferably lower in excitation energy than the material forming the hole transporting layer 405 and the material forming an electron transporting layer 408, respectively. This is because injection of carriers to the light emitting layer is improved by providing the mixed layer at the interface between the light emitting layer and the organic compound layer, with the result that the carriers easily pass the light emitting layer. In addition to using an organic compound with a low excitation energy for the light emitting layer, a dopant with a low excitation energy may be used.

On the light emitting layer 406, a mixed layer (2) 409 is formed by coevaporation using the material for forming the light emitting layer 406 and the material for forming the electron transporting layer 408. It is preferable for the mixed layer (2) 409 to have concentration gradient similar to the mixed layer (1) 407.

On the mixed layer (2) 409, the electron transporting layer 408 is formed by evaporation and then the cathode 402 is formed by evaporation or sputtering to complete the organic light emitting element.

The organic light emitting element shown above has a structure in which mixed layers are provided at interfaces of organic compound layers with a light emitting layer (specifically, the interface between the light emitting layer and a hole transporting layer and the interface between the light emitting layer and an electron transporting layer). By giving the organic light emitting element with this structure, injection of holes from the hole transporting layer to the light emitting layer and injection of electrons from the electron transporting layer to the light emitting layer are improved to enhance recombination of carriers in the light emitting layer.

Embodiment Mode 2

Embodiment Mode 2 gives a description on a case of manufacturing an organic light emitting element with an element structure different from the one shown in Embodiment Mode 1.

The description given in Embodiment Mode 2 is a case in which mixed layers are formed at interfaces of organic compound layer with a laminate structure when an organic light emitting element is a triplet light emission element.

Figure 5:
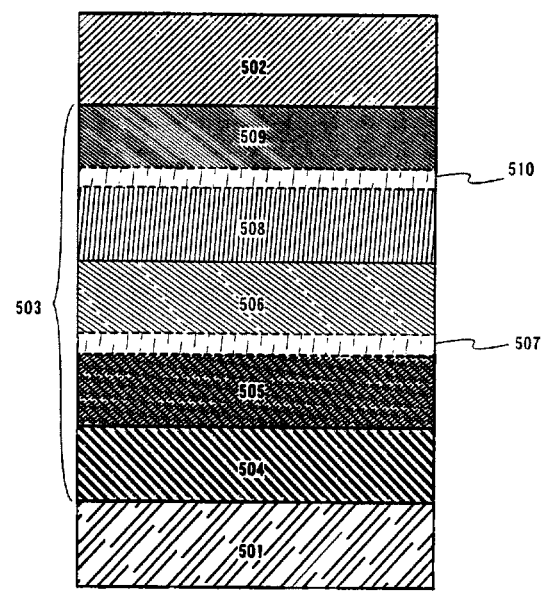
FIG. 5 is a diagram illustrating the element structure in an organic Light emitting element according to the present invention.

In Embodiment Mode 2, a laminate organic compound layer 503 with a plurality of organic compound layers is formed between an anode 501 and a cathode 502 as shown in FIG. 5. Specifically, a hole injection layer 504 for improving injection of holes from the anode 501 is formed on the anode 501, and a hole transporting layer 505 for improving transportation of the injected holes is formed on the hole injection layer 504.

A mixed layer (1) 507 is formed by coevaporation using the material that constitutes the hole transporting layer 505 and the material that constitutes a light emitting layer 506. The coevaporation is carried out in the manner described above. At this point, the mixed layer (1) 507 may have concentration gradient.

By providing the mixed layer (1) 507, the energy barrier between the hole transporting layer 505 and the light emitting layer 506 can be relaxed. Therefore more holes can be injected from the hole transporting layer 505 to the light emitting layer 506.

The light emitting layer 506 is formed on the mixed layer (1) 507. In the case of the laminate structure of the organic compound layer shown in Embodiment Mode 2, the organic compound forming the light emitting layer is formed from a material that emits light by utilizing energy discharged in returning from triplet excitation to base state. Therefore the light emitting layer is formed by co evaporation of a host material and a triplet light emission material (dopant) that is lower in excitation energy than the host material.

On the light emitting layer 506, a hole blocking layer 508 is formed. The hole blocking layer 508 has functions of preventing the holes injected from the hole transporting layer 505 to the light emitting layer 506 from passing the light emitting layer, and of preventing molecular excitons generated as a result of recombination of the holes and electrons in the light emitting layer 506 from diffusing from the light emitting layer 506.

On the hole blocking layer 508, a mixed layer (2) 510 is formed by coevaporation using the material for forming the hole blocking layer 508 and the material for forming an electron transporting layer 509. It is preferable for the mixed layer (2) 510 to have concentration gradient similar to the mixed layer (1) 507.

On the mixed layer (2) 510, the electron transporting layer 509 is formed by evaporation and then the cathode 502 is formed by evaporation or sputtering to complete the organic light emitting element.

The organic light emitting element shown above has a structure in which mixed layers are provided at interfaces of organic compound layers (specifically, the interface between the light emitting layer 506 and the hole transporting layer 505, and the interface between the hole blocking layer 508 and the electron transporting layer 509). By giving the organic light emitting element with this structure, injection of holes from the hole transporting layer 505 to the light emitting layer 506 and injection of electrons from the electron transporting layer 509 to the hole blocking layer 508 are improved to enhance recombination of carriers in the light emitting layer.

The organic light emitting element with the structure shown in Embodiment Mode 2 is suitable to a case in which a triplet light emission material is used in a light emitting layer. However, it is not necessary to limit thereto and it can also be employed when an organic compound that emits light by utilizing singlet excitation energy is used. Appropriate triplet light emission materials are the metal complex with platinum as central metal which is introduced in Reference 7, the metal complex with iridium as central metal which is introduced in Reference 8, and the like.

Embodiment Mode 3

Figure 6:
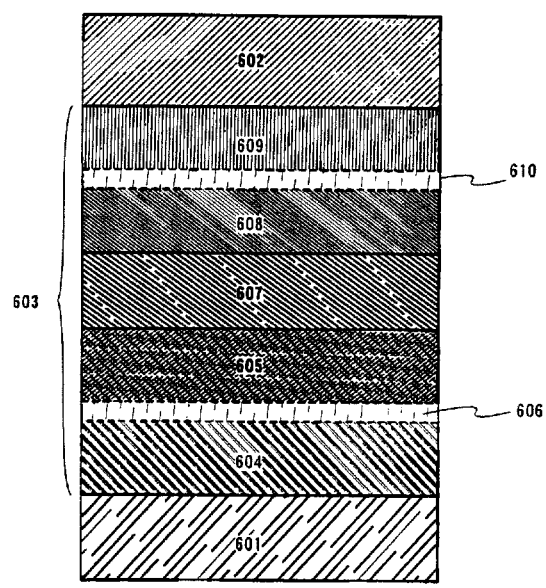
FIG. 6 is a diagram illustrating the element structure in an organic light emitting element according to the present invention.

Embodiment Mode 3 gives a description with reference to FIG. 6 in a case of manufacturing an organic light emitting element with an element structure different from the one shown in Embodiment Mode 1 or Embodiment Mode 2.

The description given in Embodiment Mode 3 is a case in which an organic light emitting element has an organic compound layer 603 between an anode 601 and a cathode 602 and mixed layers are formed at interfaces between injecting layers and transporting layers in the organic compound layer.

In Embodiment Mode 3, the organic compound layer 603 has a structure in which a plurality of organic compound layers are laminated. Specifically, a hole injecting layer 604 for improving injection of holes from the anode 601 is formed on the anode 601.

In this embodiment mode, a mixed layer (1) 606 is formed here by coevaporation using the material that constitutes the hole injection layer 604 and the material that constitutes a hole transporting layer 605. The hole transporting layer 605 is formed on the mixed layer (1) 606.

By providing the mixed layer (1) 606, the energy barrier between the hole injection layer 604 and the hole transporting layer 605 can be lowered. Therefore more holes can be injected from the hole transporting layer 605 to a light emitting layer 607. At this point, the mixed layer (1) 606 may have concentration gradient.

The light emitting layer 607 is formed on the hole transporting layer 605. Further, an electron transporting layer 608 is formed on the light emitting layer 607.

Then a mixed layer (2) 610 is formed by coevaporation using the material for forming the electron transporting layer 608 and the material for forming an electron injection layer 609. It is preferable for the mixed layer (2) 610 to have concentration gradient similar to the mixed layer (1) 606. The electron injection layer 609 is formed on the mixed layer (2) 610.

After the electron injection layer 609 is formed by evaporation, the cathode 602 is formed by evaporation or sputtering to complete the organic light emitting element.

The organic light emitting element shown above has a structure in which mixed layers are provided at interfaces between injecting layers and transporting layers (specifically, the interface between the hole injecting layer and the hole transporting layer and the interface between the electron transporting layer and the electron injecting layer). By giving the organic light emitting element with this structure, the mobility of injected carriers in the organic compound layers is improved while the mixed layers lower the energy barriers to reduce the interfaces substantially. Therefore the above structure is advantageous in that carrier recombination is enhanced.

Modes required in carrying out the present invention will further be described below. In an organic light emitting element, at least one of anode and cathode is transparent in order to extract emitted light to the outside. According to the element structure of this embodiment mode, a transparent anode is formed on a substrate to take the light out from the anode. However, the present invention can also adopt a structure for taking the light out from a cathode and a structure for taking the light out from the side reverse to the substrate.

In carrying out the present invention, the process of manufacturing an organic light emitting element becomes important to avoid formation of impurity layers. Therefore a method of manufacturing an organic light emitting device according to the present invention is described first.

Figure 23A:
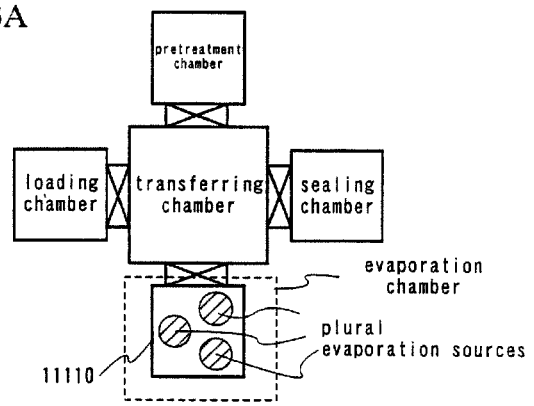
FIGS. 23A and 23B are diagrams showing evaporation apparatus.

FIG. 23A is a top view of evaporation apparatus. The apparatus is of single chamber type in which one vacuum tank 1110 is set as an evaporation chamber and a plurality of evaporation sources are provided in the vacuum tank. Stored in the plural evaporation sources respectively are materials with different functions, including a hole injecting material, a hole transporting material, an electron transporting material, an electron injecting material, a blocking material, a light emitting material, and a material for forming a cathode.

In the evaporation apparatus with this evaporation chamber, a substrate with an anode (formed of ITO or the like) is brought into a loading chamber. If the anode is an oxide such as ITO, oxidation treatment is performed in a pretreatment chamber (although not shown in FIG. 23A, the apparatus may be provided with an ultraviolet ray irradiation chamber to clean the anode surface). All of the materials that form the organic light emitting element are subjected to evaporation in the vacuum tank 11110. The cathode can be formed in the vacuum tank 11110 or may be formed in a separate evaporation chamber instead. In short, it is sufficient if layers before forming the cathode are formed in a single vacuum tank 11110 by evaporation. Lastly, sealing is conducted in a sealing chamber and the substrate is taken out of an unloading chamber to obtain the organic light emitting element.

The procedure of manufacturing an organic light emitting element according to the present invention using the single chamber type evaporation apparatus as this will be described with reference to FIG. 23B (a sectional view of the vacuum tank 11110). Shown in FIG. 23B as the simplest example is a process of forming an organic compound film that contains a hole transporting material 11121, an electron transporting material 11122, and a light emitting material 11123 using the vacuum chamber 11110 that has three evaporation sources (an organic compound evaporation source a 11116, an organic compound evaporation source b 11117, and an organic compound evaporation source c 11118).

First, a substrate 11101 with an anode 11102 is brought into the vacuum tank 11110 and is fixed by a fixing base 11111 (usually, the substrate is rotated during evaporation). Next, the pressure in the vacuum tank 11110 is reduced (preferably to $10^{-4}$ pascal or lower) and then a container a 11112 is heated to evaporate the hole transporting material 11121. When a given evaporation rate (unit: Å/s) is reached, a shutter a 11114 is opened to start deposition by evaporation.

Figure 23B:
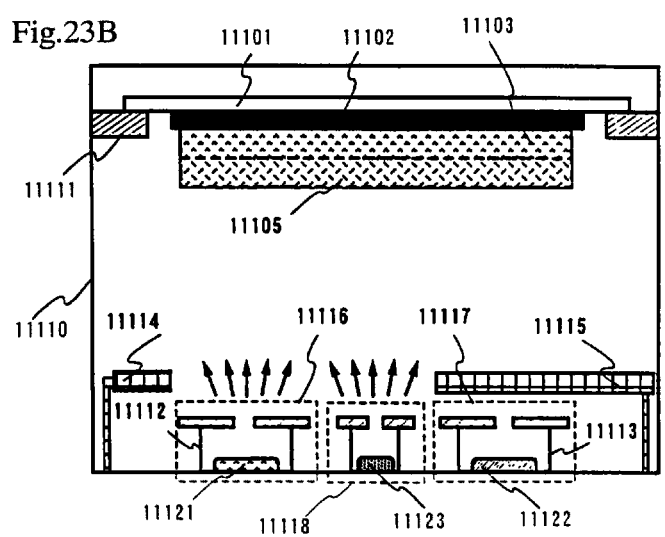

After a hole transporting region 11103 reaches to a given thickness, evaporation of the light emitting material 11123 is started while the hole transporting material 11121 is kept evaporated to form a first mixed region 11105 (corresponding to the state shown in FIG. 23B). If the first mixed region 11105 is to have concentration gradient, the shutter a 11114 is gradually closed to decrease the evaporation rate of the hole transporting material.

Then the shutter a 11114 is closed completely to end evaporation of the hole transporting material 11121 and form a light emitting region consisting of the light emitting material 11123. At this point, a container b 11113 is heated with a shutter b 11115 closed.

After the light emitting region reaches to a given thickness, the shutter b 11115 is opened and evaporation of the electron transporting material 11122 is started to form a second mixed region. If the second mixed region is to have concentration gradient, the evaporation rate of the light emitting material 11123 is gradually reduced.

Lastly, evaporation of the light emitting material 11123 is ended and an electron transporting region consisting of the electron transporting material 11122 is formed. The above operations are successively conducted without any interval and therefore no impurity layers are formed in any region.

All of the organic light emitting elements described in 'Summary of the Invention' can be manufactured by application of this method. For instance, in manufacturing the element as FIG. 22 which includes a light emitting material as guest in relation to a host material, an evaporation source for evaporation of the host material is added to the components of FIG. 23B. The host material is used in forming the mixed region and in forming the light emitting region whereas the light emitting material is evaporated in a minute amount to dope the host material during evaporation of the host material (during formation of the light emitting region, to be strict).

In the case where a hole injecting region or an electron injecting region is formed, an evaporation source for the injecting material is set in the same vacuum tank 11110. For example, if a hole injecting region is formed by evaporation between the anode 11102 and the hole transporting region 11105 in FIG. 23B, the hole transporting material 11121 is evaporated immediately after the hole injecting material is deposited by evaporation on the anode 11102. Formation of impurity layers is thus avoided.

Listed below are materials which are preferable as the hole injecting material, the hole transporting material, the electron transporting material, the electron injecting material, and the light emitting material. However, materials usable for an organic light emitting element of the present invention are not limited thereto.

Effective hole injecting materials are, within confines of organic compounds, porphyrin-based compounds, and phthalocyanine (hereafter, $H_2Pc$) and copper phthalocyanine (hereafter, CuPc) are often used. Among polymers, polyvinyl carbazole (hereafter, PVK) is effective as well as the aforementioned materials obtained by performing chemical doping on conjugate system conductive polymers. Examples of these polymers include polyethylene dioxythiophene (hereafter, PEDOT) doped with polystyrene sulfonic acid (hereafter, PSS), and polyaniline, or polypyrrole, doped with iodine or other Lewis acid. A polymer that is an insulator is also effective in terms of planarization of the anode, and polyimide (hereafter, PI) is often used. Effective materials are also found among inorganic compounds, and examples thereof include a thin film of gold, platinum or like other metals and a very thin film of aluminum oxide (hereinafter referred to alumina).

Materials most widely used as the hole transporting material are aromatic amine-based (namely, those with a benzene ring-nitrogen bond) compounds. Of them, particularly widely used are: 4,4'-bis(diphenylamino)-biphenyl (hereafter, TAD); its derivative, namely, 4,4'-bis[N-(3-methylphenyl)-N-phenyl-amino]-biphenyl (hereafter, TPD); and 4,4'-bis-[N-(1-naphthyl)-N-phenyl-amino]-biphenyl (hereafter, α-NPD). Also used are star burst aromatic amine compounds, including: 4,4',4"-tris(N,N-diphenyl-amino)-triphenyl amine (hereafter, TDATA); and 4,4',4"-tris[N-(3-methylphenyl)-N-phenyl-amino]-triphenyl amine (hereafter, MTDATA).

Metal complexes are often used as the electron transporting material. Examples thereof include: metal complexes having quinoline skeleton or benzoquinoline skeleton, such as the aforementioned Alq, tris(4-methyl-8-quinolinolate) aluminum (hereafter, Almq), and bis(10-hydroxybenzo[h]-quinolinate) beryllium (hereafter, Bebq); and bis(2-methyl-8-quinolinolate)-(4-hydroxy-biphenylil)-aluminum (hereafter, BAlq) that is a mixed ligand complex. The examples also include metal complexes having oxazole-based and thiazole-based ligands such as bis[2-(2-hydroxypheyl)-benzooxazolate]zinc (hereafter, $Zn(BOX)_2$) and bis[2-(2-hydroxypheyl)-benzothiazolate]zinc (hereafter, $Zn(BTZ)_2$). Other materials that are capable of transporting electrons than the metal complexes are: oxadiazole derivatives such as 2-(4-biphenylyl)-5-(4-tert-butylphenyl)-1,3,4-oxadiazole (hereafter, PBD) and 1,3-bis[5-(p-tert-butylphenyl)-1,3,4-oxadiazole-2-il]benzene (hereafter, OXD-7); triazole derivatives such as 5-(4-biphenylyl)-3-(4-tert-butylphenyl)-4-phenyl-1, 2,4-triazole (hereafter, TAZ) and 5-(4-biphenylyl)-3-(4-tert-butylphenyl)-4-(4-ethylpheyl)-1,2,4-triazole (hereafter, p-EtTAZ); and phenanthroline derivatives such as bathophenanthroline (hereafter, BPhen) and bathocupuroin (hereafter, BCP).

The electron transporting material given above can be used as the electron injecting material. Other than those, a very thin film of an insulator, including alkaline metal halides such as lithium fluoride and alkaline metal oxides such as lithium oxide, is often used. Alkaline metal complexes such as lithium acetyl acetonate (hereafter, Li(acac)) and 8-quinolinolate-lithium (hereafter, Liq) are also effective.

Materials effective as the light emitting material are various fluorescent pigments, in addition to the aforementioned metal complexes including Alq, BeBq, BAlq, $Zn(BOX)_2$, and $Zn(BTZ)_2$. Examples of fluorescent pigments include 4,4'-bis (2,2-diphenyl-vinyl)-biphenyl (hereafter, DPVBi) that is blue, and 4-(dicyanomethylene)-2-methyl-6-(p-dimethylaminostylyl)-4H-pyran (hereafter, DCM) that is reddish orange. Triplet light emission materials may also be used and the mainstream thereof are complexes with platinum or iridium as central metal. Known triplet light emission materials include tris(2-phenylpyridine) iridium (hereafter, $Ir(ppy)_3$) and 2, 3, 7, 8, 12, 13, 17, 18-octaethyl-21H, 23H-porphyrin-platinum (hereafter, PtOEP).

The above materials of respective functions are combined to constitute an organic light emitting element of the present invention, whereby an organic light emitting element that is lower in drive voltage and longer in element lifetime than conventional ones can be manufactured.

Embodiment 1

This embodiment describes a case of forming the organic light emitting element that has the structure shown in Embodiment Mode 1. The description of this embodiment is given with reference to FIG. 4.

An indium tin oxide (ITO) film or a transparent conductive film obtained by mixing 2 to 20% of zinc oxide (ZnO) with indium oxide is used for an anode 401, which is a component of the organic light emitting element. The thickness of the anode 401 is preferably 80 to 200 nm in this embodiment.

On the anode 401, a hole injecting layer 404 is formed. A phthalocyanine-based material such as copper phthalocyanine (CuPc) or nonmetal phthalocyanine ($H_2Pc$) is used for the hole injecting layer 404. In this embodiment, the hole injecting layer 404 is formed from copper phthalocyanine. The thickness of the hole injecting layer 404 is preferably 10 to 30 nm.

After the hole injecting layer 404 is formed, a hole transporting layer 405 is formed. An aromatic amine-based material such as 4,4'-bis-[N-(1-naphthyl)-N-phenyl-amino]-biphenyl (α-NPD), or 1,1-bis[4-bis(4-methyl phenyl)-amino-phenyl]cyclohexane (TPAC), or 4,4',4"-tris[N-(3-methylphenyl)-N-phenyl-amino]-triphenyl amine (MTDATA) can be used as the hole transporting layer 405 of this embodiment. In this embodiment, the hole transporting layer 405 is formed from α-NPD to have a thickness of 30 to 60 nm.

A mixed layer (1) 407 is formed next. The mixed layer (1) 407 is formed from α-NPD used to form the hole transporting layer 405 and Alq$_3$ used to form a light emitting layer 406 by coevaporation. The thickness of the mixed layer (1) 407 is preferably 1 to 10 nm.

Next, the light emitting layer 406 is formed. The light emitting layer 406 is formed from Alq$_3$ by evaporation. The thickness of the light emitting layer 406 is preferably 30 to 60 nm.

According to the structure of the organic light emitting element in this embodiment, the light emitting layer has to be formed from a material with lower excitation energy than the materials of the hole transporting layer 405 and the material of the electron transporting layer 408. Otherwise, the material of the light emitting layer has to be doped with a dopant which has a low excitation energy.

For the material to form the light emitting layer 406 of this embodiment, in addition to Alq$_3$, Alpq$_3$ is suitable, which is obtained by introducing a phenyl group to Alq$_3$. As the dopant used in doping to the light emitting layer, known materials including perylene, rubrene, coumarine, 4-(dicyanomethylene)-2-methyl-6-(p-dimethylaminostylyl)-4H-pyran (DCM), and quinacrydon can be employed.

A mixed layer (2) 409 is formed next. The mixed layer (2) 409 is formed from Alq$_3$ or Alpq$_3$ used to form the light emitting layer 406 and the material used to form an electron transporting layer 408 by coevaporation. The thickness of the mixed layer (2) 409 is preferably 1 to 10 nm.

Next, the electron transporting layer 408 is formed. 1,3,4-oxadiazole derivatives, 1,2,4-triazole derivatives, or the like can be used here. Specifically, materials usable as the electron transporting layer include: 2-(4-biphenylyl)-5-(4-tert-butylphenyl)-1,3,4-oxadiazole (PBD); 2,5-(1,1'-dinaphthyl)-1,3,4-oxadiazole (BND); 1,3-bis[5-(p-tert-butylphenyl)-1,3,4-oxadiazole-2-il]benzene (OXD-7); and 3-(4-tert-butylphenyl)-4-phenyl-5-(4-biphenylyl)-1,2,4-triazole (TAZ). The thickness of the electron transporting layer 408 is preferably 30 to 60 nm.

After all of the above films are formed, a cathode of the organic light emitting element is formed by evaporation. In this embodiment, MgAg is used as a conductive film that constitutes the cathode of the organic light emitting element. However, a Al film or Yb film can be used as well as a Al:Li alloy film (an alloy film of aluminum and lithium) or a film obtained by coevaporation of aluminum and an element belonging to Group 1 or 2 in the periodic table.

Embodiment 2

This embodiment describes a case of forming the organic light emitting element that has the structure shown in Embodiment Mode 2. The description of this embodiment is given with reference to FIG. 5.

An indium tin oxide (ITO) film or a transparent conductive film obtained by mixing 2 to 20% of zinc oxide (ZnO) with indium oxide is used for an anode 501, which is a component of the organic light emitting element. The thickness of the anode 501 is preferably 80 to 200 nm in this embodiment.

On the anode 501, a hole injecting layer 504 is formed. A phthalocyanine-based material such as copper phthalocyanine (CuPc) or nonmetal phthalocyanine (H$_2$Pc) is used for the hole injecting layer 504. In this embodiment, the hole injecting layer 504 is formed from copper phthalocyanine. The thickness of the hole injection layer 504 is preferably 10 to 30 nm.

After the hole injection layer 504 is formed, a hole transporting layer 505 is formed. An aromatic amine-based material such as α-NPD, TPAC, or MTDATA can be used for the hole transporting layer 505 of this embodiment. In this embodiment, the hole transporting layer 505 is formed by laminating MTDATA and α-NPD to have a thickness of 30 to 60 nm. The MTDATA film (lower layer) is formed on the hole transporting layer 505 to have a thickness of 10 to 20 nm, and then the α-NPD film (upper layer) is formed thereon to have a thickness of 5 to 20 nm.

A mixed layer (1) 507 is formed next. The mixed layer (1) 507 is formed by coevaporation, from α-NPD used to form the upper layer of the hole transporting layer 505 and 4,4'-N,N'-dicarbazole-biphenyl (CBP) and tris(2-phenylpyridine) iridium (Ir(ppy)$_3$) that are used to form a light emitting layer 506. The thickness of the mixed layer (1) 507 is preferably 1 to 10 nm.

Next, the light emitting layer 506 is formed. The light emitting layer 506 is formed from CBP as the dopant and an iridium complex (Ir(ppy)$_3$) as the host material by coevaporation. The host material may be a platinum complex instead of an iridium complex. The thickness of the light emitting layer 506 is preferably 10 to 30 nm.

On the light emitting layer 506, a hole blocking layer 508 is formed. In this embodiment, the hole blocking layer 508 is formed from BCP to have a thickness of 10 to 30 nm.

A mixed layer (2) 510 is formed next. The mixed layer (2) 510 is formed from BCP used to form the hole blocking layer 508 and Alq$_3$ used to form an electron transporting layer 509 by coevaporation. The thickness of the mixed layer (2) 510 is preferably 1 to 10 nm.

Next, the electron transporting layer 509 is formed. Alq$_3$, Alpq$_3$, or the like can be used here. In this embodiment, the electron transporting layer 509 is formed from Alq$_3$ to have a thickness of 30 to 60 nm.

After all of the above films are formed, a cathode 502 of the organic light emitting element is formed by evaporation. In this embodiment, MgAg is used as a conductive film that constitutes the cathode 502 of the organic light emitting element. However, a Al film or Yb film can be used as well as a Al—Li alloy film (an alloy film of aluminum and lithium) or a film obtained by coevaporation of aluminum and an element belonging to Group 1 or 2 in the periodic table. The cathode 502 in this embodiment has a thickness of 100 to 500 nm.

In the case of the element structure according to this embodiment, it is particularly preferable to use a triplet light emission material as the light emitting layer.

Embodiment 3

This embodiment describes a case of forming the organic light emitting element that has the structure shown in Embodiment Mode 3. The description of this embodiment is given with reference to FIG. 6.

An indium tin oxide (ITO) film or a transparent conductive film obtained by mixing 2 to 20% of zinc oxide (ZnO) with indium oxide is used for an anode 601 of the organic light emitting element. The thickness of the anode 601 is preferably 80 to 200 nm in this embodiment.

On the anode 601, a hole injecting layer 604 is formed. A phthalocyanine-based material such as copper phthalocyanine (CuPc) or nonmetal phthalocyanine (H$_2$Pc) is used for the hole injecting layer 604. In this embodiment, the hole injecting layer 604 is formed from copper phthalocyanine. The thickness of the hole injecting layer 604 is preferably 10 to 30 nm in this embodiment.

A mixed layer (1) 606 is formed next. The mixed layer (1) 606 is formed by coevaporation, from copper phthalocyanine used to form the hole injecting layer 604 and α-NPD used to form a hole transporting layer 605. The thickness of the mixed layer (1) 606 is preferably 1 to 10 nm.

After the mixed layer (1) 606 is formed, the hole transporting layer 605 is formed. An aromatic amine-based material such as (α-NPD, TPAC, or MTDATA can be used for the hole transporting layer 605 of this embodiment. In this embodiment, the hole transporting layer 605 is formed from α-NPD to have a thickness of 30 to 60 nm.

Next, a light emitting layer 607 is formed. The light emitting layer 607 is formed from $Alq_3$ by evaporation. The thickness of the light emitting layer 607 here is 30 to 60 nm.

Next, an electron transporting layer 608 is formed. 1,3,4-oxadiazole derivatives, 1,2,4-triazole derivatives, or the like can be used here. Specifically, materials usable as the electron transporting layer include PBD, BND, OXD-7, and TAZ. The thickness of the electron transporting layer 608 is 30 to 60 nm.

A mixed layer (2) 610 is formed next. The mixed layer (2) 610 is formed from TAZ used to form the electron transporting layer 608 and the material used to form an electron injection layer 609 by coevaporation. The thickness of the mixed layer (2) 610 is preferably 1 to 10 nm.

The electron injecting layer 609 is formed on the mixed layer (2) 610. $Alq_3$, $Alpq_3$, or the like can be used here. In this embodiment, the electron injection layer 609 is 30 to 60 run in thickness.

After all of the above films are formed, a cathode of the organic light emitting element is formed by evaporation. In this embodiment, MgAg is used for a conductive film that constitutes the cathode of the organic light emitting element. However, a Al film or Yb film can be used as well as a Al—Li alloy film (an alloy film of aluminum and lithium) or a film obtained by coevaporation of aluminum and an element belonging to Group 1 or 2 in the periodic table.

Embodiment 4

Described next is an example of a method of manufacturing, at the same time on the same substrate, TFTs for a pixel portion having an organic light emitting element of the present invention and TFTs (an n-channel TFT and a p-channel TFT) for a driving circuit that is provided in the periphery of the pixel portion. The description will be given with reference to FIGS. 7A to 9C.

First, this embodiment uses a substrate 900 made of barium borosilicate glass, typically Corning #7059 glass and #1737 glass (products of Corning Incorporated), or alumino borosilicate glass. No limitation is put to the material of the substrate 900 as long as it is light-transmissive, and a quartz substrate may be used. A plastic substrate may also be used if it can withstand heat at the process temperature of this embodiment.

Next, as shown in FIG. 7A, a base film 901 is formed on the substrate 900 from an insulating film such as a silicon oxide film, a silicon nitride film, and a silicon oxynitride film. In this embodiment, the base film 901 has a two-layer structure but it may be a single layer or a laminate of the above insulating films. The first layer of the base film 901 is a silicon oxynitride film 901a formed by plasma CVD using as reaction gas $SiH_4$, $NH_3$ and $N_2O$ to have a thickness of 10 to 200 nm (preferably 50 to 100 nm). In this embodiment, the silicon oxynitride film 901a (composition ratio: Si=32%, O=27%, N=24%, H=17%) is 50 nm in thickness. The second layer of the base film 901 is a silicon oxynitride film 901b formed by plasma CVD using as reaction gas $SiH_4$ and $N_2O$ to have a thickness of 50 to 200 nm (preferably 100 to 150 nm). In this embodiment, the silicon oxynitride film 901b (composition ratio: Si=32%, O=59%, N=7%, H=2%) is 100 nm in thickness.

On the base film 901, semiconductor layers 902 to 905 are formed. The semiconductor layers 902 to 905 are formed by patterning into a desired shape a crystalline semiconductor film that is obtained by forming a semiconductor film with an amorphous structure through a known method (sputtering, LPCVD, or plasma CVD) and then by subjecting the amorphous film to a known crystallization treatment (laser crystallization, thermal crystallization, or thermal crystallization using nickel or other catalyst). The semiconductor layers 902 to 905 are each 25 to 80 nm in thickness (preferably 30 to 60 nm). Although the material of the crystalline semiconductor film is not limited, silicon, silicon germanium ($Si_x Ge_{1-x}$ (X=0.0001 to 0.02)) alloy or the like is preferred. In this embodiment, an amorphous silicon film with a thickness of 55 nm is formed by plasma CVD and then a solution containing nickel is held to the top face of the amorphous silicon film. The amorphous silicon film is dehydrated (at 500° C. for an hour), then subjected to thermal crystallization (at 550° C. for four hours), and then subjected to laser annealing treatment for improving crystallinity, thereby obtaining the crystalline silicon film. The crystalline silicon film receives patterning treatment by photolithography to form the semiconductor layers 902 to 905.

After the semiconductor layers 902 to 905 are formed, the semiconductor layers 902 to 905 may be doped with a minute amount of impurity element (boron or phosphorus) in order to control the threshold of the TFTs.

If laser crystallization is used to form the crystalline semiconductor film, a pulse oscillation type or continuous wave type excimer layer, YAG laser, or $YVO_4$ laser may be used. When using these lasers, it is appropriate to use an optical system to collect laser light emitted from the laser oscillator into a linear beam before irradiating the semiconductor film. Although conditions of crystallization can be chosen suitably by an operator, preferred conditions are as follows. When an excimer laser is used, the pulse oscillation frequency is set to 300 Hz and the laser energy density is set to 100 to 400 $mJ/cm^2$ (typically, 200 to 300 $mJ/cm^2$). When a YAG laser is employed, the second harmonic thereof is used, the pulse oscillation frequency is set to 30 to 300 Hz, and the laser energy density is set to 300 to 600 $mJ/cm^2$ (typically, 350 to 500 $mJ/cm^2$). The laser light collected into a linear shape is 100 to 1000 μm in width, 400 μm, for example, and the entire surface of the substrate is irradiated with the beam. The overlapping ratio of the linear laser light during irradiation is set to 50 to 90%.

Next, a gate insulating film 906 is formed to cover the semiconductor layers 902 to 905. The gate insulating film 906 is an insulating film containing silicon and formed by plasma CVD or sputtering to have a thickness of 40 to 150 nm. In this embodiment, a silicon oxynitride film (composition ratio: Si=32%, O=59%, N=7%, H=2%) with a thickness of 110 nm is formed by plasma CVD. The gate insulating film is not limited to the silicon oxynitride film, of course, and may be a single layer or a laminate of other insulating films containing silicon.

When a silicon oxide film is used, plasma CVD is employed in which electric discharge is made using a mixture of TEOS (tetraethyl orthosilicate) and $O_2$ and setting the reaction pressure to 40 Pa, the substrate temperature to 300 to 400° C., and the high frequency (13.56 MHZ) power density to 0.5 to 0.8 $W/cm^{-2}$. The thus formed silicon oxide film can provide excellent characteristics as a gate insulating film if it receives subsequent thermal annealing at 400 to 500° C.

On the gate insulating film 906, a heat resistant conductive layer 907 for forming gate electrodes is formed to have a thickness of 200 to 400 nm (preferably 250 to 350 nm). The heat resistant conductive film 907 may be a single layer or may take a laminate structure having a plurality of layers, such as a two-layer structure or a three-layer structure, if necessary. The heat resistant conductive layer contains an element selected from the group consisting of Ta, Ti, and W, or an alloy having the above elements as its ingredient, or an alloy film having the above elements in combination. The heat resistant conductive layer is formed by sputtering or CVD. In order to lower the resistance, the concentration of impurities contained in the layer is preferably reduced. The oxygen concentration in particular, is preferably 30 ppm or less. In this embodiment, a W film with a thickness of 300 nm is formed. The W film may be formed by sputtering with W as the target, or by thermal CVD using tungsten hexafluoride ($WF_6$). Either way, the W film has to be low in resistance to use it as gate electrodes, and the resistivity of the W film is preferably set to 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film during formation. As a result, the W film can have a resistivity of 9 to 20 μΩcm.

The heat resistant conductive layer 907 may instead be a Ta film, which similarly can be formed by sputtering. Ar is used as sputtering gas when forming a Ta film. If an appropriate amount of Xe or Kr is added to the sputtering gas, the internal stress of the film to be formed is eased and thus the film is prevented from peeling off. The resistivity of a Ta film in α phase is about 20 μΩcm and is usable for a gate electrode. On the other hand, the resistivity of a Ta film in β phase is about 180 μΩcm and is not suitable for a gate electrode. A Ta film in α phase can readily be obtained by forming a TaN film as a base of a Ta film because a TaN film has a crystal structure approximate to that of the α phase Ta film. Although not shown in the drawings, it is effective to form a silicon film doped with phosphorus (P) to have a thickness of about 2 to 20 nm under the heat resistant conductive layer 907. This improves adhesion to the conductive film formed thereon and prevents oxidation of the conductive film and, at the same time, prevents alkaline metal elements contained in a minute amount in the heat resistant conductive layer 907 from diffusing into the first shape gate insulating film 906. In either case, the resistivity of the heat resistant conductive layer 907 is preferably set to 10 to 50 μΩcm.

Next, resist masks 908 are formed using the photolithography technique. Then first etching treatment is conducted. In this embodiment, an ICP etching device is employed, $CF_4$ and $Cl_2$ are mixed as etching gas, and an RF (13.56 MHZ) power of 3.2 W/cm² is given at a pressure of 1 Pa to generate plasma. The substrate side (sample stage) also receives an RF (13.56 MHZ) power of 224 mW/cm² so that a substantially negative self-bias voltage is applied. Under these conditions, the etching rate of the W film is about 100 nm/min. On the basis of this etching rate, the time necessary to etch the W film is estimated. The estimated time is extended by 20% and this is the etching time for the first etching treatment.

Through the first etching treatment, conductive layers 909 to 912 having a first taper shape are formed. The angle of the tapered portions of the conductive layers 909 to 912 is 15 to 30°. In order to etch the conductive films without leaving any residue, over-etching is employed in which the etching time is prolonged by about 10 to 20%. The selective ratio of the W film to the silicon oxynitride film (the gate insulating film 906) is 2 to 4 (typically 3), and therefore a region where the silicon oxynitride film is exposed is etched by about 20 to 50 nm by the over-etching treatment (FIG. 7B).

First doping treatment is conducted next to dope the semiconductor layers with an impurity element of one conductivity type. An impurity element giving the n type conductivity is used in this doping step. The masks 908 that have been used to form the first shape conductive layers are left as they are, and the semiconductor layers are doped with an impurity element giving the n type conductivity by ion doping in a self-aligning manner while using the first taper shape conductive layers 909 to 912 as masks. In the doping, the dose is set to $1\times10^{13}$ to $5\times10^{14}$ atoms/cm² and the acceleration voltage is set to 80 to 160 keV in order that the impurity element giving the n type conductivity reaches the semiconductor layers below the tapered portions at the edges of the gate electrodes and below the gate insulating film 906 through the tapered portions and the gate insulating film. Used as the impurity element that gives the n type conductivity is an element belonging to Group 15, typically, phosphorus (P) or arsenic (As). Here, phosphorus (P) is used. Through this ion doping, first impurity regions 914 to 917 are formed to contain the impurity element that gives the n type conductivity in a concentration of $1\times10^{20}$ to $1\times10^{21}$ atoms/cm³ (FIG. 7C).

In this step, depending on the doping condition, the impurity may reach under the first shape conductive layers 909 to 912 so that the first impurity regions 914 to 917 overlap the first shape conductive layers 909 to 912.

Next, second etching treatment is conducted as shown in FIG. 7D. The second etching treatment also uses the ICP etching device to etch at an RF power of 3.2 W/cm² (13.56 MHZ), a bias power of 45 mW/cm² (13.56 MHZ), and a pressure of 1.0 Pa, while using a mixture gas of $CF_4$ and $Cl_2$ as etching gas. Under these conditions, conductive layers 918 to 921 having a second shape are formed. The conductive layers 918 to 921 have tapered portions at the edges and the thickness of the layers is gradually increased from the edges toward the inside. The bias power applied to the substrate side in the second etching treatment is lower than in the first etching treatment and the ratio of isotropic etching is increased that much, thereby setting the angle of the tapered portions to 30 to 60°. The masks 908 are etched to lose the edges and become masks 922. In the step of FIG. 7D, the surface of the gate insulating film 906 is etched by about 40 nm.

Then the semiconductor layers are doped with an impurity element that gives the n type conductivity in a dose smaller than in the first doping treatment and at a high acceleration voltage. For example, the acceleration voltage is set to 70 to 120 keV and the dose is set to $1\times10^{13}$ atoms/cm² to form first impurity regions 924 to 927 with increased impurity concentration and second impurity regions 928 to 931 that are in contact with the first impurity regions 924 to 927. In this step, depending on the doping condition, the impurity may reach under the second shape conductive layers 918 to 921 so that the second impurity regions 928 to 931 overlap the second shape conductive layers 918 to 921. The impurity concentration in the second impurity regions is set to $1\times10^{16}$ to $1\times10^{18}$ atoms/cm³ (FIG. 8A).

Then as shown in FIG. 8B, impurity regions 933 (933a and 933b) and 934 (934a and 934b) having the conductivity type reverse to the one conductivity type are respectively formed in the semiconductor layers 902 and 905 that are to form p-channel TFTs. In this case also, the semiconductor layers are doped with an impurity element that gives the p type conductivity while using as masks the second shape conductive layers 918 and 921 to form the impurity regions in a self-aligning manner. During this doping, the semiconductor layers 903 and 904 that are to form n-channel TFTs are completely covered with resist masks 932. The impurity regions 933 and 934 here are formed by ion doping using diborane ($B_2H_6$). The concentration of the impurity element that gives the p type conductivity in the impurity regions 933 and 934 is set to $2\times10^{20}$ to $2\times10^{21}$ atoms/cm$^3$.

When looked at more closely, the impurity regions 933 and 934 can be divided into two regions containing an impurity element that gives the n type conductivity. Third impurity regions 933a and 934a contain the impurity element that gives the n type conductivity in a concentration of $1\times10^{20}$ to $1\times10^{21}$ atoms/cm$^3$. Fourth impurity regions 933b and 934b contain the impurity element that gives the n type conductivity in a concentration of $1\times10^{17}$ to $1\times10^{20}$ atoms/cm$^3$. However, the third impurity regions have no problem in functioning as source regions and drain regions of p-channel TFTs if the concentration of the impurity element giving the p type conductivity in the impurity regions 933b and 934b is set to $1\times10^{19}$ atoms/cm$^3$ or higher, and if the third impurity regions 933a and 934a contain the impurity element giving the p type conductivity in a concentration 1.5 to 3 times higher than the concentration of the impurity element that gives the n type conductivity.

Thereafter, as shown in FIG. 8C, a first interlayer insulating film 937 is formed on the second shape conductive layers 918 to 921 and the gate insulating film 906. The first interlayer insulating film 937 may be a silicon oxide film, a silicon oxynitride film, a silicon nitride film, or a laminate having these films in combination. In either case, the first interlayer insulating film 937 is formed from an inorganic insulating material. The thickness of the first interlayer insulating film 937 is 100 to 200 nm. When a silicon oxide film is used for the first interlayer insulating film 937, plasma CVD is employed in which electric discharge is made using a mixture of TEOS and $O_2$ and setting the reaction pressure to 40 Pa, the substrate temperature to 300 to 400° C., and the high frequency (13.56 MHZ) power density to 0.5 to 0.8 W/cm$^2$. When a silicon oxynitride film is used for the first interlayer insulating film 937, one formed by plasma CVD from $SiH_4$, $N_2O$, and $NH_3$, or one formed by plasma CVD from $SiH_4$ and $N_2O$ is chosen. Film formation conditions in this case include setting the reaction pressure to 20 to 200 Pa, the substrate temperature to 300 to 400° C., and the high frequency (60 MHZ) power density to 0.1 to 1.0 W/cm$^2$. A silicon oxynitride hydrate film formed from $SiH_4$, $N_2O$, and H, may also be used as the first interlayer insulating film 937. Similarly, a silicon nitride film can be formed by plasma CVD from $SiH_4$ and NH, as the first interlayer insulating film.

Then the impurity elements used in doping to give the n type and p type conductivities in the respective concentrations are activated. The activation step is carried out by thermal annealing using an annealing furnace. Other activation methods adoptable include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 550° C. for four hours. However, if a plastic substrate weak against heat is used for the substrate 900, laser annealing is preferred.

Following the activation step, the atmosphere gas is changed to one containing 3 to 100% hydrogen and heat treatment is conducted at 300 to 450° C. for one to twelve hours to thereby hydrogenate the semiconductor layers. The hydrogenation step is to terminate dangling bonds contained in the semiconductor layers in $10^{16}$ to $10^{18}$ atoms/cm$^3$, using thermally excited hydrogen. Alternatively, plasma hydrogenation (using hydrogen that is excited by plasma) may be employed. In either case, the defect density in the semiconductor layers 902 to 905 is reduced desirably to $10^{16}$ atoms/cm$^3$ or lower and, to reduce the density to this level, about 0.01 to 0.1 atomic % hydrogen is given.

A second interlayer insulating film 939 is formed next from an organic insulating material to have an average thickness of 1.0 to 2.0 μm. Organic resin materials such as polyimide, acrylic, polyamide, polyimideamide, and BCB (benzocyclobutene) can be used. If polyimide of the type that is thermally polymerized after being applied to a substrate is used, for example, the film is formed by burning the substrate in a clean oven at 300° C. If an acrylic is used, two-pack type is chosen. After the main component is mixed with the curing agent, the resin is applied to the entire surface of the substrate using a spinner, and then the substrate is pre-heated on a hot plate at 80'C for 60 seconds to be burnt in a clean oven at 250° C. for 60 minutes, thereby forming the insulating film.

When the second interlayer insulating film 939 is thus formed from an organic insulating material, the surface can be leveled satisfactorily. Also, the parasitic capacitance can be reduced since organic resin materials has low dielectric constant in general. However, organic resin materials are hygroscopic and it is therefore preferable to combine the organic resin film with the silicon oxide film, or the silicon oxynitride film, or the silicon nitride film, formed as the first interlayer insulating film 937 as in this embodiment.

Thereafter, a resist mask having a given pattern is formed and contact holes are formed to reach impurity regions that serve as source regions or drain regions in the respective semiconductor layers. The contact holes are formed by dry etching. In this case, a mixture gas of $CF_4$, $O_2$, and He is used as etching gas to etch the second interlayer insulating film 939 formed of an organic resin material first. Then the etching gas is changed to $CF_4$ and $O_2$ to etch the first interlayer insulating film 937. The etching gas is further switched to $CHF_3$ in order to raise the selective ratio with respect to the semiconductor layers, and the gate insulating film 906 is etched to form the contact holes.

Then a wiring layer 940 that is a conductive metal film is formed by sputtering or vacuum evaporation. On the wiring layer 940, a separation layer 941 is formed from a material that increases the selective ratio with respect to the wiring layer and the etchant during etching. The separation layer 941 may be formed of an inorganic material such as a nitride film and an oxide film, or from an organic resin such as polyimide, polyamide, and BCB (benzocyclobutene). A metal material may also be used.

The separation layer 941 is patterned using a mask and then etched to form source wiring lines 942 to 945, drain wiring lines 946 to 948, and separation portions 942b to 948b. In this specification, a structure composed of a separation layer and a wiring line is called a partition wall. Though not shown in the drawings, the wiring lines in this embodiment are a laminate consisting of a Ti film with a thickness of 50 nm and an alloy film (alloy film of Al and Ti) with a thickness of 500 nm.

Next, a transparent conductive film with a thickness of 80 to 120 nm is formed thereon and patterned to form a pixel electrode 949 (FIG. 9B). In this embodiment, an indium tin oxide (ITO) film or a transparent conductive film obtained by mixing 2 to 20% of zinc oxide (ZnO) with indium oxide is used for the transparent electrode.

The pixel electrode 949 overlaps and is in contact with a contact wiring line 923 that is electrically connected to the drain wiring line 946a. Thus formed is an electric connection between the pixel electrode 949 and a drain region of a current controlling TFT 963.

An organic compound layer 950, a cathode 951, and a passivation film 952 will be formed next by evaporation as shown in FIG. 9B. Before forming the organic compound layer 950, heat treatment is preferably performed on the pixel electrode 947 to remove moisture completely. The cathode of the organic light emitting element is a MgAg electrode in this embodiment. However, other known materials may be used for the cathode.

The organic compound layer 950 has, in addition to a light emitting layer, a plurality of layers such as a hole injection layer, a hole transporting layer, an electron transporting layer, an electron injection layer, and a buffer layer in combination. Detailed descriptions will be given below on the structure of the organic compound layer employed in this embodiment.

In this embodiment, copper phthalocyanine is used for a hole injection layer whereas á-NPD is used for a hole transporting layer and the layers are respectively formed by evaporation. A mixed layer is formed from copper phthalocyanine and á-NPD by coevaporation at the interface between the hole injection layer and the hole transporting layer. It is desirable for the mixed layer formed here to have concentration gradient.

A light emitting layer is formed next. In this embodiment, the light emitting layer is formed from different materials to form organic compound layers that emit light of different colors. The organic compound layers formed in this embodiment respectively emit red light, green light, and blue light.

A light emitting layer that emits red light is formed from $Alq_3$ doped with DCM. Instead, N,N'-disalicylidene-1,6-hexanediaminato) zinc (■) (Zn(salhn)) doped with (1,10-phenanthroline)-tris(1,3-diphenyl-propane-1,3-dionato) europium (■) $(Eu(DBM)_3(Phen))$ that is an Eu complex may be used. Other known materials may also be used.

A light emitting layer, that emits green light can be formed from CBP and Ir(ppy), by coevaporation. It is preferable to form a hole blocking layer from BCP in this case. An aluminum quinolilate complex ($Alq_3$) and a benzoquinolinolate beryllium (BeBq) may be used instead. The layer may be formed from a quinolilate aluminum complex ($Alq_3$) using as dopant Coumarin 6, quinacridon, or the like. Other known materials may also be used.

A light emitting layer that emits blue light can be formed from DPVBi that is a distylyl derivative, N,N'-disalicyliden-1,6-hexanediaminato) zinc (■) (Zn(salhn)) that is a zinc complex having an azomethine compound as its ligand, or 4,4'-bis(2,2-diphenyl-vinyl)-biphenyl (DPVBi) doped with perylene. Other known materials may also be used.

In this embodiment, a mixed layer is formed at the interface between the hole transporting layer and the light emitting layer by coevaporation of á-NPD that is the material of the previously formed hole transporting layer and the above materials of the light emitting layer. It is desirable for the mixed layer formed here to have concentration gradient.

After the mixed layer is formed, an electron transporting layer is formed. 1,3,4-oxadiazole derivatives, 1,2,4-triazole derivatives (e.g., TAZ), or the like can be used for the electron transporting layer. In this embodiment, a 1,2,4-triazole derivative (TAZ) is formed by evaporation to have a thickness of 30 to 60 nm.

Another mixed layer is formed at the interface between the light emitting layer and the electron transporting layer by coevaporation from the above materials of the light emitting layer and the 1,2,4-triazole derivative (TAZ). It is desirable for the mixed layer formed here to have concentration gradient.

Through the above steps, the organic compound layer having a laminate structure with mixed layers placed at the interfaces is completed. In this embodiment, the organic compound layer 950 is 10 to 400 nm (typically 60 to 150 nm) in thickness (including the laminate organic compound layers and the mixed layers), and the cathode 951 is 80 to 200 nm (typically 100 to 150 nm) in thickness.

After the organic compound layer is formed, the cathode of the organic light emitting element is formed by evaporation. In this embodiment, MgAg is used for a conductive film that constitutes the cathode of the organic light emitting element. However, a Al:Li alloy film (an alloy film of aluminum and lithium) and a film obtained by coevaporation of aluminum and an element belonging to Group 1 or 2 in the periodic table may also be used.

After the cathode 951 is formed, the passivation film 952 is formed. By providing the passivation film 952, the organic compound layer 950 and the cathode 951 can be protected from moisture and oxygen. In this embodiment, a silicon nitride film with a thickness of 300 nm is formed as the passivation film 952. The passivation film 952 may be formed continuously after the formation of the cathode 951 without exposing the substrate to the air.

Thus completed is a light emitting device having the structure shown in FIG. 9C. A portion 954 where the pixel electrode 949, the organic compound layer 950, and the cathode 951 overlap corresponds to the organic light emitting element.

A p-channel TFT 960 and an n-channel TFT 961 are TFTs of the driving circuit, and constitute a CMOS. A switching TFT 962 and a current controlling TFT 963 are TFTs of the pixel portion. The TFTs of the driving circuit and the TFTs of the pixel portion can be formed on the same substrate.

In the case of a light emitting device using an organic light emitting element, its driving circuit can be operated by a power supply having a voltage of 5 to 6V, 10 V, at most. Therefore, degradation of TFTs due to hot electron is not a serious problem. Also, smaller gate capacitance is preferred for the TFTs since the driving circuit needs to operate at high speed. Accordingly, in a driving circuit of a light emitting device using an organic light emitting element as in this embodiment, the second impurity region 929 and the fourth impurity region 933b of the semiconductor layers of the TFTs preferably do not overlap the gate electrode 918 and the gate electrode 919, respectively.

A light emitting panel with an organic light emitting element formed on a substrate is thus formed as shown in FIG. 9C.

After the light emitting panel is formed, the panel is sealed and electrically connected to an external power supply through an FPC, thereby completing the light emitting device of the present invention.

The structure in this embodiment can be combined with any of the element structures in Embodiments 1 through 3.

Embodiment 5

This embodiment describes in detail a method of completing the light emitting panel which has finished fabrication up through the step of FIG. 9C in Embodiment 4 as the light emitting device. The description will be given with reference to FIGS. 10A and 10B.

Figure 10A:
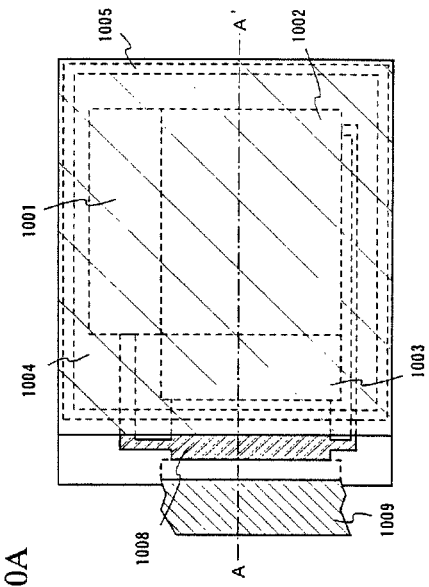
FIGS. 10A and 10B are diagrams illustrating a sealing structure of a light emitting device.
Figure 10B:
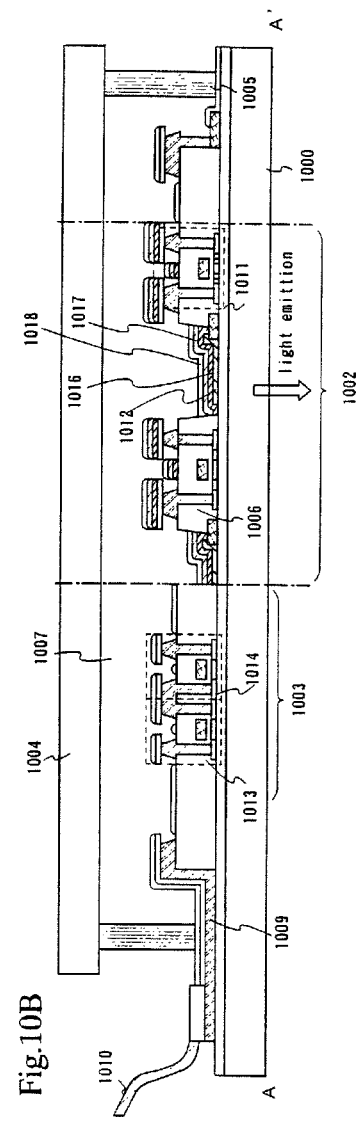

FIG. 10A is a top view showing the organic light emitting element that has been finished up through sealing. FIG. 10B is a sectional view taken along the line A-A' of FIG. 10A. Surrounded by dotted lines and denoted by 1001, 1002, and 1003 are a source side driving circuit, a pixel portion, and a gate side driving circuit, respectively. 1004 denotes a cover member and 1005 denotes a seal member. A space 1007 is provided inside the seal member 1005.

1008 is a wiring line for sending signals that are inputted to the source side driving circuit 1001 and the gate side driving circuit 1003. The wiring line 1008 receives video signals and clock signals from an FPC (flexible printed circuit) 1010 that serves as an external input terminal. Although the FPC alone is shown here, a printed wiring board (PWB) may be attached to the FPC. In this specification, the term light emitting device include not only a light emitting module with FPC or PWB attached to a light emitting panel but also a light emitting module mounted with IC.

Next, the sectional structure will be described with reference to FIG. 10B. Above a substrate 1000, the pixel portion 1002 and the gate side driving circuit 1003 are formed. The pixel portion 1002 is composed of a plurality of pixels each including a current controlling TFT 1011 and a transparent electrode 1012 that is electrically connected to a drain of the TFT. The gate side driving circuit 1003 is constructed using a CMOS circuit (see FIG. 9C) in which an n-channel TFT 1013 and a p-channel TFT 1014 are combined.

The transparent electrode 1012 functions as the anode of the organic light emitting element. An interlayer insulating film 1006 is formed on each side of the transparent electrode 1012. On the transparent electrode 1012, an organic compound layer 1016 and a cathode 1017 of the organic light emitting element are formed.

The cathode 1017 functions also as a wiring line common to the plural pixels, and is electrically connected to the FPC 1010 through a connection wiring line 1009. All elements that are included in the pixel portion 1002 and the gate side driving circuit 1003 are covered with a passivation film 1018.

The cover member 1004 is bonded by the seal member 1005. A spacer formed of a resin film may be provided in order to secure the distance between the cover member 1004 and the organic light emitting element. An airtight space is provided inside the seal member 1005 and filled with inert gas such as nitrogen and argon. It is also effective to place an absorbent, typically, barium oxide, in this airtight space.

The cover member may be glass, ceramics, plastics, or metals. However, the material of the cover member has to be light-transmissive when light is emitted toward the cover member side. Plastics usable as the cover member include FRP (fiberglass-reinforced plastics), PVF (polyvinyl fluoride), Mylar, polyester, and acrylic.

By sealing the light emitting panel with the cover member and the seal member in the manner described above, the organic light emitting element is completely shut off to the outside and external substances that accelerates degradation of the organic compound layer by oxidation, such as moisture and oxygen, are prevented from entering the element. Accordingly, a light emitting device of high reliability can be obtained.

The structure in this embodiment can be embodied by freely combining with any of the structures in Embodiments 1 through 4.

Embodiment 6

Figure 17:
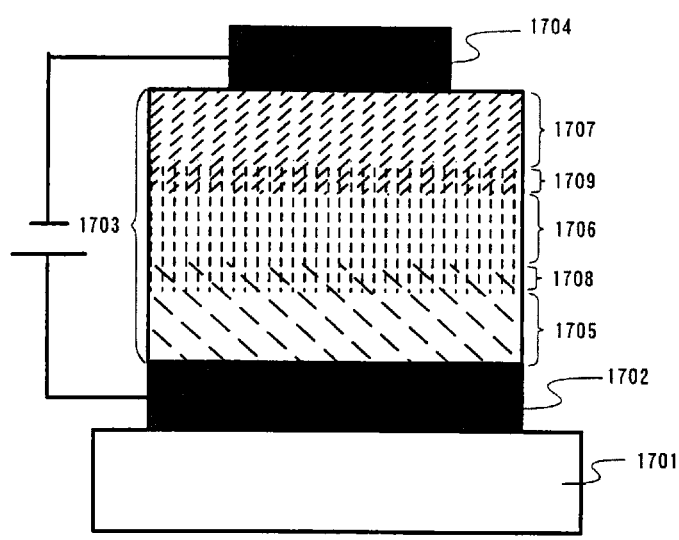
FIG. 17 is a diagram showing the structure of an organic light emitting element.
Figure 18:
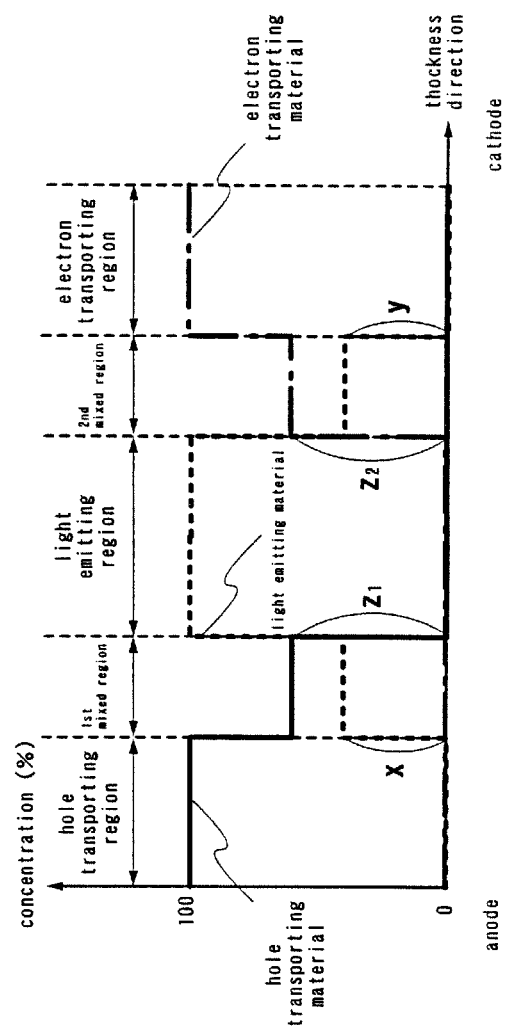
FIG. 18 is a diagram showing the concentration profile.
Figure 19:
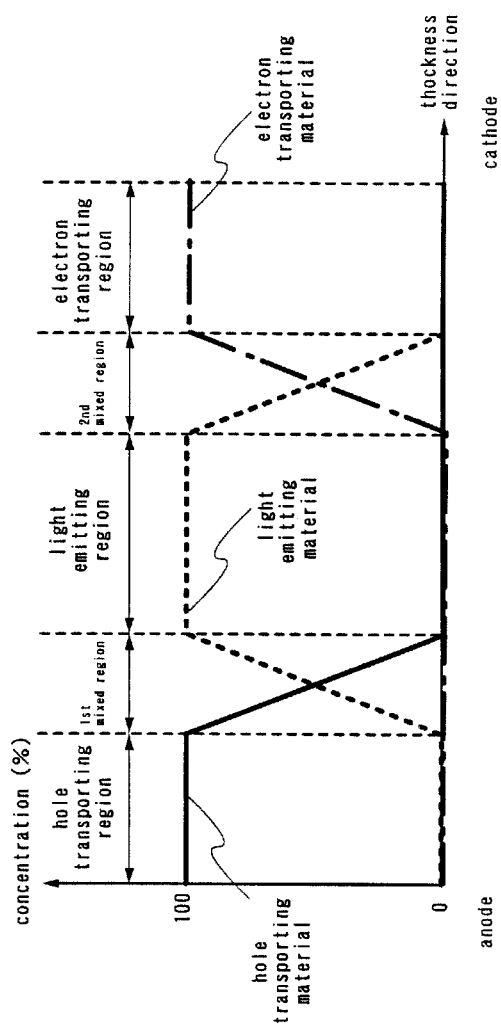
FIG. 19 is a diagram showing the concentration profile.
Figure 20:
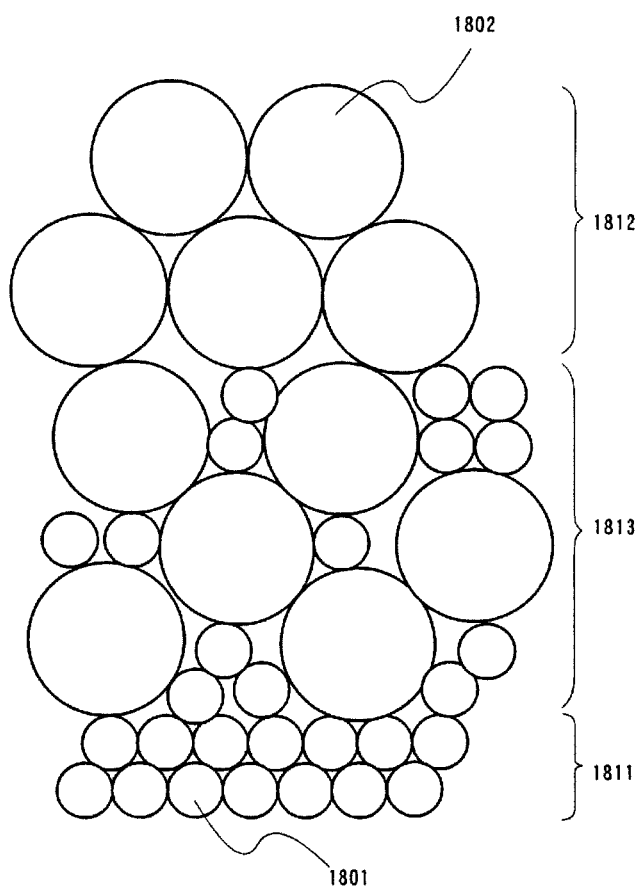
FIG. 20 is a diagram showing a state of a mixed region.

This embodiment shows a specific example in which the first mixed region 1708 and the second mixed region 1709 of the organic light emitting element shown in FIG. 17 have concentration gradient.

First, ITO is formed to have a thickness of about 100 nm by sputtering to form the anode 1702 on the glass substrate 1701. The glass substrate 1701 having the anode 1702 is brought into a vacuum tank as the one shown in FIGS. 23A and 23B.

In this embodiment, four evaporation sources are necessary in order to deposit by evaporation four kinds of materials (three kinds of organic compounds and a metal for forming a cathode).

First, the hole transporting region 1705 consisting solely of Spiro dimer of TAD (hereinafter referred to as S-TAD) is formed to have a thickness of 30 nm at an evaporation rate of 3 Å/s. Thereafter, evaporation of spiro dimer of DPVBi (hereinafter referred to as S-DPVBi) that is a light emitting material is started and the evaporation rate thereof is gradually increased.

The evaporation rate of S-TAD is gradually reduced immediately after evaporation of S-DPVBi is started, whereby the first mixed region 1708 having concentration gradient is formed. The first mixed region 1708 is to have a thickness of 10 nm. The rate of change in evaporation rate of S-TAD and S-DPVBi is adjusted such that evaporation of S-TAD is ended and evaporation of S-DPVBi reaches a rate of 3 Å/s as the formation of the first mixed region is completed.

After the light emitting region 1706 composed of S-DPVBi is formed to have a thickness of 20 nm, evaporation of Alq that is an electron transporting material is started and the evaporation rate thereof is gradually increased. The evaporation rate of S-DPVBi is gradually reduced immediately after evaporation of Alq is started, whereby the second mixed region 1709 having concentration gradient is formed. The second mixed region 1709 is to have a thickness of 10 nm. The rate of change in evaporation rate of S-DPVBi and Alq is adjusted such that evaporation of S-DPVBi is ended and evaporation of Alq reaches a rate of 3 Å/s as the formation of the second mixed region is completed.

Then evaporation of Alq alone is continued in order to form the electron transporting region 1707. The region is 30 nm in thickness. Lastly, a Al:Li alloy is deposited by evaporation to have a thickness of about 150 nm as the cathode. Thus completed is an organic light emitting element for emitting light of blue color, which is originated from S-DPVBi.

Embodiment 7

Figure 21A:
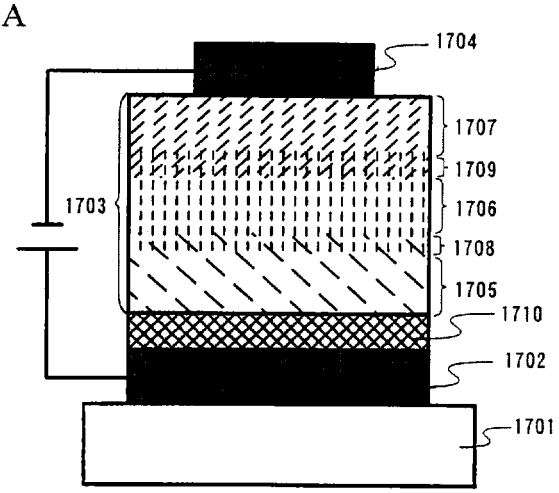
FIGS. 21A and 21B are diagrams showing the structure of an organic light emitting element.
Figure 21B:
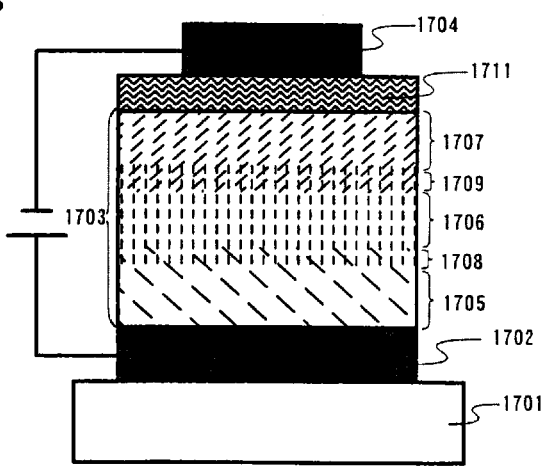

This embodiment shows a specific example of the organic light emitting element illustrated in FIG. 21B.

First, ITO is formed to have a thickness of about 100 nm by sputtering to form the anode 1702 on the glass substrate 1701. The glass substrate 1701 having the anode 1702 is brought into a vacuum tank as the one shown in FIGS. 23A and 23B. In this embodiment, five evaporation sources are necessary in order to deposit by evaporation five kinds of materials (three kinds of organic compounds and two kinds of metals).

First, the hole transporting region 1705 consisting solely of μ-NPD is formed to have a thickness of 30 nm at an evaporation rate of 3 Å/s. While keeping the evaporation rate of α-NPD to 3 Å/s, evaporation of Alq that is a light emitting material is started at an evaporation rate of 3 Å/s. In other words, the first mixed region 1708 containing α-NPD and Alq at a ratio of 1:1 is formed by coevaporation. The first mixed region is 10 nm in thickness.

As the first mixed region 1708 is completed, evaporation of α-NPD is ended but evaporation of Alq is continued to form the light emitting region 1706. The light emitting region is 20 nm in thickness. Further continuing evaporation of Alq, evaporation of BPhen that is an electron transporting material is started at an evaporation rate of 3 Å/s. In other words, the second mixed region 1709 containing Alq and Bphen at a ratio of 1:1 is formed by coevaporation. The second mixed region is 10 nm in thickness.

As the second mixed region 1709 is completed, evaporation of Alq is ended but evaporation of BPhen is continued to form the electron transporting region 1707 with a thickness of 30 nm. Further continuing evaporation of BPhen, about 1 wt % of Li is added to form the electron injection region 1711. The electron injection region is 10 nm in thickness.

Lastly, an Al:Li alloy is deposited by evaporation to have a thickness of about 150 nm as the cathode. Thus completed is an organic light emitting element for emitting light of green color, which is originated from Alq.

Embodiment 8

Figure 22:
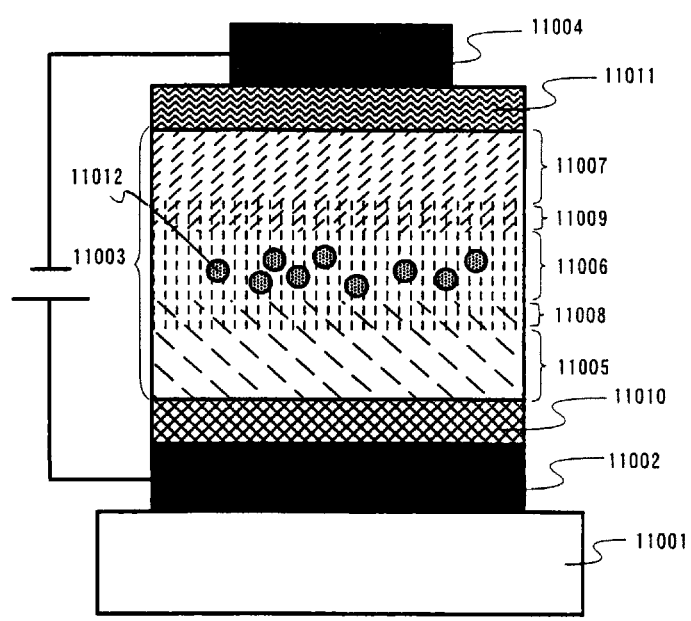
FIG. 22 is a diagram showing the structure of an organic light emitting element.

This embodiment shows a specific example of the organic light emitting element illustrated in FIG. 22.

First, ITO is formed to have a thickness of about 100 nm by sputtering to form the anode 11002 on the glass substrate 11001. The glass substrate 11001 having the anode 11002 is brought into a vacuum tank as the one shown in FIGS. 23A and 23B. In this embodiment, seven evaporation sources are necessary in order to deposit by evaporation seven kinds of materials (five kinds of organic compounds and two kinds of metals).

First, CuPC as a hole injection material is deposited by evaporation to have a thickness of 20 nm, thereby forming the hole injection region 11010. As the CuPC film reaches 20 nm to end evaporation of CuPC, without an interval, evaporation of α-NPD that is a hole transporting material is started at an evaporation rate of 3 Å/s. The reason for allowing no interval is, as described above, that formation of impurity layers has to be avoided.

After the hole transporting region 11005 consisting solely of α-NPD is formed to have a thickness of 20 nm, evaporation of Alq that is a host material in relation to a light emitting material is started at an evaporation rate of 3 Å/s while keeping the evaporation rate of α-NPD to 3 Å/s. In other words, the first mixed region 11008 containing α-NPD and Alq at a ratio of 1:1 is formed by coevaporation. The first mixed region is 10 nm in thickness.

As the first mixed region 11008 is completed, evaporation of α-NPD is ended but evaporation of Alq is continued to form the light emitting region 11006. The light emitting region is 20 nm in thickness. At this point, the light emitting region 11006 is doped with 1 wt % of DCM that is a fluorescent pigment as the light emitting material 11012.

As the light emitting region 11006 is completed, evaporation of DCM is ended but evaporation of Alq is further continued. At the same time, evaporation of BPhen that is an electron transporting material is started at an evaporation rate of 3 Å/s. In other words, the second mixed region 11009 containing Alq and Bphen at a ratio of 1:1 is formed by coevaporation. The second mixed region is 10 nm in thickness.

As the second mixed region 11009 is completed, evaporation of Alq is ended but evaporation of BPhen is continued to form the electron transporting region 11007 with a thickness of 30 nm. Further continuing evaporation of BPhen, about 1 wt % of Li is added to form the electron injection region 11011. The electron injection region is 10 nm in thickness.

Lastly, a Al:Li alloy is deposited by evaporation to have a thickness of about 150 nm as the cathode. Thus completed is an organic light emitting element for emitting light of red color, which is originated from DCM.

Embodiment 9

This embodiment shows a specific example in which a triplet light emission material is employed as the light emitting material 11012 of the organic light emitting element illustrated in FIG. 22.

First, ITO is deposited into a thickness of about 100 nm by sputtering to form an ITO electrode (anode) on the glass substrate. On the glass substrate, poly(3-hexyl)thiophen doped with iodine is formed into a film with a thickness of 20 nm by spin coating as the hole injecting region. Benzene is used as a solvent, and iodine is dissolved in the same solvent for the doping. After the film is formed, benzene used as a solvent is removed by heating.

The substrate having the ITO electrode thus coated with a conductive polymer material is brought into a vacuum tank as the one shown in FIGS. 23A and 23B. In this embodiment, six evaporation sources are necessary in order to deposit by evaporation six kinds of materials (five kinds of organic compounds and a metal for forming a cathode).

First, the hole transporting region consisting solely of α-NPD is formed at an evaporation rate of 3 Å/s to have a thickness of 40 nm. Thereafter, while keeping the evaporation rate of α-NPD to 3 Å/s, evaporation of BAlq that is a host material in relation to the light emitting material is started at an evaporation rate of 3 Å/s. In other words, the first mixed region 11008 containing α-NPD and BAlq at a ratio of 1:1 is formed by coevaporation. The first mixed region 11008 is 10 nm in thickness.

As the first mixed region 11008 is completed, evaporation of α-NPD is ended but evaporation of BAlq is continued to form the light emitting region 11006. The light emitting region is 20 nm in thickness. At this point, the light emitting region 11006 is doped with 5 wt % of Ir(ppy)$_3$ that is a triplet light emission material as the light emitting material 11012.

As the light emitting region 11006 is completed, evaporation of Ir(ppy)$_3$ is ended but evaporation of BAlq is further continued. At the same time, evaporation of Alq that is an electron transporting material is started at an evaporation rate of 3 Å/s. In other words, the second mixed region 1709 containing BAlq and Alq at a ratio of 1:1 is formed by coevaporation. The second mixed region 1709 is 10 nm in thickness.

As the second mixed region 11009 is completed, evaporation of BAlq is ended but evaporation of Alq is continued to form the electron transporting region with a thickness of 30 nm. Then, Li(acac) is deposited by evaporation to have a thickness of 2 nm as the electron injection region.

Lastly, Al is deposited by evaporation to have a thickness of about 150 nm as the cathode. Thus completed is a triplet light emitting element for emitting light of green color, which is originated from Ir(ppy)$_3$.

Embodiment 10

This embodiment describes a light emitting device that includes an organic light emitting element according to the present invention. FIGS. 24A and 24B are sectional views of an active matrix light emitting device that uses an organic light emitting element of the present invention.

A thin film transistor (hereinafter referred to as TFT) is used here as an active element, but the active element may be a MOS transistor. The TFT shown as an example is a top gate TFT (planar TFT, to be specific), but a bottom gate TFT (typically a reverse stagger TFT) may be used instead.

In FIG. 24A, 11201 denotes a substrate. The substrate used here can transmit visible light so that light is sent to the outside from the substrate side. Specifically, a glass substrate, a quartz substrate, a crystal glass substrate, or a plastic substrate (including a plastic film) can be used. The substrate 11201 refers to the substrate plus an insulating film formed on the surface of the substrate.

On the substrate 11201, a pixel portion 11211 and a driving circuit 11212 are provided. The pixel portion 11211 will be described first.

The pixel portion 11211 is a region for displaying an image. A plurality of pixels are placed on the substrate, and each pixel is provided with a TFT 11202 for controlling a current flowing in the organic light emitting element (hereinafter referred to as current controlling TFT), a pixel electrode (anode) 11203, an organic compound film 11204, and a cathode 11205. Although only the current controlling TFT is shown in FIG. 24A, each pixel has a TFT for controlling a voltage applied to a gate of the current controlling TFT (hereinafter referred to as switching TFT).

The current controlling TFT 11202 here is preferably a p-channel TFT. Though an n-channel TFT may be used instead, a p-channel TFT as the current controlling TFT is more successful in reducing current consumption if the current controlling TFT is connected to the anode of the organic light emitting element as shown in FIGS. 24A and 24B. Note that, the switching TFT may be formed by either an n-channel TFT or a p-channel TFT.

A drain of the current controlling TFT 11202 is electrically connected to the pixel electrode 11203. In this embodiment, a conductive material having a work function of 4.5 to 5.5 eV is used as the material of the pixel electrode 11203, and therefore the pixel electrode 11203 functions as the anode of the organic light emitting element. A light-transmissive material, typically, indium oxide, tin oxide, zinc oxide, or a compound of these (ITO, for example), is used for the pixel electrode 11203. On the pixel electrode 11203, the organic compound film 11204 is formed.

On the organic compound film 11204, the cathode 11205 is provided. The material of the cathode 11205 is desirably a conductive material having a work function of 2.5 to 3.5 eV. Typically, the cathode 11205 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 11203, the organic compound film 11204, and the cathode 11205 is covered with a protective film 11206. The protective film 11206 is provided to protect the organic light emitting element from oxygen and moisture. Materials usable for the protective film 11206 include silicon nitride, silicon oxynitride, aluminum oxide, tantalum oxide, and carbon (specifically, diamond-like carbon).

Next, the driving circuit 11212 will be described. The driving circuit 11212 is a region for controlling timing of signals (gate signals and data signals) to be sent to the pixel portion 11211, and is provided with a shift register, a buffer, and a latch, as well as an analog switch (transfer gate) or level shifter. In FIG. 24A, the basic unit of these circuits is a CMOS circuit composed of an n-channel TFT 11207 and a p-channel TFT 11208.

Known circuit structures can be applied to the shift register, the buffer, the latch, and the analog switch (transfer gate) or level shifter. Although the pixel portion 11211 and the driving circuit 11212 are provided on the same substrate in FIGS. 24A and 24B, IC or LSI may be electrically connected to the substrate instead of placing the driving circuit 11212 on the substrate.

The pixel electrode (anode) 11203 is electrically connected to the current controlling TFT 11202 in FIGS. 24A and 24B but the cathode may be connected to the current controlling TFT instead. In this case, the pixel electrode is formed from the material of the cathode 11205 whereas the cathode is formed from the material of the pixel electrode (anode) 11203. The current controlling TFT in this case is preferably an n-channel TFT.

The light emitting device shown in FIG. 24A is manufactured by a process in which formation of the pixel electrode 11203 precedes formation of a wiring line 11209. However, this process could roughen the surface of the pixel electrode 11203. The roughened surface of the pixel electrode 11203 may degrade characteristic of the organic light emitting element since it is a current-driven type element.

Then the pixel electrode 11203 is formed after forming the wiring line 11209 to obtain a light emitting device shown in FIG. 24B. In this case, injection of current from the pixel electrode 11203 can be improved compared to the structure of FIG. 24A.

In FIGS. 24A and 24B, a forward-tapered bank structure 11210 separates the pixels placed in the pixel portion 11211 from one another. If this bank structure is reverse-tapered, a contact between the bank structure and the pixel electrode can be avoided. An example thereof is shown in FIG. 25.

Figure 25:
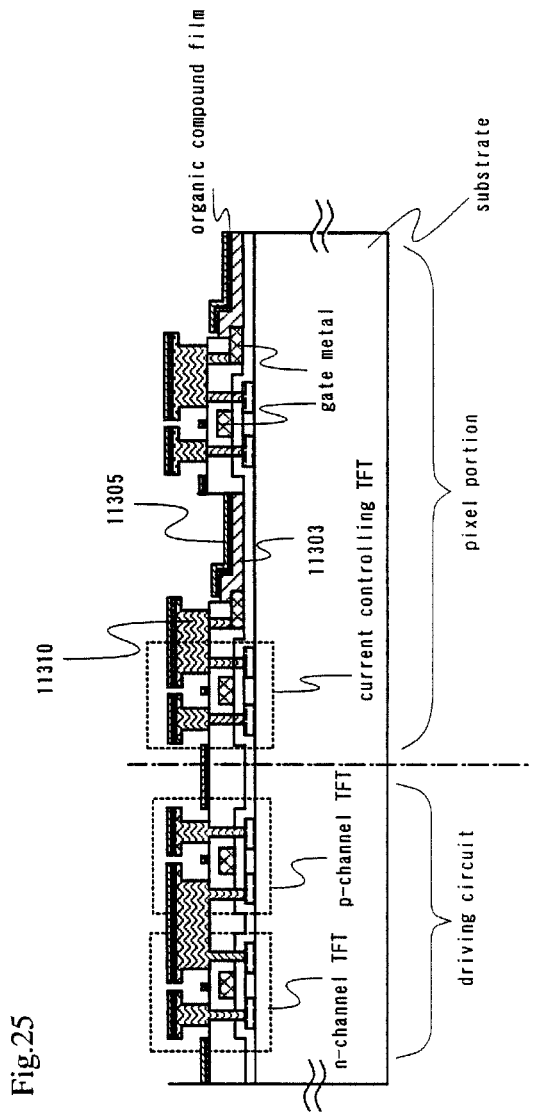
FIG. 25 is a diagram showing the sectional structure of a light emitting device.

In FIG. 25, a wiring line also serves as a separation portion, forming a wiring line and separation portion 11310. The shape of the wiring line and separation portion 11310 shown in FIG. 25 (namely, a structure with eaves) is obtained by layering a metal that constitutes the wiring line and a material lower in etch rate than the metal (a metal nitride, for example) and then etching the laminate. This shape can prevent short circuit between a cathode 11305 and a pixel electrode 11303 or the wiring line. Unlike a usual active matrix light emitting device, the cathode 11305 on the pixel is striped in the device of FIG. 25 (similar to a cathode in a passive matrix device).

FIG. 26A shows an example in which an electrode structure effective when a conductive polymer material is used for a hole injection region is introduced to an active matrix light emitting device. A sectional view thereof is shown in FIG. 26A. A top view of the electrode structure in each pixel is shown in FIG. 26B. According to the illustrated structure, an anode in each pixel 11413 is not formed over the entire surface but is striped and slits are formed between stripes of a striped electrode 11403.

When an organic compound film is directly formed on this structure, no light is emitted from the slit where the electrode is not present. However, the entire surface of the pixel emits light if a coat of conductive polymer 11414 is placed as shown in FIG. 26A. In other words, the conductive polymer 11414 forms a hole injection region and serves as an electrode at the same time.

A merit of the light emitting device as the one in FIGS. 26A and 26B is that it is not necessary to use a transparent material for the anode 11403. A sufficient amount of emitted light can be taken out if the aperture ratio of the slit is 80 to 90%. Moreover, the conductive polymer 11414 forms a flat surface and therefore uniform electric field is applied to the organic compound film to lower the risk of breakdown.

Figure 27A:
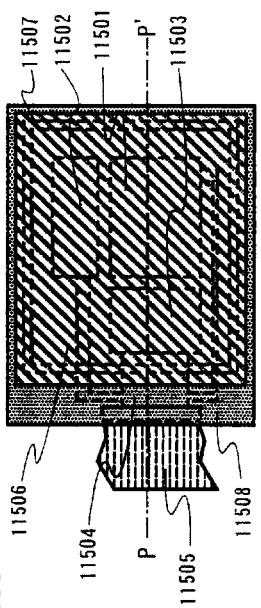
FIGS. 27A and 27B are diagrams respectively showing the top structure and the sectional structure of a light emitting device.
Figure 27B:
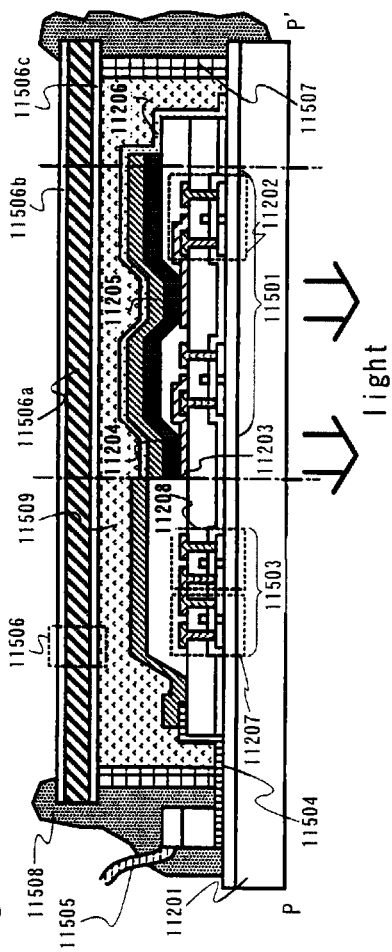

FIGS. 27A and 27B show the exterior of the active matrix light emitting device illustrated in FIG. 24B. FIG. 27A is a top view thereof and FIG. 27B is a sectional view taken along the line P-P' of FIG. 27A. The symbols in FIGS. 24A and 24B are used in FIGS. 27A and 27B.

In FIG. 27A, 11501 denotes a pixel portion, 11502 denotes a gate signal side driving circuit, and 11503 denotes a data signal side driving circuit. Signals to be sent to the gate signal side driving circuit 11502 and the data signal side driving circuit are inputted from a TAB (tape automated bonding) tape 11505 through an input wiring line 11504. Though not shown in the drawing, the TAB tape 11505 may be replaced by a TCP (tape carrier package) that is obtained by providing a TAB tape with an IC (integrated circuit).

Denoted by 11506 is the cover member that is provided in an upper part of the light emitting device shown in FIG. 24B, and is bonded with a seal member 11507 formed of a resin. The cover member 11506 may be any material as long as it does not transmit oxygen and water. In this embodiment, as shown in FIG. 27B, the cover member 11506 is composed of a plastic member 11506a and carbon films (specifically, diamond-like carbon films) 11506b and 11506c that are formed on the front and back of the plastic member 11506a, respectively.

As shown in FIG. 27B, the seal member 11507 is covered with a sealing member 11508 made of a resin so that the organic light emitting element is completely sealed in an airtight space 11509. The airtight space 11509 is filled with inert gas (typically, nitrogen gas or noble gas), a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 11

Figure 28:
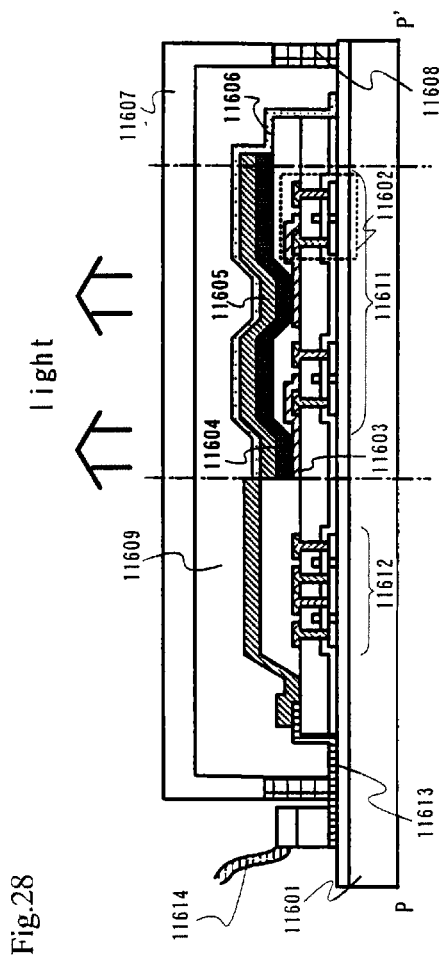
FIG. 28 is a diagram showing the top structure and the sectional structure of a light emitting device.

This embodiment shows an active matrix light emitting device as an example of a light emitting device that includes an organic light emitting element according to the present invention. Unlike Embodiment 5, in the light emitting device of this embodiment, light is taken out from the opposite side of a substrate on which an active element is formed (hereinafter referred to as upward emission). FIG. 28 is a sectional view thereof.

A thin film transistor (hereinafter referred to as TFT) is used here as the active element, but the active element may be a MOS transistor. The TFT shown as an example is a top gate 11.1 (planar TFT, to be specific), but a bottom gate TFT (typically a reverse stagger TFT) may be used instead.

A substrate 11601, a current controlling TFT 11602 that is formed in a pixel portion, and a driving circuit 11612 of this embodiment have the same structure as those of Embodiment 5.

A first electrode 11603, which is connected to a drain of the current controlling TFT 11602, is used as an anode in this embodiment, and therefore is formed preferably from a conductive material having a large work function. Typical examples of the conductive material include metals such as nickel, palladium, tungsten, gold, and silver. In this embodiment, the first electrode 11603 desirably does not transmit light. More desirably, the electrode is formed from a material that is highly reflective of light.

On the first electrode 11603, an organic compound film 11604 is formed. Provided on the organic compound film 11604 is a second electrode 11605, which serves as a cathode in this embodiment. Accordingly, the material of the second electrode 11605 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 11605. Therefore, when used for the second electrode, the metal is preferably formed into a very thin film about 20 nm in thickness.

A layer composed of the first electrode 11603, the organic compound film 11604, and the second electrode 11605 is covered with a protective film 11606. The protective film 11606 is provided to protect the organic light emitting element from oxygen and moisture. In this embodiment, any material can be used for the protective film as long as it transmits light.

The first electrode (anode) 11603 is electrically connected to the current controlling TFT 11602 in FIG. 28 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 11607 is a cover member and is bonded with a seal member 11608 formed of a resin. The cover member 11607 may be any material as long as it transmits light but not oxygen and water. In this embodiment, glass is used. An airtight space 11609 is filled with inert gas (typically, nitrogen gas or noble gas), a resin, or inert liquid (for example, liquid fluorocarbon typical example of which is perfluoro alkane). It is also effective to put an absorbent or deoxidant in the space.

Signals to be sent to the gate signal side driving circuit and the data signal side driving circuit are inputted from a TAB (tape automated bonding) tape 11614 through an input wiring line 11613. Though not shown in the drawing, the TAB tape 11614 may be replaced by a TCP (tape carrier package) that is obtained by providing a TAB tape with an IC (integrated circuit).

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 12

Figure 11:
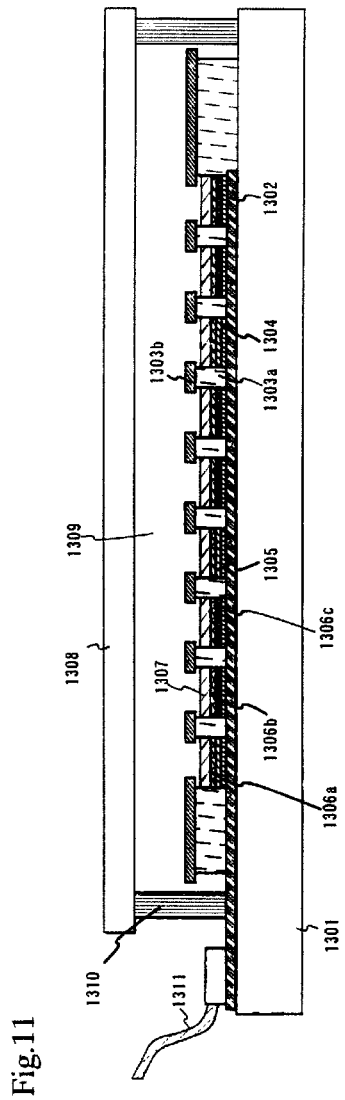
FIG. 11 is a sectional view illustrating a light emitting device.
Figure 13A:
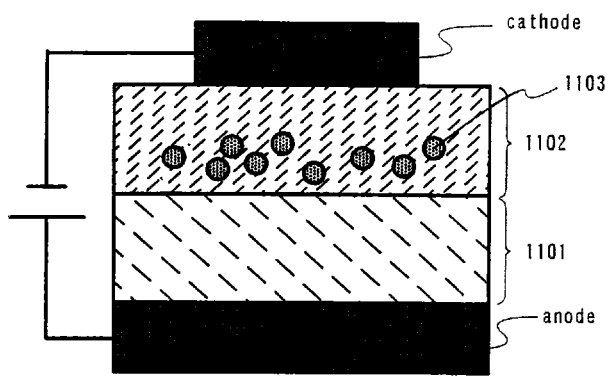
FIGS. 13A and 13B are diagrams showing a conventional organic light emitting element.
Figure 13B:
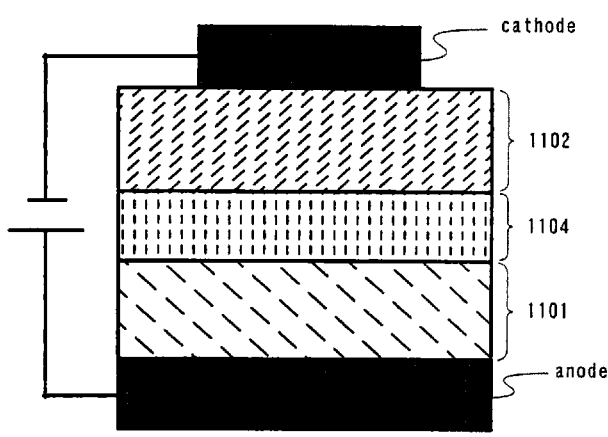
Figure 14:
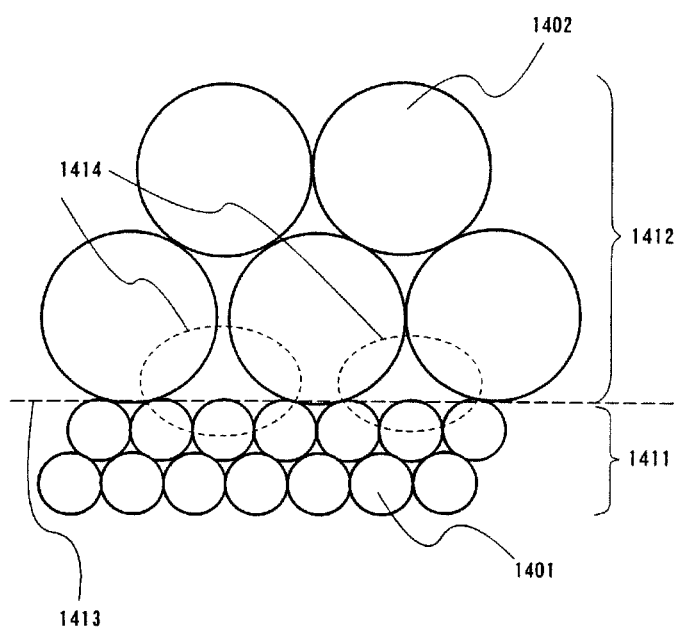
FIG. 14 is a diagram showing a state of an organic interface.
Figure 15:
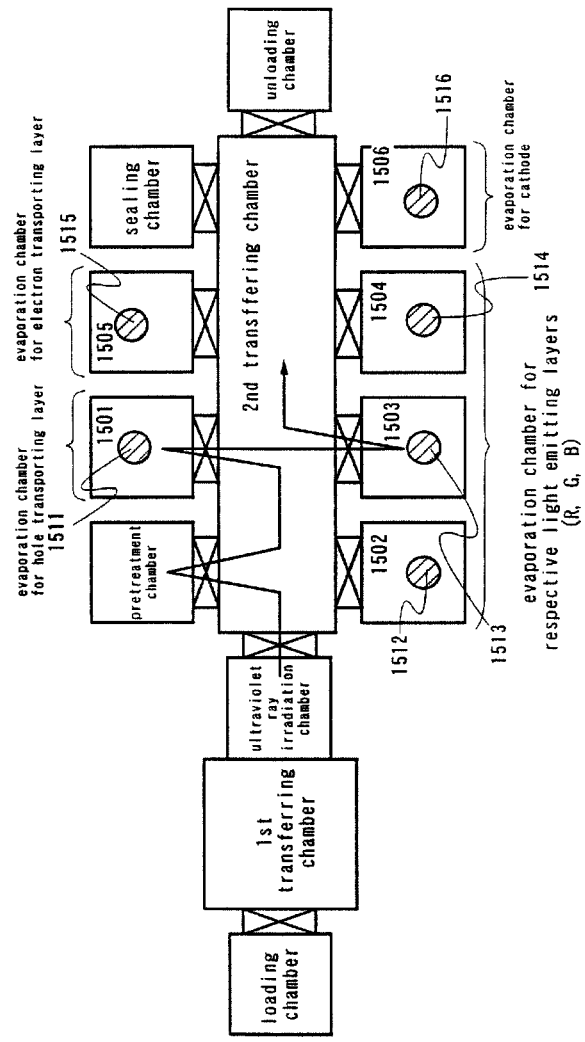
FIG. 15 is a diagram showing evaporation apparatus.
Figure 16:
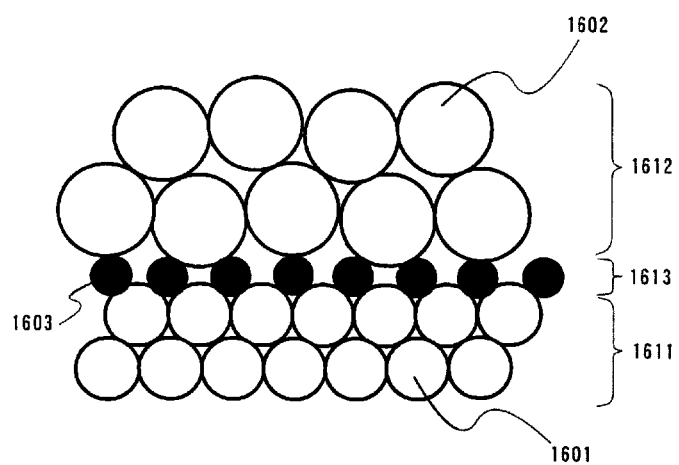
FIG. 16 is a diagram showing formation of an impurity layer.

This embodiment describes a case of applying the present invention to a passive (simple matrix) light emitting device. The description will be given with reference to FIG. 11. In FIG. 11, 1301 denotes a glass substrate and 1302 denotes an anode formed from a transparent conductive film. In this embodiment, the transparent conductive film is a compound of indium oxide and zinc oxide which is deposited by evaporation. Though not shown in FIG. 11, plural strips of anodes are arranged in the direction perpendicular to the plane of the drawing to form a stripe pattern.

Banks (1303a and 1303b) are formed so as to fill gaps between anodes 1302 arranged to form a stripe pattern. The banks (1303a and 1303b) are formed in the direction perpendicular to the plane of the drawing along the anodes 1302.

An organic compound layer having a laminate structure is formed next. In this embodiment, copper phthalocyanine is first deposited by evaporation to have a thickness of 30 to 50 nm as a first organic compound layer 1304.

Then á-NPD is deposited by evaporation to have a thickness of 30 to 60 nm as a second organic compound layer 1305.

Further, a third organic compound layer 1306 is formed. To form the third organic compound layer of this embodiment, a pixel 1306a that emits red light, a pixel 130613 that emits green light, and a pixel 1306c that emits blue light are formed separately.

The pixel 1306a that emits red light is formed first. The pixel 1306a that emits red light is obtained by forming a film with a thickness of 30 to 60 nm through coevaporation of $Alq_3$ and DCM using a metal mask.

The pixel 1306b that emits green light is formed next. The pixel 1306b that emits green light is obtained by forming a film with a thickness of 30 to 60 nm through evaporation of $Alq_3$ using a metal mask.

The pixel 1306c that emits blue light is formed next. The pixel 1306c that emits blue light is obtained by forming a film with a thickness of 30 to 60 nm through evaporation of BCP using a metal mask. At this point, an $Alq_3$ film may be layered on the BCP film.

In this embodiment also, mixed layers are formed between organic layers. Specifically, a first mixed layer is formed at the interface between the first organic compound layer and the second organic compound layer, and a second mixed layer is formed at the interface between the second organic compound layer and the third organic compound layer. The mixed layers can be formed by the methods shown in Embodiment Modes.

An organic light emitting element that emits light of different colors is obtained through the above steps. Since these organic compound layers are formed along grooves defined by the banks (1303a and 1303b), the layers are arranged to form a stripe pattern in the direction perpendicular to the plane of the drawing.

Thereafter, though not shown in FIG. 11, plural strips of cathodes 1307 are arranged with the direction parallel to the plane of the drawing set as the longitudinal direction so as to form a stripe pattern that crosses the anodes 1302 at right angles. The cathodes 1307 in this embodiment are formed from MgAg by evaporation. Although not shown, wiring lines are led out of the cathodes 1307 to reach a portion to which an FPC is attached later, so that a given voltage is applied to the cathodes.

After the cathodes 1307 are formed, a silicon nitride film may be formed as a passivation film (not shown).

The organic light emitting element is formed on the substrate 1301 in the manner described above. In this embodiment, the lower electrodes serve as light-transmissive anodes and therefore light generated by the organic compound layers is emitted downward (toward the substrate 1301). However, the organic light emitting element may have the reverse structure and the lower electrodes may serve as light-shielding cathodes. In this case, light generated by the organic compound layers is emitted upward (toward the opposite side of the substrate 1301).

Next, a ceramic substrate is prepared as a cover member 1308. In the structure of this embodiment, the cover member does not need to be light-transmissive and therefore a ceramic substrate is used. When the organic light emitting element has the reverse structure as described above, it is preferred for the cover member to be light-transmissive and therefore a plastic or glass substrate is used.

The thus prepared cover member 1308 is bonded by a seal member 1310 formed of a UV-curable resin. An airtight space 1309 is provided inside the seal member 1310, and filled with inert gas such as nitrogen and argon. It is also effective to place an absorbent, typically, barium oxide, in this airtight space 1309. Lastly, an anisotropic film (FPC) 1311 is attached to complete the passive light emitting device.

This embodiment can be embodied by freely combining with any element structure for an organic light emitting element disclosed in the present invention.

Embodiment 13

Figure 29A:
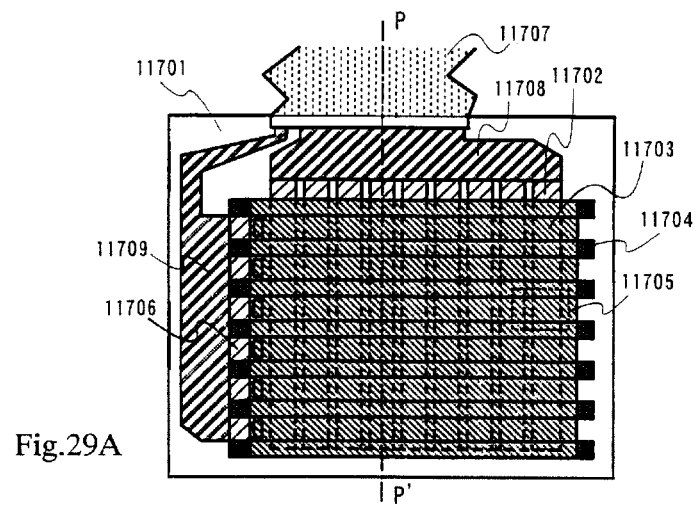
FIGS. 29A to 29C are diagrams of a light emitting device with FIG. 29A showing the top structure thereof and FIGS. 29B and 29C showing the sectional structure thereof.
Figure 29B:
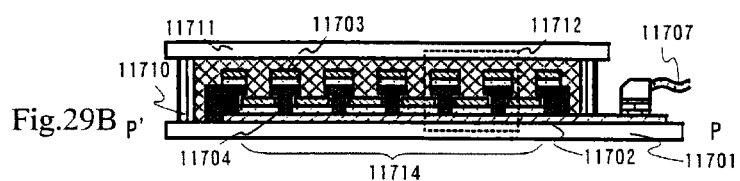

This embodiment shows a passive matrix light emitting device as an example of a light emitting device that includes an organic light emitting element disclosed in the present invention. FIG. 29A is a top view thereof and FIG. 29B is a sectional view taken along the line P-P' of FIG. 29A.

In FIG. 29A, denoted by 11701 is a substrate, which is formed of a plastic material here. The plastic material, which can be used is a plate or film of polyimide, polyamide, an acrylic resin, an epoxy resin, PES (polyethylene sulfile), PC (polycarbonate), PET (polyethylene terephthalate), or PEN (polyethylene naphthalate).

11702 denotes scanning lines (anodes) formed from a conductive oxide film. In this embodiment, the conductive oxide film is obtained by doping zinc oxide with gallium oxide. 11703 denotes data lines (cathodes) formed from a metal film, a bismuth film, in this embodiment. 11704 denotes banks formed of an acrylic resin. The banks function as partition walls that separate the data lines 11703 from one another. The scanning lines 11702 and the data lines 11703 respectively form stripe patterns and the patterns cross each other at right angles. Though not shown in FIG. 29A, an organic compound film is sandwiched between the scanning lines 11702 and the data lines 11703 and intersection portions 11705 serve as pixels.

The scanning lines 11702 and the data lines 11703 are connected to an external driving circuit through a TAB tape 11707. 11708 denotes a group of wiring lines comprised of a mass of the scanning lines 11702. 11709 denotes a group of wiring lines comprised of a mass of connection wiring lines 11706 that are connected to the data lines 11703. Though not shown, the TAB tape 11707 may be replaced by TCP that is obtained by providing a TAB tape with an IC.

In FIG. 29B, 11710 denotes a seal member and 11711 denotes a cover member that is bonded to a plastic member 11701 with the seal member 11710. A photo-curable resin can be used for the seal member 11710. A preferable material of the seal member is one which allows little gas leakage and which absorbs little moisture. The cover member is preferably made from the same material as the substrate 11701, and glass (including quartz glass) or plastic can be used. Here, a plastic material is used for the cover member.

Figure 29C:
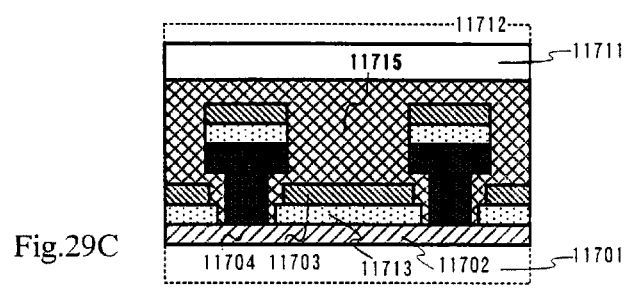

FIG. 29C is an enlarged view of the structure of a pixel region 11712. 11713 denotes an organic compound film. Lower layers of the banks 11704 are narrower than upper layers and therefore the banks can physically separate the data lines 11703 from one another. A pixel portion 11714 surrounded by the seal member 11710 is shut off of the outside air by a sealing member 11715 formed of a resin. Degradation of the organic compound film is thus prevented.

In the light emitting device structured as above in accordance with the present invention, the pixel portion 11714 is composed of the scanning lines 11702, the data lines 11703, the banks 11704, and the organic compound film 11713. Therefore the light emitting device can be manufactured by a very simple process.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 14

This embodiment shows an example of full-color light emitting device. The full-color light emitting device in this embodiment refers to a device that can show various colors using primary colors of light, namely, red, green, and blue.

The most typical method to obtain full-color display is to separately form an organic light emitting element that emits red light, an organic light emitting element that emits green light, and an organic light emitting element that emits blue light using a conventional shadow mask technique. To clarify, red, green, and blue organic light emitting elements as those described in Embodiments 6 through 8 are formed on a substrate of a light emitting device like the ones described in Embodiments 10, 11, and 13.

Figure 30A:
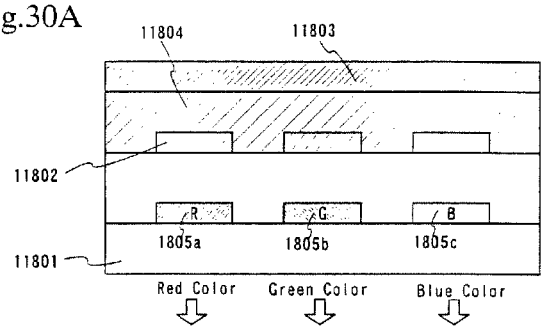
FIGS. 30A and 30B are diagrams schematically showing a light emitting device that uses color filters.
Figure 30B:
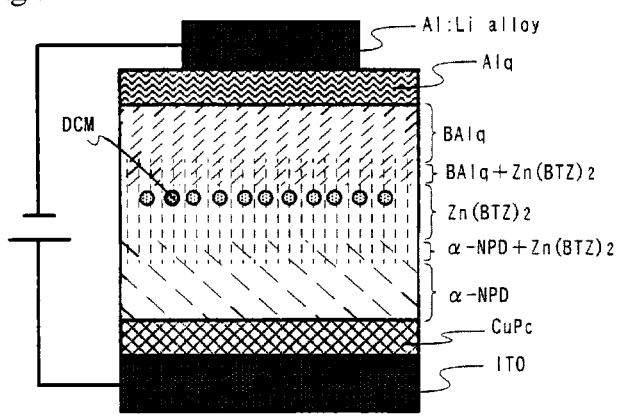

Another method of obtaining full-color display is to use color filters. In this method, organic light emitting elements that emit white light are formed on a substrate having color filters as shown in FIG. 30A. On the substrate, the color filters are patterned and circuits as those shown in Embodiments 10, 11, and 13 are formed. An example of a white light emitting element according to the present invention is shown in FIG. 30B.

Figure 31A:
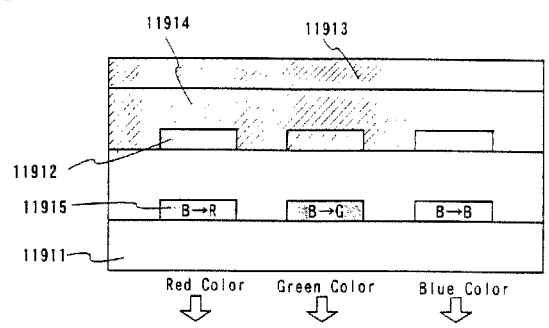
FIGS. 31A and 31B are diagrams schematically showing a light emitting device that uses color conversion layers.
Figure 31B:
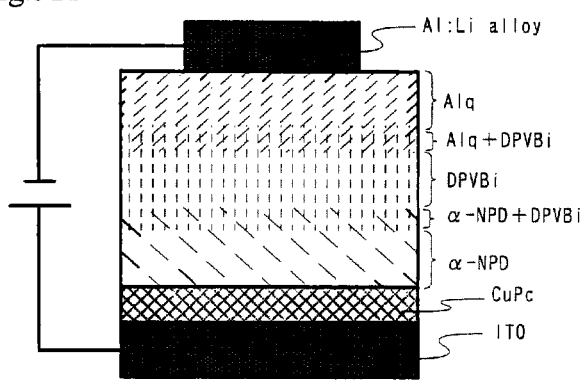

It is also possible to obtain full-color display by using a color conversion method. In this method, organic light emitting element that emits blue light are formed on a substrate having color conversion layers. The color conversion layers are films of fluorescent paints or other materials that absorb visible light to emit light having a wavelength longer than the wavelength of the absorbed visible light. On the substrate, the color conversion layers are patterned and circuits as those shown in Embodiments 10, 11, and 13 are formed. An example of a blue light emitting element according to the present invention is shown in FIG. 31B.

Other than these typical methods, a color conversion method by photo bleaching can also be applied to the present invention if proper materials are chosen.

Embodiment 15

This embodiments shows an example of attaching a printed wiring board to the light emitting device shown in Embodiment 13 to make the device into a module.

Figure 32A:
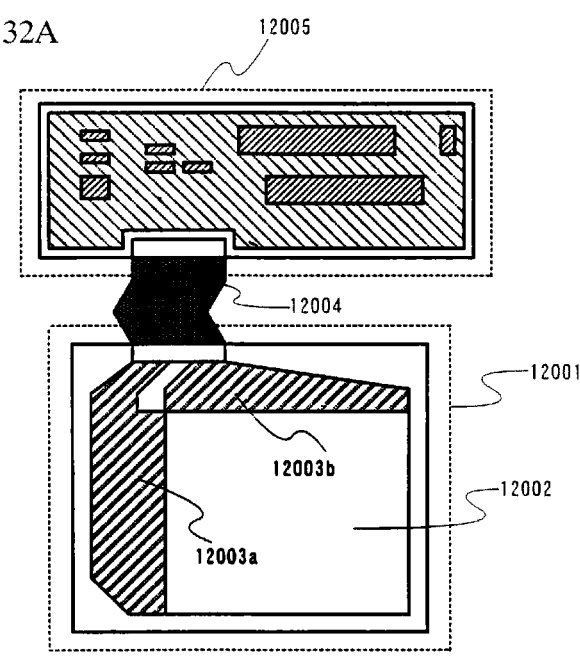
FIGS. 32A and 32B are diagrams showing the structure of a light emitting device.

In a module shown in FIG. 32A, a TAB tape 12004 is attached to a substrate 12001 (here including a pixel portion 12002 and wiring lines 12003*a* and 12003*b*), and a printed wiring board 12005 is attached to the substrate through the TAB tape 12004.

Figure 32B:
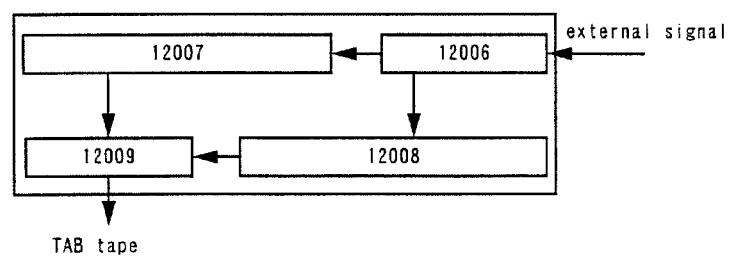

A functional block diagram of the printed wiring board 12005 is shown in FIG. 32B. An IC functioning as at least I/O ports (input or output portions) 12006 and 12009, a data signal side-driving circuit 12007, and a gate signal side driving circuit 12008 are provided within the printed wiring board 12005.

In this specification, a module structured by attaching a TAB tape to a substrate with a pixel portion formed on its surface and by attaching a printed wiring board that functions as a driving circuit to the substrate through the TAB tape as above is specially named a module with external driving circuit.

Any of organic light emitting elements disclosed in the present invention can be used as the organic light emitting element included in the light emitting device of this embodiment.

Embodiment 16

This embodiment shows an example of attaching a printed wiring board to the light emitting device shown in Embodiment 10, 11, or 13 to make the device into a module.

Figure 33A:
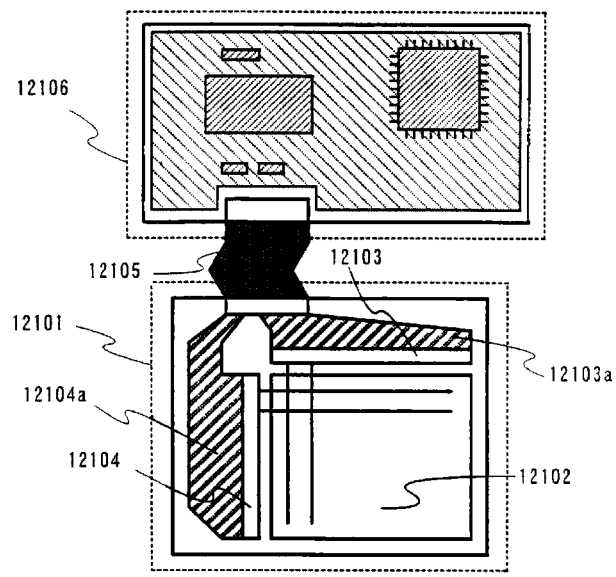
FIGS. 33A and 33B are diagrams showing the structure of a light emitting device.

In a module shown in FIG. 33A, a TAB tape 12105 is attached to a substrate 12101 (here including a pixel portion 12102, a data signal side driving circuit 12103, a gate signal side driving circuit 12104, and wiring lines 12103*a* and 12104*a*), and a printed wiring board 12106 is attached to the substrate through the TAB tape 12105. A functional block diagram of the printed wiring board 12106 is shown in FIG. 33B.

Figure 33B:
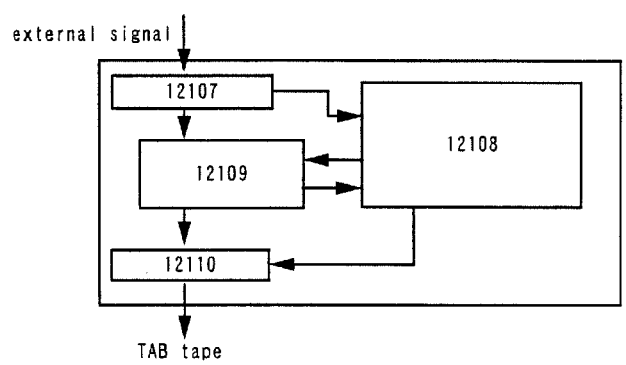

As shown in FIG. 33B, an IC functioning as at least I/O ports 12107 and 12110 and a control unit 12108 is provided within the printed wiring board 12106. A memory unit 12109 is provided here but it is not always necessary. The control unit 12108 is a portion having functions for controlling the driving circuits and correction of image data.

In this specification, a module structured by attaching a printed wiring board that has functions as a controller to a substrate on which an organic light emitting element is formed as above is specially named a module with external controller.

Any of organic light emitting elements disclosed in the present invention can be used as the organic light emitting element included in the light emitting device of this embodiment.

Embodiment 17

This embodiment shows an example of light emitting device in which an organic light emitting element is driven in accordance with digital time gray scale display. The light emitting device of the present invention can provide uniform images in digital time gray scale display and therefore is very useful.

FIG. 34A shows the circuit structure of a pixel that uses an organic light emitting element. Tr represents a transistor and Cs represents a storage capacitor. In this circuit, when a gate line is selected, a current flows into Tr1 from a source line and a voltage corresponding to the signal is accumulated in Cs. Then a current controlled by the gate-source voltage ($V_{gs}$) of Tr2 flows into Tr2 and the organic light emitting element.

After Tr1 is selected, Tr1 is turned OFF to hold the voltage ($V_{gs}$) of Cs. Accordingly, a current continues to flow in an amount dependent of V.

FIG. 34B shows a chart for driving this circuit in accordance with digital time gray scale display. In digital time gray scale display, one frame is divided into plural sub-frames. FIG. 34B shows 6 bit gray scale in which one frame is divided into six sub-frames. In this case, the ratio of light emission periods of the sub-frames is 32:16:8:4:2:1.

FIG. 34C schematically shows driving circuits of TFT substrate in this embodiment. A gate driver and a source driver are provided on the same substrate. In this embodiment, the pixel circuit and the drivers are designed to be digitally driven. Accordingly, fluctuation in TFT characteristic does not affect the device and the device can display uniform images.

Embodiment 18

Being self-luminous, a light emitting device using an organic light emitting element has better visibility in bright places and wider viewing angle than liquid crystal display devices. Therefore the light emitting device can be used for display units of various electric appliances.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the organic light emitting element. Specific examples of these electric appliance are shown in FIGS. 12A to 12H.

FIG. 12A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the organic light emitting element is self-luminous, the device does not need back light and can make a thinner display unit than liquid crystal display devices. The display device refers to all display devices for displaying information, including ones for personal computers, for TV broadcasting reception, and for advertisement.

FIG. 12B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

FIG. 12C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

FIG. 12D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

FIG. 12E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

FIG. 12F shows a goggle type display (head mounted display), which is composed of a main body 2501, display units 2502, and arm units 2503. The light emitting device manufactured in accordance with the present invention can be applied to the display units 2502.

FIG. 12G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, etc. The light emitting device manufactured in accordance with the present invention can be applied to the display unit 2602.

FIG. 12H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured in accordance with the present invention is so wide that it is applicable to electric appliances of any field. The electric appliances of this embodiment can employ as their display units any light emitting device that has an organic light emitting device disclosed in the present invention.

Embodiment 19

The light emitting devices of the present invention which have been described in the embodiments above have advantages of low power consumption and long lifetime. Accordingly, electric appliances that include those light emitting devices as their display units can operate consuming less power than conventional ones and are durable. The advantages are very useful especially for electric appliances that use batteries as power sources, such as portable equipment, because low power consumption leads directly to conveniences (batteries last longer).

The light emitting device is self-luminous to eliminate the need for back light as the one in liquid crystal displays, and has an organic compound film whose thickness is less than 1 µm. Therefore the light emitting device can be made thin and light-weight. Electric appliances that include the light emitting device as their display units are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported in a mass) and installation (space-saving).

Being self-luminous, the light emitting device is characterized by having better visibility in bright places than liquid crystal display devices and wide viewing angle. Therefore electric appliances that include the light emitting device as their display units are advantageous also in terms of easiness in viewing display.

To summarize, electric appliances that use a light emitting device of the present invention have, in addition to merits of conventional organic light emitting elements, namely, thinness/lightness and high visibility, new features of low power consumption and long lifetime, and therefore are very useful.

This embodiment shows examples of the electric appliances that include as display units the light emitting device of the present invention. Specific examples thereof are shown in FIGS. 35A to 36B. The organic light emitting element included in the electric appliance of this embodiment can be any element according to the present invention. The light emitting device included in the electric appliance of this embodiment can have any of the configurations illustrated in FIGS. 24A to 34C.

Figure 35A:
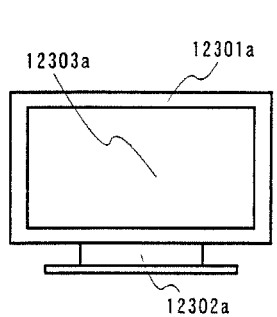
FIGS. 35A to 35F are diagrams showing specific examples of an electric appliance.

FIG. 35A shows a display device using an organic light emitting element. The display is composed of a case $12301a$, a support base $12302a$, and a display unit $12303a$. By using a light emitting device of the present invention as the display unit $12303a$, the display can be thin and light-weight, as well as durable. Accordingly, transportation is simplified, space is saved in installation, and lifetime is long.

Figure 35B:
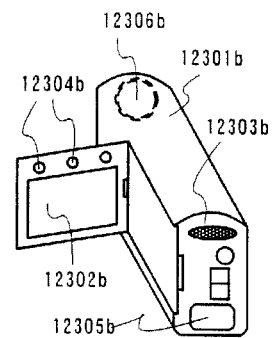

FIG. 35B shows a video camera, which is composed of a main body $12301b$, a display unit $12302b$, an audio input unit $12303b$, operation switches $12304b$, a battery $12305b$, and an image receiving unit $12306b$. By using a light emitting device of the present invention as the display unit $12302b$, the video camera can be thin and light-weight, and consumes less power. Accordingly, battery consumption is reduced and carrying the video camera is less inconvenient.

Figure 35C:
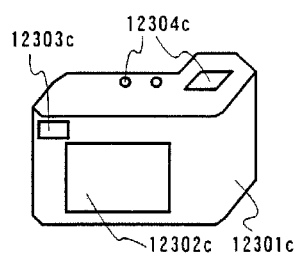

FIG. 35C shows a digital camera, which is composed of a main body $12301c$, a display unit $12302c$, an eye piece unit $12304c$, and operation switches $12304c$. By using a light emitting device of the present invention as the display unit $12302c$, the digital camera can be thin and light-weight, and consumes less power. Accordingly, battery consumption is reduced and carrying the digital camera is less inconvenient.

Figure 35D:
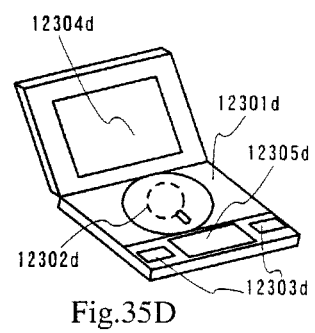

FIG. 35D shows an image reproducing device equipped with a recording medium. The device is composed of a main body $12301d$, a recording medium (such as CD, LD, or DVD) $12302d$, operation switches $12303d$, a display unit (A) $12304d$, and a display unit (B) $12305d$. The display unit (A) $12304d$ mainly displays image information whereas the display unit (B) $12305d$ mainly displays text information. By using a light emitting device of the present invention as the display unit (A) $12304d$ and the display unit (B) $12305d$, the image reproducing device consumes less power and can be thin and light-weight as well as durable. The image reproducing device equipped with a recording medium also includes CD players and game machines.

Figure 35E:
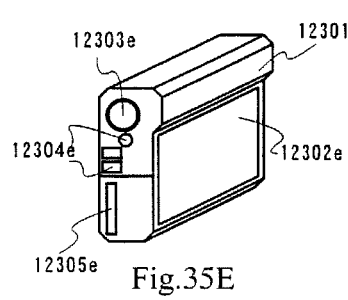

FIG. 35E shows a (portable) mobile computer, which is composed of a main body $12301e$, a display unit $12302e$, an image receiving unit $12303e$, a switch $12304e$, and a memory slot $12305e$. By using a light emitting device of the present invention as the display unit $12302e$, the portable computer can be thin and light-weight, and consumes less power. Accordingly, battery consumption is reduced and carrying the computer is less inconvenient. The portable computer can store information in a flash memory or a recording medium obtained by integrating non-volatile memories and can reproduce the stored information.

Figure 35F:
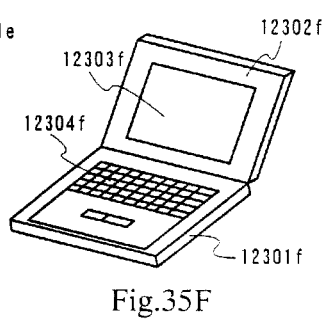

FIG. 35F shows a personal computer, which is composed of a main body $12301f$, a case $12302f$, a display unit $12303f$, and a keyboard $12304f$. By using a light emitting device of the present invention as the display unit $12303f$, the personal computer can be thin and light-weight, and consumes less power. The light emitting device is a great merit in terms of battery consumption and lightness especially for a notebook personal computer or other personal computers that are carried around.

These electric appliances now display with increasing frequency information sent through electronic communication lines such as the Internet and radio communications such as radio wave, especially, animation information. Since organic light emitting elements have very fast response speed, the light emitting device is suitable for animation display.

Figure 36A:
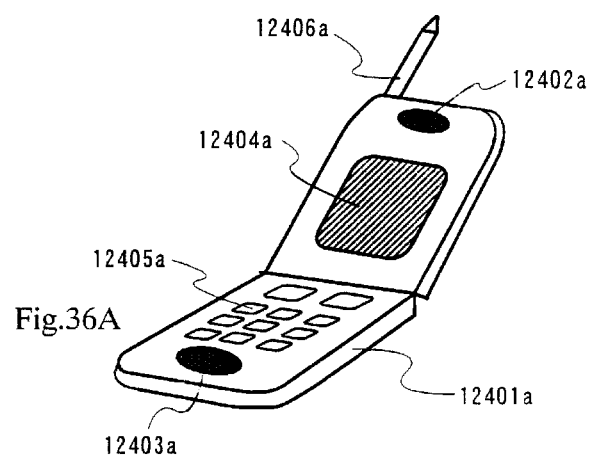
FIGS. 36A and 36B are diagrams showing specific examples of an electric appliance.

FIG. 36A shows a cellular phone, which is composed of a main body $12401a$, an audio output unit $12402a$, an audio input unit $12403a$, a display unit $12404a$, operation switches $12405a$, and an antenna $12406a$. By using a light emitting device of the present invention as the display unit $12404a$, the cellular phone can be thin and light-weight, and consumes less power. Accordingly, battery consumption is reduced, carrying the cellular phone is easy, and the main body is compact.

Figure 36B:
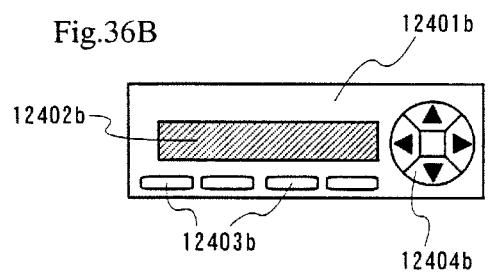

FIG. 36B shows audio (specifically, car audio), which is composed of a main body $12401b$, a display unit $12402b$, and operation switches $12403b$ and $12404b$. By using a light emitting device of the present invention as the display unit $12402b$, the audio can be thin and light-weight, and consumes less power. Although car audio is taken as an example in this embodiment, the audio may be home audio.

It is effective to give the electric appliances shown in FIGS. 35A to 36B a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

Various electric appliances that employ as light sources the light emitting device of the present invention are also thin and light-weight and can operate consuming less power, which makes them very useful appliances. Light sources of liquid crystal display devices, such as back light or front light, or light sources of lighting fixtures are typical uses of the light emitting device of the present invention as a light source.

When liquid crystal displays are used as the display units of the electric appliances shown in FIGS. 35A to 36B according to this embodiment, the electric appliances can be thin and light-weight and consume less power if those liquid crystal displays use as back light or front light the light emitting device of the present invention.

Embodiment 20

In this embodiment, an example of an active matrix type constant-current driving circuit is described, which is driven by flowing the constant current in the organic light emitting element of the present invention. The circuit structure thereof is shown in FIG. 37.

Figure 37:
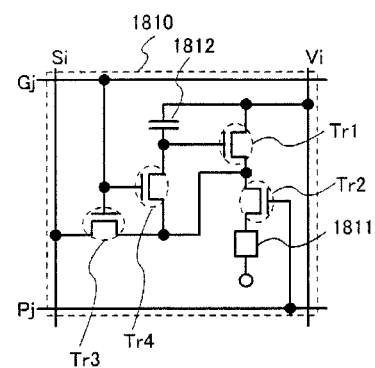
FIG. 37 is a diagram showing an example of an active matrix type constant-current driving circuit.

The pixel 1810 shown in FIG. 37 has the signal line Si, the first scanning line Gj, the second scanning line Pj and the power source line Vi. In addition, the pixel 1810 has Tr1, Tr2, Tr3, Tr4, the organic light emitting element 1811 of a mixed junction type and the retention capacitor 1812.

Both gates of Tr3 and Tr4 are connected with the first scanning line Gj. As for the source and the drain of Tr3, the one is connected with the signal line Si, the other is connected with the source of Tr2. Further, the source and the drain of Tr4, the one is connected with the source of Tr2, the other is connected to the gate of Tr1. Thus, the either of the source and the drain of Tr3 and the either of the source or the drain of Tr4 are connected with each other.

The source of Tr1 is connected with the power source line Vi, the drain is connected with the source of Tr2. The gate of Tr2 is connected to the second scanning line Pj. And, the drain of the Tr2 is connected with a pixel electrode in the organic light emitting element 1811. The organic light emitting element 1811 has the pixel electrode, the counter electrode and the organic light emitting layer provided between the pixel electrode and the counter electrode. The counter electrode of the organic light emitting element 1811 is applied constant voltage by a power source provided at the external of a light emitting panel.

Tr3 and Tr4 can adopt both n-channel type TFT and p-channel type TFT. However, the polarities of Tr3 and Tr4 are the same. Further, Tr1 can adopt both n-channel type TFT and p-channel type TFT. Tr2 can adopt both n-channel type TFT and p-channel type TFT. With respect to the polarity, in the case of the pixel electrode of the light emitting electrode and the counter electrode, the one is an anode, the other is a cathode. In the case that the Tr2 is an n-channel type TFT, it is preferable to use the cathode as a pixel electrode, and the anode as a counter electrode.

The retention capacitor 1812 is formed between the gate and the source of Tr1. The retention capacitor 1812 is provided to maintain more certainly the voltage ($V_{GS}$) between the gate and the source of Tr1. However, it is not necessary always provided.

In the pixel shown in FIG. 37, the current supplied to the signal line Si is controlled at the current source of the signal line driving circuit.

By applying the above-mentioned circuit structure, the constant-current driving can be realized, by which the brightness can be kept by flowing a constant current in the organic light emitting element. The organic light emitting element having a mixture region of the present invention has a longer lifetime than that of prior organic light emitting element. The organic light emitting element is effective because longer lifetime can be realized by implementing above-mentioned constant-current driving.

As described above, the present invention can lower energy barriers at interfaces between organic layers in an organic compound layer that has a laminate structure by placing, in the interfaces, mixed layers formed of an organic compound that constitutes one organic layer and an organic compound that constitutes the other organic layer. This improves injection of carriers between organic layers and therefore an organic light emitting element that has low drive voltage and long element lifetime can be obtained.

Furthermore, a light emitting device that consumes less power and has longer lifetime can be obtained by carrying out the present invention. Moreover, using this light emitting device for a light source or a display unit makes an electric appliance that consumes less power and lasts longer (and is bright if the light emitting device is used as a light source).

TABLE 1

| Combination | 1st layer | 2nd layer |
|---|---|---|
| A | hole injecting layer | hole transporting layer |
| B | electron injecting layer | electron transporting layer |
| C | hole transporting layer | light emitting layer |
| D | electron transporting layer | light emitting layer |
| E | electron transporting layer | hole blocking layer |

What is claimed is:

1. A light emitting device comprising:
    an anode;
    a hole transporting layer over the anode, the hole transporting layer comprising a first organic compound having a hole transporting material;
    a light emitting layer over the hole transporting layer, the light emitting layer comprising a second organic compound as a host material and a triplet light emission material as a dopant;
    a mixed region between the hole transporting layer and the light emitting layer, the mixed region comprising the first organic compound and the second organic compound; and
    a cathode over the light emitting layer.

2. The light emitting device according to claim 1, further comprising:
    an electron transporting layer over the light emitting layer, the electron transporting layer comprising a third organic compound having an electron transporting property; and
    a second mixed region between the light emitting layer and the electron transporting layer, the mixed region comprising the second organic compound and the third organic compound.

3. The light emitting device according to claim 1, wherein the triplet light emission material comprises an iridium complex.

4. The light emitting device according to claim 1, wherein the first organic compound is α-NPD.

5. The light emitting device according to claim 1, wherein the second organic compound is BAlq.

6. The light emitting device according to claim 1, further comprising a conductive polymer layer between the anode and the hole transporting layer.

7. The light emitting device according to claim 1, further comprising an electron transporting layer between the cathode and the light emitting layer.

8. A light emitting device comprising:
    a first substrate;
    a thin film transistor over the first substrate;
    an anode electrically connected to the thin film transistor;

a hole transporting layer over the anode, the hole transporting layer comprising a first organic compound having a hole transporting material;

a light emitting layer over the hole transporting layer, the light emitting layer comprising a second organic compound as a host material and a triplet light emission material as a dopant;

a mixed region between the hole transporting layer and the light emitting layer, the mixed region comprising the first organic compound and the second organic compound; and a cathode over the light emitting layer.

9. The light emitting device according to claim 8, wherein the triplet light emission material comprises an iridium complex.

10. The light emitting device according to claim 8, wherein the first organic compound is á-NPD.

11. The light emitting device according to claim 8, wherein the second organic compound is BAlq.

12. The light emitting device according to claim 8, further comprising a conductive polymer layer between the anode and the hole transporting layer.

13. The light emitting device according to claim 8, further comprising an electron transporting layer between the cathode and the light emitting layer.

* * * * *

UNITED STATES PATENT AND TRADEMARK OFFICE
CERTIFICATE OF CORRECTION

| | |
|---|---|
| PATENT NO. | : 8,878,431 B2 |
| APPLICATION NO. | : 13/872268 |
| DATED | : November 4, 2014 |
| INVENTOR(S) | : Satoshi Seo and Shunpei Yamazaki |

It is certified that error appears in the above-identified patent and that said Letters Patent is hereby corrected as shown below:

In the Specification

Column 11, line 1, replace "6-electron" with --δ-electron--;

Column 11, line 11, replace "6-electron" with --δ-electron--;

Column 12, line 14, replace "Light" with --light--;

Column 12, line 33, after "element" replace ":" with --;--;

Column 13, line 18, after "according" delete ",";

Column 16, line 27, replace "co evaporation" with --coevaporation--;

Column 23, line 24, replace "run" with --nm--;

Column 25, line 31, replace "a" (Second Occurrence) with --α--;

Column 25, line 35, replace "a" (First Occurrence) with --α--;

Column 25, line 37, replace "a" with --α--;

Column 27, line 45, replace "H," with --$H_2$--;

Column 27, line 47, replace "NH," with --$NH_3$--;

Column 28, line 17, replace "80'C" with --80°C--;

Column 29, line 34, after "layer" delete ",";

Column 29, line 35, replace "Ir(ppy)," with --$Ir(ppy)_3$--;

Column 32, line 6, replace "Spiro" with --spiro--;

Column 32, line 52, replace "μ-NPD" with --α-NPD--;

Column 37, line 50, replace "11.1" with --TFT--;

Column 39, line 15, replace "130613" with --1306b--;

Column 42, line 67, after "V" insert --gs--; and

Column 46, line 8, after "12301e" replace "." with --,--.

Signed and Sealed this
Twenty-seventh Day of October, 2015

Michelle K. Lee
*Director of the United States Patent and Trademark Office*